US011390802B2

(12) United States Patent
Pan et al.

(10) Patent No.: US 11,390,802 B2
(45) Date of Patent: Jul. 19, 2022

(54) AIR-STABLE SURFACE-PASSIVATED PEROVSKITE QUANTUM DOTS (QDS), METHODS OF MAKING THESE QDS, AND METHODS OF USING THESE QDS

(71) Applicant: King Abdullah University of Science and Technology, Thuwal (SA)

(72) Inventors: Jun Pan, Thuwal (SA); Smritakshi Phukan Sarmah, Thuwal (SA); Omar F. Mohammed, Thuwal (SA); Osman M. Bakr, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 0 days.

(21) Appl. No.: 17/153,618

(22) Filed: Jan. 20, 2021

(65) Prior Publication Data
US 2021/0214609 A1    Jul. 15, 2021

Related U.S. Application Data

(62) Division of application No. 15/773,680, filed as application No. PCT/IB2016/056715 on Nov. 8, 2016, now Pat. No. 10,927,295.

(60) Provisional application No. 62/335,727, filed on May 13, 2016, provisional application No. 62/252,525, filed on Nov. 8, 2015.

(51) Int. Cl.
*C09K 11/66* (2006.01)
*C09K 11/02* (2006.01)
*H05B 33/14* (2006.01)
*H01L 51/00* (2006.01)
*B82Y 20/00* (2011.01)
*C01G 21/00* (2006.01)

(52) U.S. Cl.
CPC .......... *C09K 11/665* (2013.01); *C09K 11/025* (2013.01); *C09K 11/664* (2013.01); *H01L 51/0003* (2013.01); *H05B 33/14* (2013.01); *B82Y 20/00* (2013.01); *C01G 21/006* (2013.01)

(58) Field of Classification Search
CPC .... C09K 11/665; C09K 11/664; C09K 11/025
See application file for complete search history.

(56) References Cited

U.S. PATENT DOCUMENTS

| 10,424,696 | B2 * | 9/2019 | Lee | C09K 11/025 |
| 10,927,295 | B2 * | 2/2021 | Pan | C09K 11/664 |
| 2017/0084848 | A1 * | 3/2017 | Gao | H01L 51/4246 |

FOREIGN PATENT DOCUMENTS

| JP | 2002299603 A | 10/2002 |
| JP | 2006176779 A | 7/2006 |
| JP | 2008506636 A | 3/2008 |

(Continued)

OTHER PUBLICATIONS

Ayguleretal, "Light-Emitting Electrochemical Cells Based on Hybrid Lead Halide Perovskite Nanoparticles", Journal of Phsical Chemistry C, 2015, 119, pp. 12047-12054, Apr. 15, 2015.*

(Continued)

*Primary Examiner* — C Melissa Koslow
(74) *Attorney, Agent, or Firm* — Billion & Armitage

(57) ABSTRACT

Embodiments of the present disclosure provide for passivated quantum dots, methods of making passivated quantum dots, methods of using passivated quantum dots, and the like.

20 Claims, 45 Drawing Sheets

(56) References Cited

FOREIGN PATENT DOCUMENTS

| WO | 2014208456 | A1 | | 12/2014 |
|---|---|---|---|---|
| WO | 2015166006 | A1 | | 11/2015 |
| WO | 2016072804 | A1 | | 5/2016 |
| WO | WO 2016072804 | | * | 5/2016 |

OTHER PUBLICATIONS

Search Report and Written Opinion for PCT/IB2016/056715 dated Feb. 13, 2017.
Achtstein, et al., "One- and Two-Photon Absorption in CdS Nanodots and Wires: The Role of Dimensionality in the One- and Two-Photon Luminescence Excitation Spectrum", The Journal of Physical Chemistry, 2015, 1260-1267.
Akkerman, et al., "Tuning the Optical Properties of Cesium Lead Halide Perovskite Nanocrystals by Anion Exchange Reactions", Journal of The American Chemical Society, 2015, 10276-10281.
Allione, "Two-Photon-Induced Blue Shift of Core and Shell Optical Transitions in Colloidal CdSe/CdS Quasi-Type II Quantum Rods", ACS Nano, 2013, 2443-2452.
Angang, et al., "A Generalized Ligand-Exchange Strategy Enabling Sequential Surface Functionalization of Colloidal Nanocrystals", Journal of The American Chemical Society, ACS Publications, 2011, 998-1006.
Ayguler, et al., "Light-Emitting Electrochemical Cells Based on Hybrid Lead Halide", The Journal of Physical Chemistry C May 15, 2015, No. 119, pp. 12047-12054, Apr. 15, 2015, 12047-12056.
Bae, et al., "Controlling the influence of Auger recombination on the performance of quantum-dot light-emitting diodes", nature communications, 2013, 1-8.
Baikie, et al., "Synthesis and crystal chemistry of the hybrid perovskite (CH3NH3)PbI3 for solid-state sensitised solar cell applications", Journal of Materials Chemistry A, 2013, 5628-5641.
Bekenstein, et al., "Highly Luminescent Colloidal Nanoplates of Perovskite Cesium Lead Halide and Their Oriented Assemblies", Journal of The American Chemical Society, 2015, 16008-16011.
Bixner, et al., "Complete Exchange of the Hydrophobic Dispersant Shell on Monodisperse Superparamagnetic Iron Oxide Nanoparticles", Langmuir, 2015, 9198-9204.
Bose, et al., "Direct Femtosecond Observation of Charge Carrier Recombination in Ternary Semiconductor Nanocrystals: The Effect of Composition and Selling", The Journal of Physical Chemistry, 2015, 3439-3446.
Bronstein, et al., "Influence of Iron Oleate Complex Structure on Iron Oxide Nanoparticle Formation", American Chemical Society, 2007, 3624-3632.
Cai, et al., "High Performance hybrid solar cells sensitized by organolead halide perovskites", Energy Environ. Sci., 2013, 6, 1480-1485.
Cho, et al., "Overcoming the electroluminescence efficiency limitations of perovskite light-emitting diodes", Science, Dec. 4, 2015, 1-5.
Chong, et al., "Autocorrelation measurement of femtosecond laser pulses based on two-photon absorption in GaP photodiode", Applied Physics Letters, 2014, 062111-1 / 062111-4.
Chong, et al., "Functionalization of SBA-15 with APTES and Characterization of Functionalized Materials", J. Phys. Chem., American Chemical Society, 2003, 12650-12657.
Cooney, et al., "Gain Control in Semiconductor Quantum Dots via State-Resolved Optical Pumping", Physical Review Letters, 2009, 1-4.
Deschler, et al., "High Photoluminescence Efficiency and Optically Pumped Lasing in Solution-Processed Mized Halide Perovskite Semiconductors", J. Phys. Chem. Lett. 2014, 5, 1421-1426.
Dohner, et al., "Intrinsic White-Light Emission from Layered Hybrid Perovskites", Journal of the American Chemical Society, 2014, 13154-13157.

Dualeh, et al., "Thermal Behavior of Methylammonium Lead-Trihalide Perovskite Photovoltaic Light Harvesters", Chemistry of Materials, 2014, 6160-6164.
Feng, et al., "Brightly Luminescent and Color-Tunable Colloidal CH3NH3PbX3 (X = Br, I, Cl) Quantum Dots: Potential Alternatives for Display Technology", ACS Nano, 2015, 4533-4542.
Fu, et al., "Lower threshold for nanowire lasers", Organic-Inorganic Perovskites, Jun. 2015, 557-558.
Giacomo, et al., "CH3NH3PbCl3 Single Crystals: Inverse Temperature Crystallization and Visible-Blind UV-Photodetector", The Journal of Physical Chemistry Letters, 2015, 3781-3786.
Guangru, et al., "Efficient Light-Emitting Diodes Based on Nanocrystalline Perovskite in a Dielectric Polymer Matrix", Nano Letters, ACS Publications, 2015, 2640-2644.
Guichuan, et al., "Ultralow-Threshold Two-Photon Pumped Amplified Spontaneous Emission and Lasing from Seeded CdSe/CdS Nanorod Heterostructures", ACS Nano, 2012, 10835-10844.
Guzelturk, et al., "Stable and Low-Threshold Optical Gain in CdSe/CdS Quantum Dots: An All-Colloidal Frequency Up-Converted Laser", Advanced Materials, 2015, 2741-2746.
Haiming, et al., "Lead halide perovskite nanowire lasers with low lasing thresholds and high quality factors", Nature Materials, Jun. 2015, 636-643.
Harris, et al., "Analysis of the Interaction of Surfactants Oleic Acid and Oleylamine with Iron Oxide Nanoparticles through Molecular Mechanics Modeling", Langmuir, ACS Publications, 2015, 3934-3943.
Hines, et al., "Recent Advances in Quantum Dot Surface Chemistry", Applied Materials & Interfaces, 2014, 3041-3057.
Hoffman, et al., "Size-Dependent Energy Transfer Pathways in CdSe Quantum Dot-Squaraine Light-Harvesting Assemblies: Förster versus Dexter", The Journal of Physical Chemistry, 2014, 18453-18461.
Huang, et al., "Amine-Grafted MCM-48 and Silica Xerogel as Superior Sorbents for Acidic Gas Removal from Natural Gas", Ind. Eng. Chem. Res., 2003, 2427-2433.
Jeon, "Compositional engineering of perovskite materials for high-performance solar cells", Nature, vol. 517, Jan. 22, 2015, pp. 476-480.
Jiang, et al., "A room-temperature method for coating a ZnS shell on semiconductor quantum dots", Journal of Materials Chemistry C, 2015, 964-967.
Jiang, et al., "Colloidal-quantum-dot photovoltaics using atomic-ligand passivation", nature materials, Oct. 2011, 765-771.
Karl, "Signs of stability", news & views, Nature Nanotechnology, Jul. 2015, 574-575.
Kojima, et al., "Organometal Halide Perovskites as Visible-Light Sensitizers for Photovoltaic Cells", J. Am. Chem. Soc. 2009, 131, 6050-6051.
Koutselas, et al., "Some Unconventional Organic—Inorganic Hybrid Low-Dimensional Semiconductors and Related Light-Emitting Devices", The Journal of Physical Chemistry, 2011, 8475-8483.
Kovalenko, et al., "Nanocrystal Superlattices with Thermally Degradable Hybrid Inorganic-Organic Capping Ligands", Journal of The American Chemical Society, vol. 132, No. 43, Nov. 1, 2010, pp. 15124-15126.
Kovalenko, et al., "Nanocrystal Superlattices with Thermally Degradable Hybrid Inorganic-Organic Capping Ligands", JACS Communications, 2010, 15124-15126.
Kulbak, et al., "How Important Is the Organic Part of Lead Halide Perovskite Photovoltaic Cells? Efficient CsPbBr3 Cells", The Journal of Physical Chemistry Letters, 2015, 2452-2456.
Kun, et al., "Re-examination of characteristic FUR spectrum of secondary layer in bilayer oleic acid-coated Fe3O4 nanoparticles", Applied Surface Science, 2010, 3093-3097.
Lee, et al., "Efficient Hybrid Solar Cells Based on Meso Superstructured Organometal Halide Perovskites", Science, vol. 338, pp. 643-647, Nov. 2, 2012.
Letian, et al., "Solution-processed hybrid perovskite photodetectors with high detectivity", Nature Communications, 2014, 1-6.

(56) References Cited

OTHER PUBLICATIONS

Li, et al., "CsPbX3 Quantum Dots for Lighting and Displays: Room-Temperature Synthesis, Photoluminescence Superiorities, Underlying Origins and White Light-Emitting Diodes", Material Views, 2016, 2435-2445.
Liao, et al., "Reversible fluorescence modulation of spiropyran—functionalized carbon nanoparticles", Journal of Materials Chemistry C, 2013, 3716-3721.
Luo, et al., "Water photolysis at 12.3% efficiency via perovskite photovoltaics and earth abundant catalysts", Science, vol. 345, Issue 6204, Sep. 26, 2014, pp. 1593-1596.
Mandeep, et al., "Dependence of Crystal Growth of Gold Nanoparticles on the Capping Behavior of Surfactant at Ambient Conditions", Crystal Growth & Design, 2008, 1713-1719.
Manser, et al., "Evolution of Organic-Inorganic Lead Halide Perovskite from Solid-State Iodoplumbate Complexes", The Journal of Physical Chemistry, 2015, 17065-17073.
Mashford, et al., "High-efficiency quantum-dot light-emitting devices with enhanced charge injection", nature photonics, May 2013, 407-412.
Michael, et al., "High-performance multiple-donor bulk heterojunction solar cells", nature photonics, Mar. 2015, 190-198.
Mohammed, et al., "Excited-State Intramolecular Hydrogen Transfer (ESIHT) of 1,8-Dihydroxy-9,10-anthraquinone (DHAQ) Characterized by Ultrafast Electronic and Vibrational Spectroscopy and Computational Modeling", The Journal of Physical Chemistry, 2014, 3090-3099.
Mori, et al., "Surface morphological influence on charging at metal-insulator interface in XPS depth profiling", Elsevier, 2004, 292-296.
Nag, et al., "Metal-free Inorganic Ligands for Collodal Nanocrystals: S 2-, HS-, Se 2-, HSe-, Te 2-, HTe-, TeS 3 2-, OH-, and NH 2—as Surface Ligands", Journal of The American Chemical Society, vol. 133, No. 27, Jul. 13, 2011, pp. 10612-10620.
Nag, et al., "Metal-free Inorganic Ligands for Colloidal Nanocrystals: S2-, HS-, Se2-, HSe-, Te2-, HTe-, TeS32-, OH-, NH2-, as Surface Ligands", Journal of The American Chemical Society, 2011, 10612-10620.
Nedelcu, et al., "Fast Anion-Exchange in Highly Luminescent Nanocrystals of Cesium Lead Halide Perovskites (CsPbX3, X = Cl, Br, I)", Nano Letters, 2015, 5635-5640.
Noel, et al., "Enhanced Photoluminescence and Solar Cell Performance via Lewis Base Passivation of Organic-Inorganic Lead Halide Perovskites", Article, ACS Nano, 2014, 9815-9821.
Noel, et al., "Enhanced Photoluminescence and Solar Cell Performance via Lewis Base Passivation of Organic-Inorganic Lead Halide Perovskites", ACS Nano, 2014, 9815-9821.
Noel, et al., "Enhances Photoluminescence and Solar Cell Performance via Lewis Base Passivation of Organic-Inorganic Lead Halide Perovskites", ACS NANO, vol. 8, No. 10, Oct. 28, 2018, pp. 9815-9821.
Nyk, et al., "Enhancement of Two-Photon Absorption Cross Section in CdSe Quantum Rods", The Journal of Physical Chemistry, ACS Publications, 2014, 17914-17921.
Owen, et al., "Reaction Chemistry and Ligand Exchange at Cadmium-Selenide Nanocrystal Surfaces", JACS Communications, 2008, 12279-12281.
Pan, et al., "Air-Stable Surface-Passivated Perovskite Quantum Dots for Ultra-Robust, Single- and Two-Photon-Induced Amplified Spontaneous Emission", The Journal of Physical Chemistry Letters, 2015, 5027-5033.
Park, et al., "Room Temperature Single-Photon Emission from Individual Perovskite Quantum Dots", ACS Nano, 2015, 10386-10393.
Prashant, et al., "Emergence of New Materials for Light-Energy Conversion: Perovskites, Metal Clusters, and 2-D Hybrids", The Journal of Physical Chemistry Letters, 2014, 4167-4168.
Prashant, et al., "Evolution of Perovskite Photovoltaics and Decrease in Energy Payback Time", The Journal Physical Chemistry Letters, 2013, 3733-3734.
Priante, et al., "The recombination mechanisms leading to amplified spontaneous emission at the true-green wavelength in CH3NH3PbBr3 perovskites", Applied Physics Letters, 2015, 1-5.
Protesescu, et al., "Nanocrystals of Cesium Lead Halide Perovskites (CsPbX3, X = Cl, Br, and I): Novel Optoelectronic Materials Showing Bright Emission with Wide Color Gamut", Nano Letters, ACS Publications, 2015, 3692-3696.
Roo, et al., "Highly Dynamic Ligand Binding and Light Absorption Coefficient of Cesium Lead Bromide Perovskite Nanocrystals", ACS Nano, 2016, 2071-2081.
Saidaminov, et al., "High-quality bulk hybrid perovskite single crystals within minutes by inverse temperature crystallization", Nature Communications, 2015, 1-6.
Sang, et al., "Surface Modification of Fe3O4 and FePt Magnetic Nanoparticles with Organometallic Complexes", 2009, 5341-5348.
Scholes, et al., "Excitons in nanoscale systems", Review Article, 2006, 683-696.
Shawkat, et al., "Molecular-structure Control of Ultrafast Electron Injection at Cationic Porphyrin—CdTe Quantum Dot Interfaces", The Journal of Physical Chemistry Letters, 2015, 791-795.
Shi, et al., "Low trap-state density and long carrier diffusion in organolead trihalide perovskite single crystals", Solar Cells, Jan. 30, 2015, 519-522.
Sifei, et al., "Self-Template-Directed Synthesis of Porous Perovskite Nanowires at Room Temperature for High-Performance Visible-Light Photodetectors", Wiley Online Library, 2015, 5693-5696.
Song, et al., "Quantum Dot Light-Emitting Diodes Based on Inorganic Perovskite Cesium Lead Halides (CsPbX 3)", Advanced Materials, 2015, 7162-7167.
Stoumpos, et al., "Crystal Growth of the Perovskite Semiconductor CsPbBr3: A New Material for High-Energy Radiation Detection", Crystal Growth & Design, 2013, 2722-2727.
Stranks, et al., "Metal-halide perovskites for photovoltaic and light-emitting devices", nature nanotechnology, May 2015, 391-402.
Stranks, et al., "Recombination Kinetics in Organic-Inorganic Perovskites: Excitons, Free Charge, and Subgap States", Physical Review Applied, 2014, 034007-1 / 034007-8.
Stranks, et al., "Recombination Kinetics in Organic-Inorganic Perovskites: Excitons, Free Charge, and Subgap States", American Physical Society, 2014, 1-8.
Sutherland, et al., "Conformal Organohalide Perovskites Enable Lasing on Spherical Resonators", ACS Nano, 2014, 10947-10952.
Sutherland, et al., "Sensitive, Fast, and Stable Perovskite Photodetectors Exploiting Interface Engineering", ACS Photonics, 2015, 1117-1123.
Wojciech, et al., "65 nm feature sizes using visible wavelength 3-D multiphoton lithography", 2007, 3426-3436.
Xianmao, et al., "Mechanistic Studies on the Galvanic Replacement Reaction between Multiply Twinned Particles of Ag and HAuCl4 in an Organic Medium", JACS Article, 2007, 1733-1742.
Xiaoyu, et al., "Enhancing the Brightness of Cesium Lead Halide Perovskite Nanocrystal Based Green Light-Emitting Devices through the Interface Engineering with Perfluorinated Ionomer", NANO Letters, 2016, 1415-1420.
Xing, et al., Low-temperature solution-processed wavelength-tunable perovskites for lasing,, Nature Materials, vol. 13, May 2014, pp. 476-480.
Xingliang, et al., "Solution-processed, high-performance light-emitting diodes based on quantum dots", Letter, Nov. 6, 2014, 1-15.
Yakunin, et al., "Low-threshold amplified spontaneous emission and lasing from colloidal nanocrystals of caesium lead halide perovskites", nature communications, 2015, 1-9.
Yang, et al., "The surface modification of nanoporous SiOx thin films with a monofunctional organosilane", Applied Surface Science, 2005, 1197-1201.
Young-Hoon, et al., "Multicolored Organic/Inorganic Hybrid Perovskite Light-Emitting Diodes", Advanced Materials, 2015, 1248-1254.
Yumin, et al., "Colorimetric Response of Dithizone Product and Hexadecyl Trimethyl Ammonium Bromide Modified Gold Nanoparticle Dispersion to 10 Types of Heavy Metal Ions: Understanding the Involved Molecules from Experiment to Simulation", ACS Publications, 2013, 7591-7599.

(56) References Cited

OTHER PUBLICATIONS

Zhang, et al., "Brightly Luminescent and Color-Tunable Colloidal $CH_3NH_3PbX_3$ (X = Br, I, Cl) Quantum Dots Potential Alternatives for Display Technology", ACS NANO, vol. 9, No. 4, Apr. 28, 2015, pp. 4533-4542, Mar. 30, 2015.

Zhang, et al., "Solution-Phase Synthesis of Cesium Lead Halide Perovskite Nanowires", Journal of The American Chemical Society, 2015, 9230-9233.

Zhang, et al., "Ultrasmooth organic-inorganic perovskite thin-film formation and crystallization for efficient planar heterojunction solar cells", Nature Communications, 2015, 1-10.

Zhijun, et al., "Air-stable n-type colloidal quantum dot solids", nature materials, Aug. 2014, 822-828.

Zhi-Kuang, et al., "Bright light-emitting diodes based on organometal halide perovskite", Nature Nanotechnology, Sep. 2014, 687-692.

Zhou, et al., "Interface engineering of highly efficient perovskite solar cells", Science, vol. 345, Issue 6196, Aug. 1, 2014, pp. 542-546.

Zipfel, et al., "Nonlinear magic: multiphoton microscopy in the biosciences", nature biotechnology, Nov. 2003, 1369-1377.

\* cited by examiner

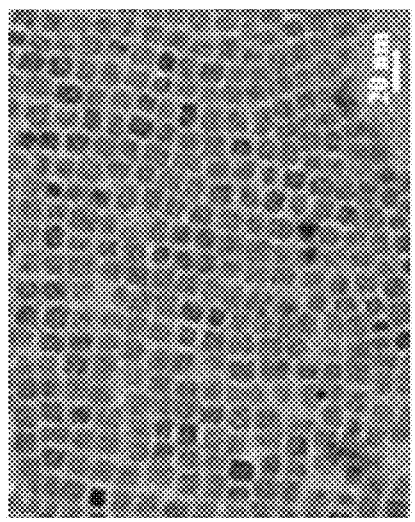
FIG. 2C
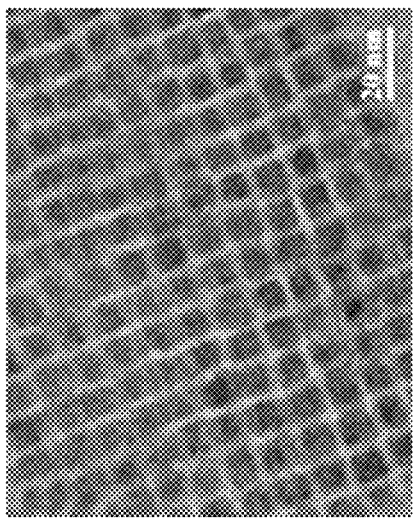
FIG. 2B
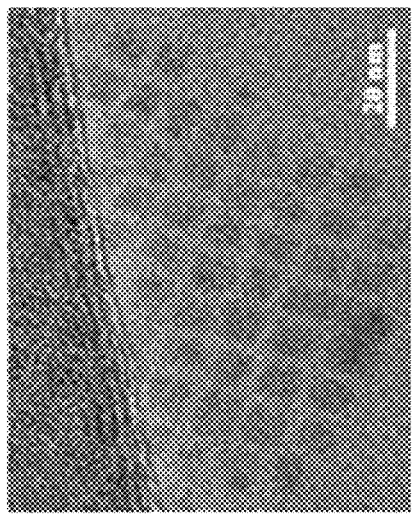
FIG. 2A
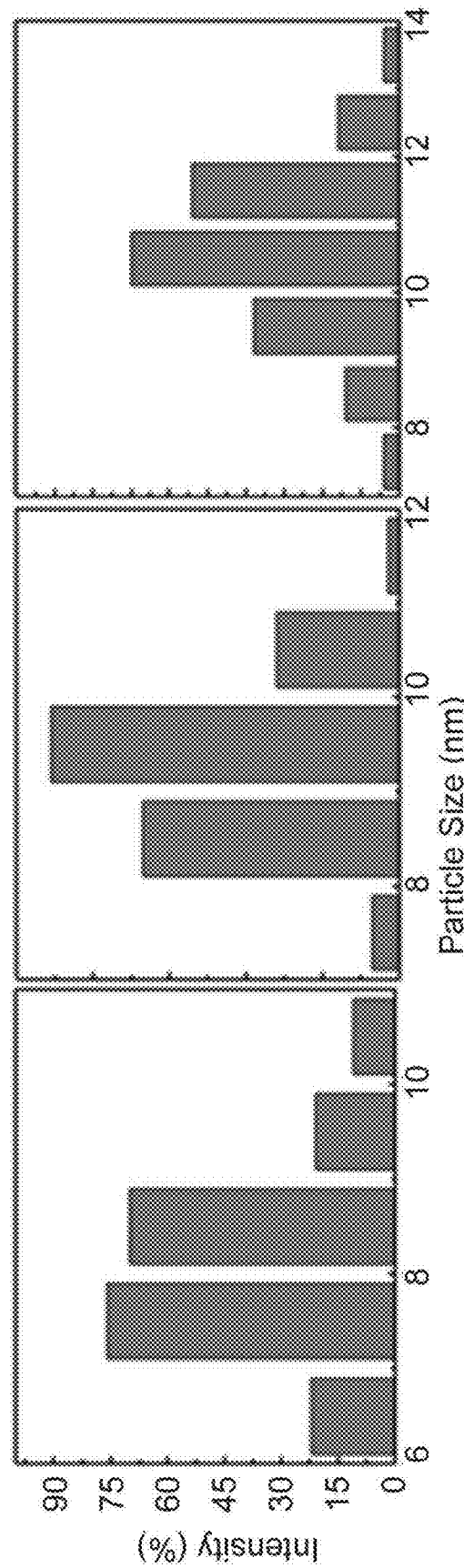
FIG. 2F
FIG. 2E
FIG. 2D Size-selected centrifugation followed by treatment

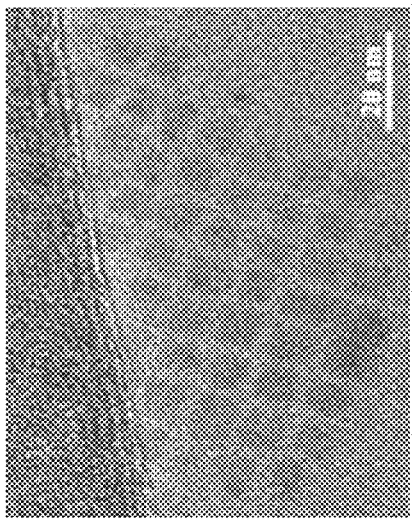
FIG. 27A
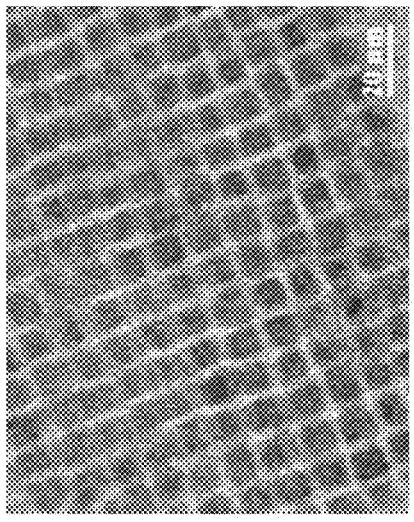
FIG. 27B
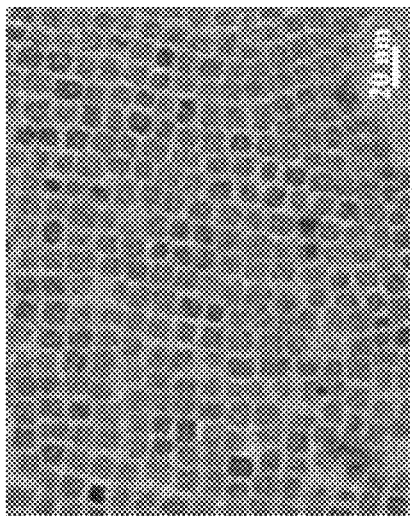
FIG. 27C
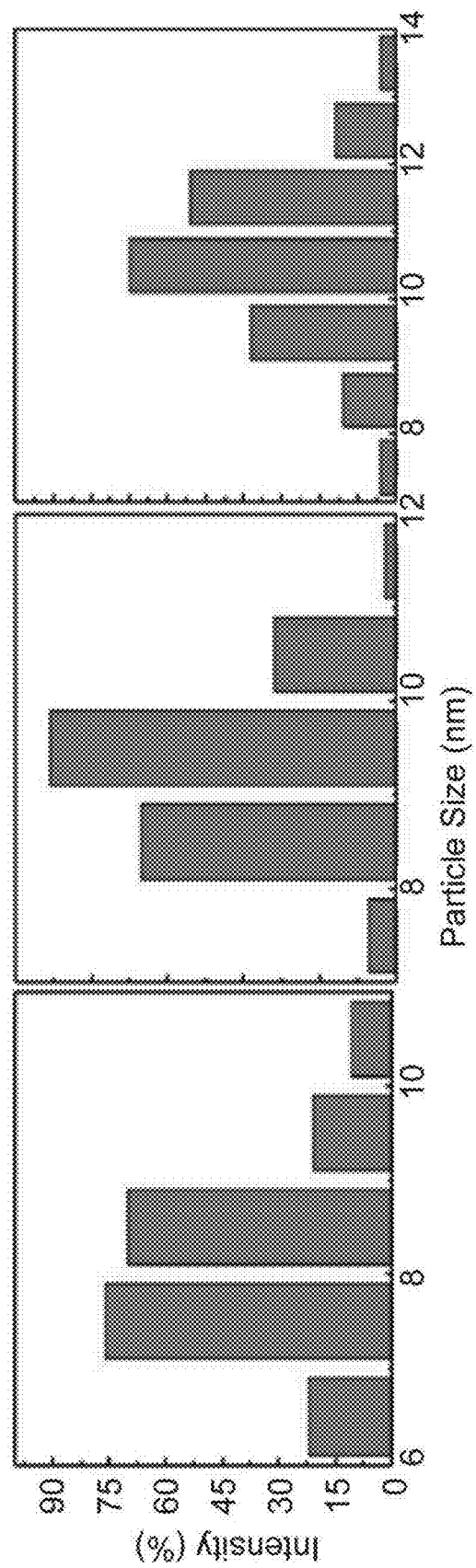
FIG. 27D
FIG. 27E
FIG. 27F

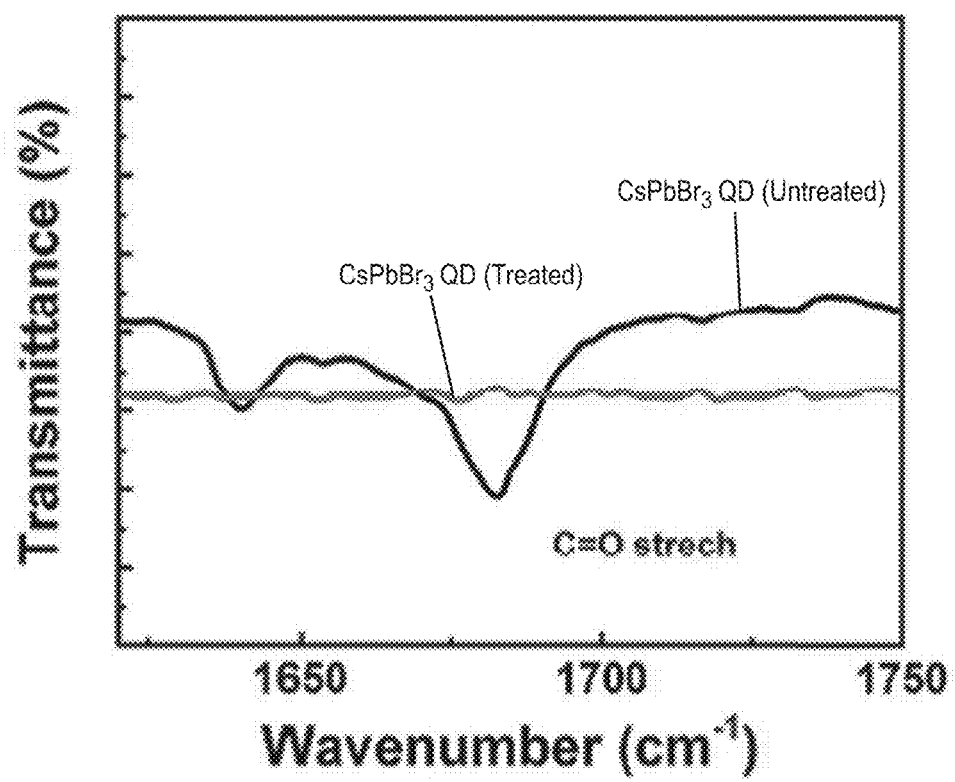
FIG. 33
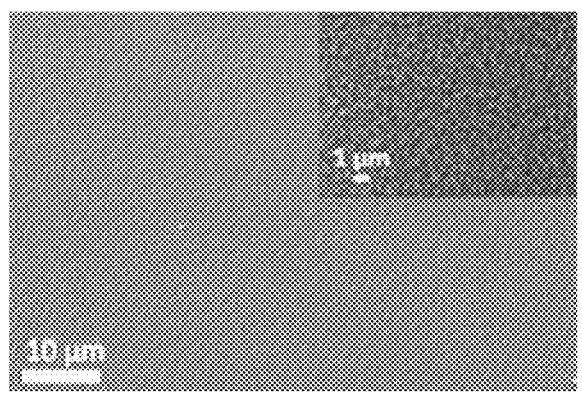 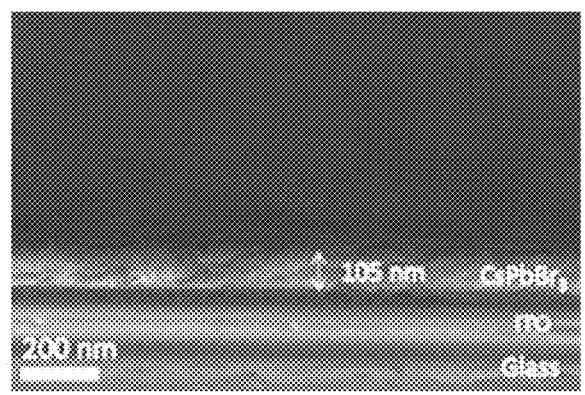
FIG. 34A  FIG. 34B

AIR-STABLE SURFACE-PASSIVATED PEROVSKITE QUANTUM DOTS (QDS), METHODS OF MAKING THESE QDS, AND METHODS OF USING THESE QDS

CROSS-REFERENCE TO RELATED APPLICATIONS

This application is a divisional of U.S. patent application Ser. No. 15/773,680, which was filed on May 4, 2018, and issued as U.S. Pat. No. 10,927,295, which claims the priority to International PCT Application No. PCT/IB2016/056715, filed on Nov. 8, 2016, which claims the benefit of and priority to U.S. Provisional Application Ser. No. 62/252,525, having the title "AIR-STABLE SURFACE PASSIVATED PEROVSKITE QUANTUM DOTS FOR ULTRA-ROBUST, SINGLE-AND TWO-PHOTON-INDUCED AMPLIFIED SPONTANEOUS EMISSION," filed on Nov. 8, 2015 and U.S. Provisional Application Ser. No. 62/335,727, having the title "AIR-STABLE SURFACE-PASSIVATED PEROVSKITE QUANTUM DOTS (QDS), METHODS OF MAKING THESE QDS, AND METHODS OF USING THESE QDS," filed on May 15, 2016, each of the disclosures of which are incorporated herein in by reference in their entirety.

BACKGROUND

Lead halide perovskites have recently emerged as promising candidate materials for optoelectronic applications due to their size-tunable optical bandgaps, attractive absorption, narrow emission, and extraordinary charge transport properties. These impressive characteristics have also triggered intense interest in applying perovskites to the field of light-emitting diodes (LEDs). However, perovskite LEDs (PeLEDs) still exhibit overall low performance limited stability.

SUMMARY

Embodiments of the present disclosure provide for compositions of passivated perovoskite quantum dots, methods of making passivated perovoskite quantum dots, and the like.

An embodiment of the present disclosure includes, among others, a composition comprising a passivated perovskite quantum dot, wherein the passivated perovskite quantum dot is of the form $APbX_3$, where A is $Cs^+$, $Rb^+$, $CH_3NH_3^+$, or $HC(NH_2)_2^+$, and X is a halogen, wherein the passivated perovskite quantum dot includes a capping ligand comprised of an inorganic-organic hybrid ion pair. In an embodiment, the inorganic-organic hybrid ion pair is a sulfur based inorganic-organic hybrid ion pair or a halide based inorganic-organic hybrid ion pair. In an embodiment, the passivated perovskite quantum dot is selected from the group consisting of: $CsPbCl_3$, $CsPbCl_{3-x}Br_x$ (x is 0 to 3), and $CsPbBr_3$. In an embodiment, the passivated perovskite quantum dot has the characteristic of being able to have an amplified spontaneous emission through one photon or two photons and/or wherein the passivated perovskite quantum dot has a photoluminescence quantum yield (PLQY) of about 70% or more.

An embodiment of the present disclosure includes, among others, a making passivated perovoskite quantum dot comprising: mixing a solution of perovoskite quantum dots with a sulfur precursor solution; and forming a passivated perovoskite quantum dot having a capping ligand comprised of inorganic-organic hybrid ion pairs. In an embodiment, the inorganic-organic hybrid ion pair is a sulfur based inorganic-organic hybrid ion pair.

An embodiment of the present disclosure includes, among others, a making passivated perovoskite quantum dot comprising: mixing a solution of perovskite quantum dots with a halide precursor solution; and forming a passivated perovskite quantum dot having a capping ligand comprised of inorganic-organic hybrid ion pairs.

In some embodiments, the present invention includes an optoelectronic device that includes a film comprising a passivated perovskite quantum dot, where the quantum dot includes i) a core of the form $APbX_3$, where A is $Cs^+$, $Rb^+$, $CH_3NH_3^+$, or $HC(NH_2)_2^+$, and X is a halogen and ii) a capping ligand that includes an inorganic-organic hybrid ion pair including di-dodecyl dimethylammonium and at least one anion selected from the group of $Cl^-$, $Br^-$, $I^-$, $SH^-$, sulfide ($S^{2-}$), $Se^{2-}$, $HSe^-$, $Te^{2-}$, $HTe^-$, $TeS_3^{2-}$ or $AsS_3^{2-}$. The optoelectronic device may be a quantum dots light emitting device (QLED) and may further comprise an electron transport layer (e.g., a TPBi electron transport layer) and a hole transport layer (e.g., a PVK hole transportation layer).

Other compositions, methods, features, and advantages will be or become apparent to one with skill in the art upon examination of the following drawings and detailed description. It is intended that all such additional compositions, methods, features and advantages be included within this description, be within the scope of the present disclosure, and be protected by the accompanying claims.

BRIEF DESCRIPTION OF THE DRAWINGS

Further aspects of the present disclosure will be more readily appreciated upon review of the detailed description of its various embodiments, described below, when taken in conjunction with the accompanying drawings.

FIGS. 2A-2F are TEM images (2A-2C) and corresponding size distributions of sample 1 (2A and 2D), sample 2 (2B and 2E), and sample 3 (2C and 2F) QDs.

FIG. 5A is an energy-filtered TEM image of sulfur-treated $CsPbBr_3$ QD networks. FIG. 5B is an EF-TEM image at the same location as panel a, with lead mapped. FIG. 5C is an EF-TEM mapping of sulfur. FIG. 5D is the size distribution of QDs after treatment.

FIG. 10B) Cross-sectional SEM image showing the thickness of the film used for lasing. An ITO film was used as a reference specimen for SEM to avoid charging effects.

FIGS. 27A-27F are TEM images and corresponding size distributions of sample 1 (27A, 27D), sample 2 (27B, 27E), and sample 3 (27C, 27F) QDs.

FIG. 33 shows FTIR spectra of untreated CsPbBr$_3$ QDs in toluene and treated sample in octane. The peak at 1680 cm$^{-1}$ is associated with the (C═O) stretching of the original oleate ligand.

FIGS. 34A-34B show SEM images of (FIG. 34A) CsPbBr$_3$ QDs thin film. The inset shows a high-resolution image. (FIG. 34B]) Cross-sectional SEM image is showing the thickness of the film used for lasing. An ITO film was used as a reference specimen for SEM to avoid charging effects.

FIG. 38A P-QDs without wash; FIG. 38B OA-ODs, washed with butanol and dispersed in toluene; FIG. 38C OA-ODs, washed with butanol after OA soaking for 30 min and dispersed in toluene;

FIG. 38D DDAB-OA-QDs, washed with butanol and dispersed in toluene; FIG. 38E UV-Vis absorption and PL spectra and FIG. 38F FTIR spectra of P-QDs, OA-QDs, DDAB-OA-QDs.

FIG. 41B shows photoelectron spectroscopy in air studies carried out for VBM. Inset showing the energy levels that are expressed from the vacuum, which is set at zero. FIG. 41C is a cross-sectional TEM image showing the multiple layers. FIG. 41D is an illustration of the schematic PeLED device structure.

FIG. 42A illustrates current density and luminance versus driving voltage characteristics. FIG. 42B plots current efficiency and external quantum efficiency versus driving voltage characteristics. FIG. 42C shows EL spectrum at an applied voltage of 5V, and inset, a photograph of a device. Blue (CsPbBr$_3$Cl$_{3-x}$) PeLED device performance. FIG. 42D plots current density and luminance versus driving voltage characteristics. FIG. 42E plots current efficiency and external quantum efficiency versus driving voltage characteristics. FIG. 42F shows EL spectrum at an applied voltage of 7 V, and inset, a photograph of a device.

FIG. 49C and FIG. 49D illustrate images from the precipitate. After treated 2.5 h, the transparent solution was centrifuged at 8000 rpm for 5 min; the supernatant was collected for directly TEM analysis while the precipitate was re-dispersed in toluene for characterization. No regular cubic shape around 10 nm can be found, indicated possible new reaction inside the mixture.

FIG. 51A plots external quantum efficiency and luminance versus driving voltage. FIG. 51B plots current density and luminance versus driving voltage.

DETAILED DESCRIPTION

Figure 1:
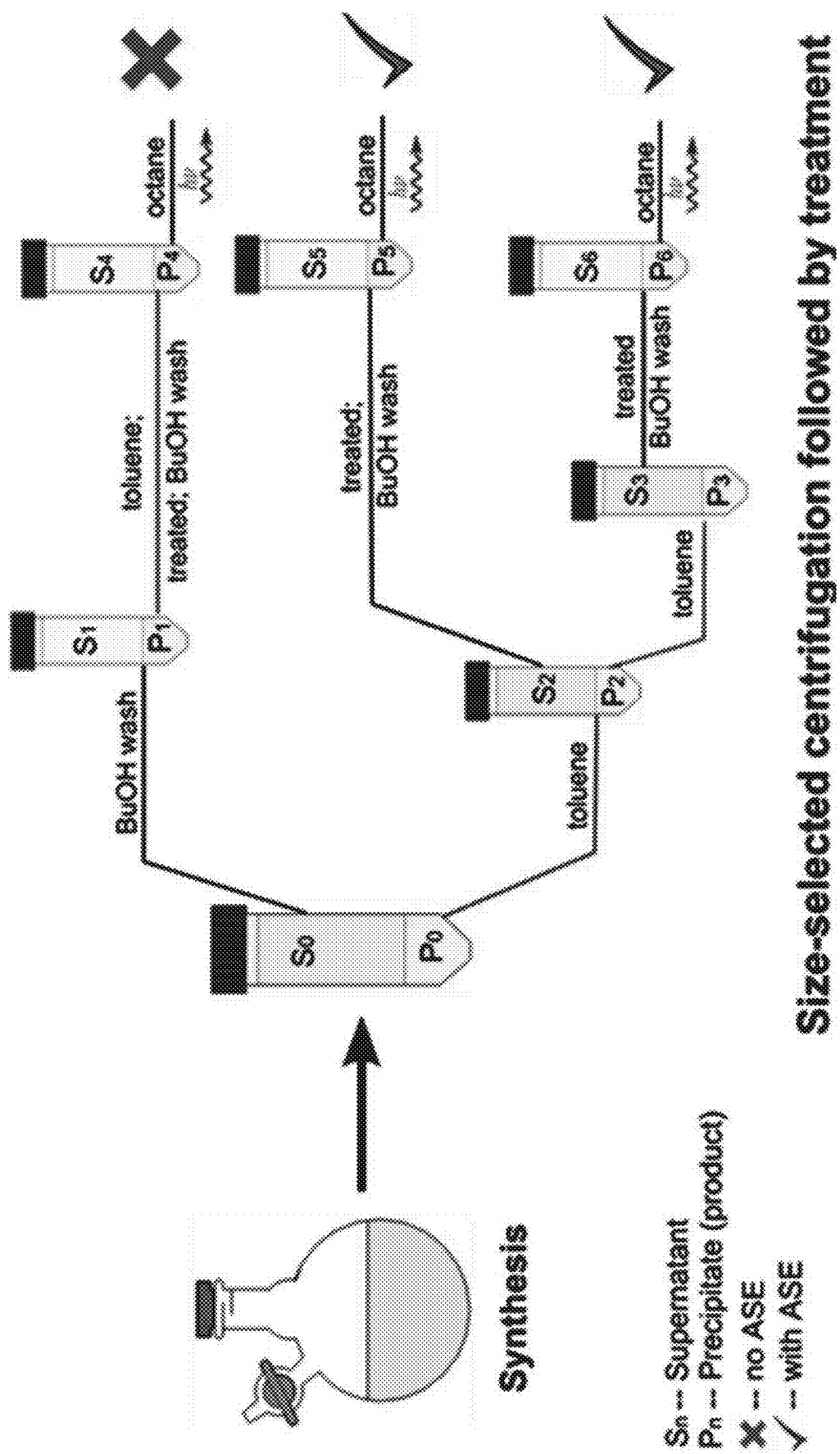
FIG. 1 is a scheme of size purification for ASE test.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of chemistry, material science, and the like, which are within the skill of the art.

The following examples are put forth so as to provide those of ordinary skill in the art with a complete disclosure and description of how to perform the methods and use the probes disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is at or near atmospheric. Standard temperature and pressure are defined as 20° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise.

Definitions

The term "quantum dot" can include, but is not limited to, luminescent semiconductor quantum dots. In general, quantum dots include a core and optionally a cap. The "core" is a nanometer-sized semiconductor. While any core of the IIA-VIA, IIIA-VA, or IVA-VIA semiconductors can be used in the context of the present disclosure, the core is such that, upon combination with a cap, a luminescent quantum dot results. A IIA-VIA semiconductor is a compound that contains at least one element from Group IIA and at least one element from Group VIA of the periodic table, and so on. The core can include two or more elements. In one embodiment, the core is a IIA-VIA, or IIIA-VA, semiconductor that can be about 1 nm to about 250 nm, about 1 nm to 100 nm, about 1 nm to 50 nm, or about 1 nm to 10 nm in diameter. In another embodiment, the core can be a IIA-VIA semiconductor and can be about 2 nm to about 10 nm in diameter. For example, the core can be $CsPbBr_3$, CdS, CdSe, CdTe, ZnSe, ZnS, PbS, PbSe, $CsPbCl_3$, $CsPbCl_{3-x}Br_x$, (x is 0 to 3), or an alloy.

The wavelength emitted (e.g., color) by the quantum dots can be selected according to the physical properties of the quantum dots, such as the size and the material of the nanocrystal. Quantum dots are known to emit light from about 300 nanometers (nm) to 2000 nm (e.g., UV, near IR, and IR). The colors of the quantum dots include, but are not limited to, red, blue, green, and combinations thereof. The color or the fluorescence emission wavelength can be tuned continuously. The wavelength band of light emitted by the quantum dot is determined by either the size of the core or the size of the core and cap, depending on the materials that make up the core and cap. The emission wavelength band can be tuned by varying the composition and the size of the QD and/or adding one or more caps around the core in the form of concentric shells.

The phrase "amplified spontaneous emission" means light, produced by spontaneous emission, that has been optically amplified by the process of stimulated emission in a gain medium. It is inherent in the field of random lasers.

Two-photon absorption, or 2PA, as used herein is a third-order non-linear optical phenomenon in which a molecule absorbs two photons simultaneously, resulting in an electronic transition from the ground state to an excited state via virtual states. 2PA pumping has several advantages over 1PA pumping, for instance, minimum risk of photodamage to the sample, longer penetration depth in the absorbing material and the absence of a phase-matching requirement for the generation and wavelength tuning of coherent light. In addition to these advantages, deleterious effects of the excitation light such as unwanted scattering and absorption losses are completely suppressed in 2PA.

General Discussion

Embodiments of the present disclosure provide for passivated quantum dots, methods of making passivated quantum dots, methods of using passivated quantum dots, and the like. In an embodiment, the passivated quantum dots can be used to make structures such as quantum films as well as be used in non-linear optical applications, solar cells, LEDs, photovoltaics, lasing, photodetectors and other optoelectronic applications. Embodiments of the present disclosure provide for passivated quantum dots and films that exhibit high pump fluence and operational stability in ambient conditions as compared to currently used technologies. Furthermore, embodiments of the present disclosure are advantageous over other perovskite materials due to their increased photostability under laser excitation for both one- and two-photon pumping.

In particular, the present disclosure provides for ultra-air stable and/or photostable passivated quantum dots (e.g., $CsPbBr_3$ Quantum Dots (QDs)) that include an inorganic-organic hybrid ion pair as the capping ligand for the core of the QD. This passivation approach to perovskite QDs yields high photoluminescence quantum yield with unprecedented operational stability in ambient conditions (e.g., about 60±5% lab humidity) and high pump fluences, thus overcoming one of the greatest challenges impeding the development of perovskite-based applications. Due to the robustness of passivated perovskite QDs, induced ultra-stable amplified spontaneous emission (ASE) in solution of processed QD films can be conducted using one photon as well as through two-photon absorption processes. The two photon process has not been observed before in the family of perovskite materials. In addition, passivated perovskite QD films showed remarkable photostability under continuous pulsed laser excitation in ambient conditions for at least 34 hours (corresponds to about $1.2 \times 10^8$ laser shots), substantially exceeding the stability of other colloidal QD systems in which ASE has been observed.

In an embodiment, the composition includes a passivated perovskite quantum dot. In an embodiment, the core of the passivated quantum dot can be a IIA-VIA, IIIA-VA, or IVA-VIA semiconductors such that upon combination with a capping ligand (cap) forms a luminescent quantum dot. In an embodiment, the passivated perovskite quantum dot includes a core of the form $APbX_3$, where A is $Cs^+$, $Rb^+$, $CH_3NH_3^+$, or $HC(NH_2)_2^+$, and X is a halogen. In an embodiment, the capping ligand of the passivated perovskite quantum dot is an inorganic-organic hybrid ion pair. In an embodiment, the inorganic-organic hybrid ion pair is a sulfur based inorganic-organic hybrid ion pair or a halide based inorganic-organic hybrid ion pair. The sulfur based inorganic-organic hybrid ion pair include $S^{2-}$ and di-dodecyl dimethylammonium ($DDA^+$). In another embodiment, the halide inorganic-organic hybrid ion pair can include a di-dodecyl dimethylammonium bromide ($Br^--DDA^+$), di-dodecyl dimethylammonium chloride ($Cl^--DDA^+$), and a combination thereof. In an embodiment, the other anion could also be applied for the inorganic-organic hybrid ion pair, such as $Cl^-$, $Br^-$, $I^-$, $SH^-$, $Se^{2-}$, $HSe^-$, $Te^{2-}$, $HTe^-$, $TeS_3^{2-}$ or $AsS_3^{2-}$, while the other can be di-dodecyl dimethylammonium ($DDA^+$).

In an embodiment, the size (e.g., diameter) of the quantum dot can be about 5 to 20 nm or about 6 to 16 nm. In an embodiment, the thickness of the capping ligand layer can be about 70 to 140 nm or about 90 to 120 nm. In an embodiment the diameter of the passivated perovskite quantum dot can be about 75 to 160 nm or about 75 to 150 nm.

In an embodiment, the passivated perovskite quantum dot can have a characteristic of being able to have an amplified spontaneous emission through one photon or two photons. In some embodiments, the amplified spontaneous emission (ASE) of the passivated quantum films through one- and two-photon pumping can be about 500 to 540 nm, and the photoluminescent emission spectrum can about 3 to 10 nm over the threshold pumping range.

In addition, the passivated perovskite quantum dot has a photoluminescence quantum yield (PLQY) of about 50% or more (e.g., about 70 to 99%). In certain embodiments, the photoluminescent quantum yield of the passivated quantum dots can be about 50-80%.

In an embodiment, the passivated perovskite quantum dot has an operationally stability in ambient conditions of about 55 to 65% lab humidity. In an embodiment, the passivated perovskite quantum dot has a high pump fluence (e.g., about 190 $\mu J/cm^2$).

As mentioned above, the passivated QDs can be incorporated into a passivated QD film. In an embodiment, the passivated perovskite QD film has a photostability under continuous pulsed laser excitation in ambient conditions for at least about 34 hours or more (e.g., about 34 hours corresponds to $1.2 \times 10^8$ laser shots).

Figure 17:
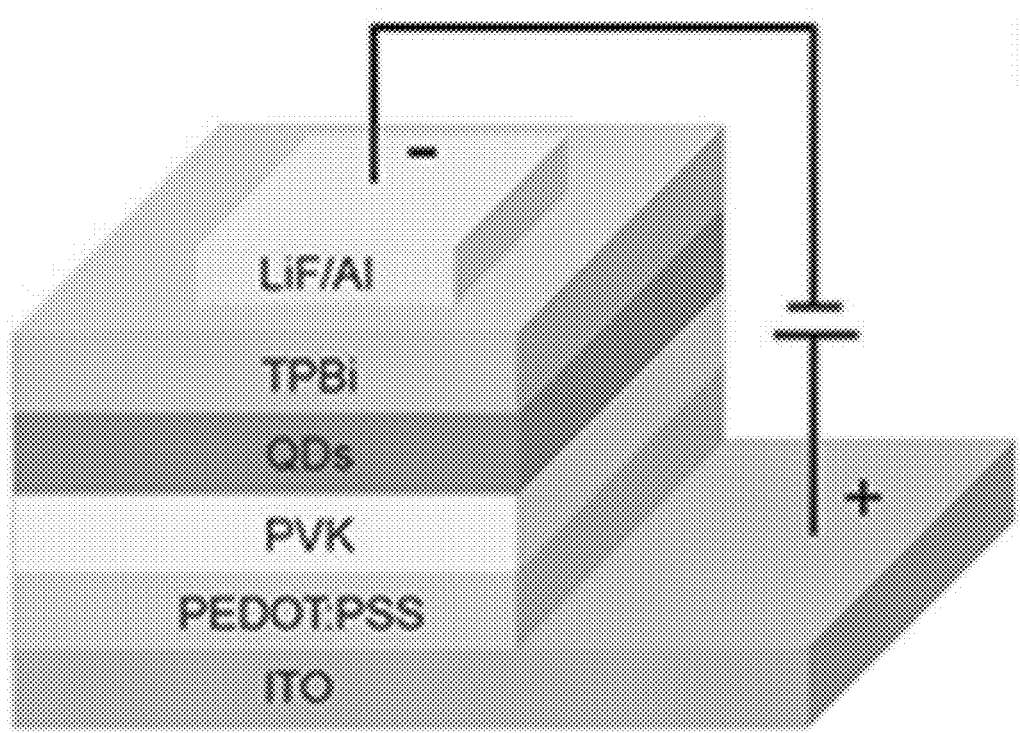
FIG. 17 illustrates the multilayer perovskite QLED device structure.
Figure 18:
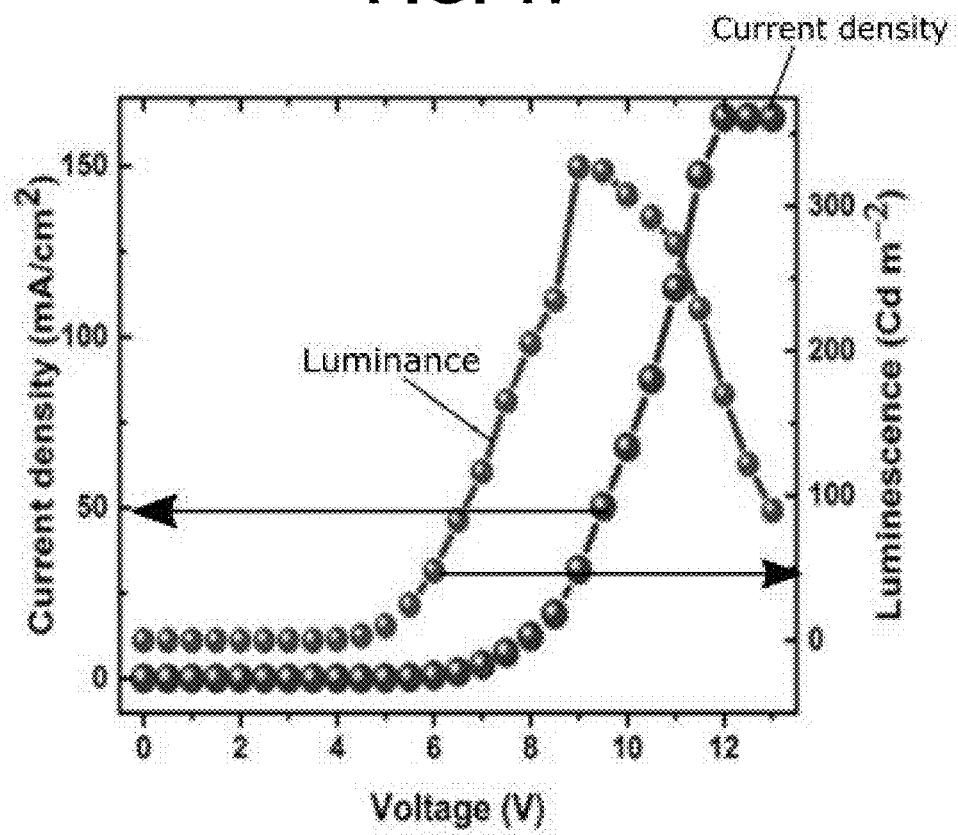
FIG. 18 displays the current density and luminance versus driving voltage characteristics for the QLED device.
Figure 19:
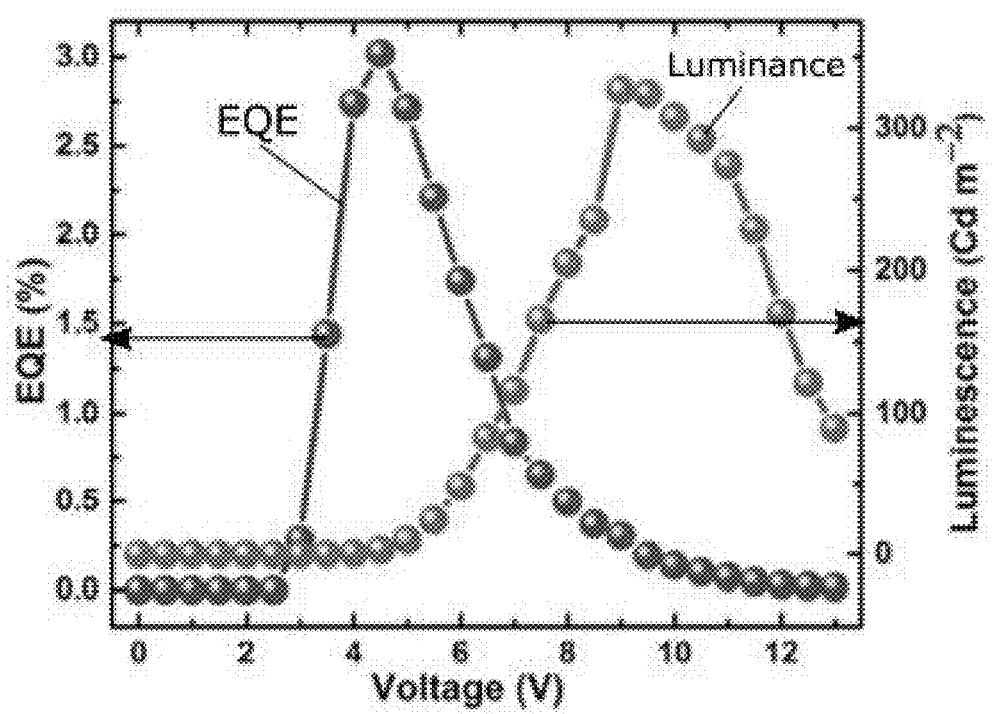
FIG. 19 shows the external quantum efficiency and luminance versus driving voltage characteristics for the QLED device.
Figure 20:
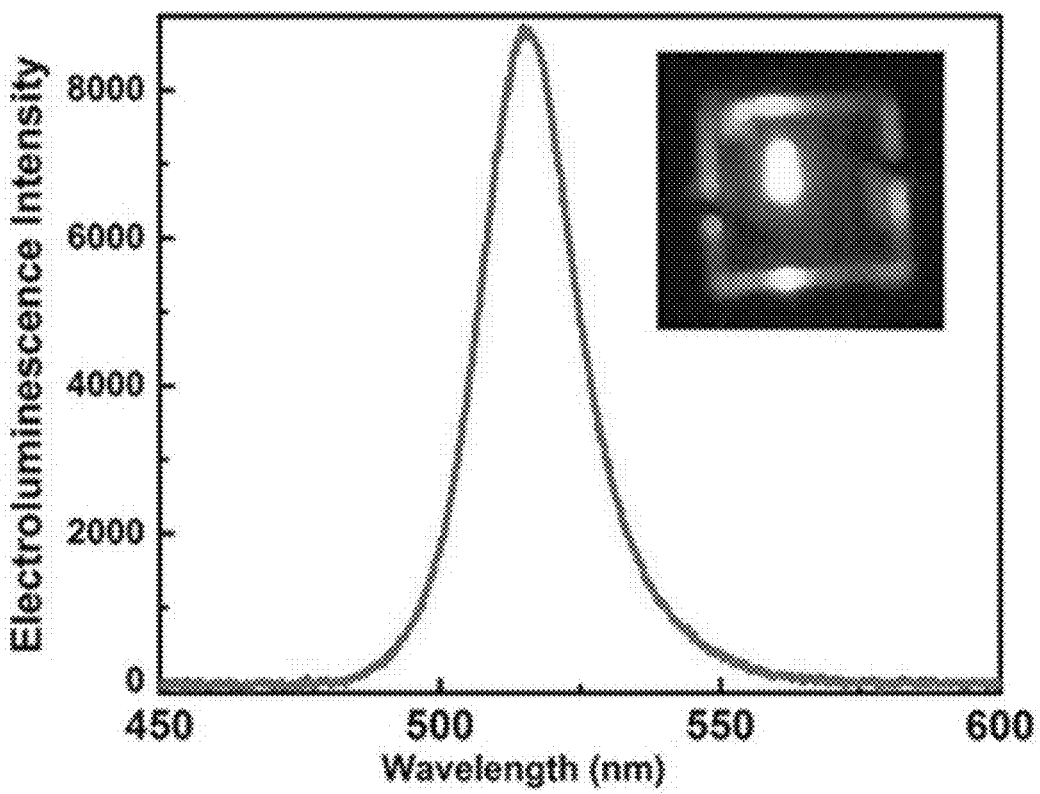
FIG. 20 indicates an EL spectrum at an applied voltage of 5 V and, inset, a photograph of a device FIG. 21 displays different emission color of different perovskite QDs solution under UV light source 365 nm.
Figure 21:
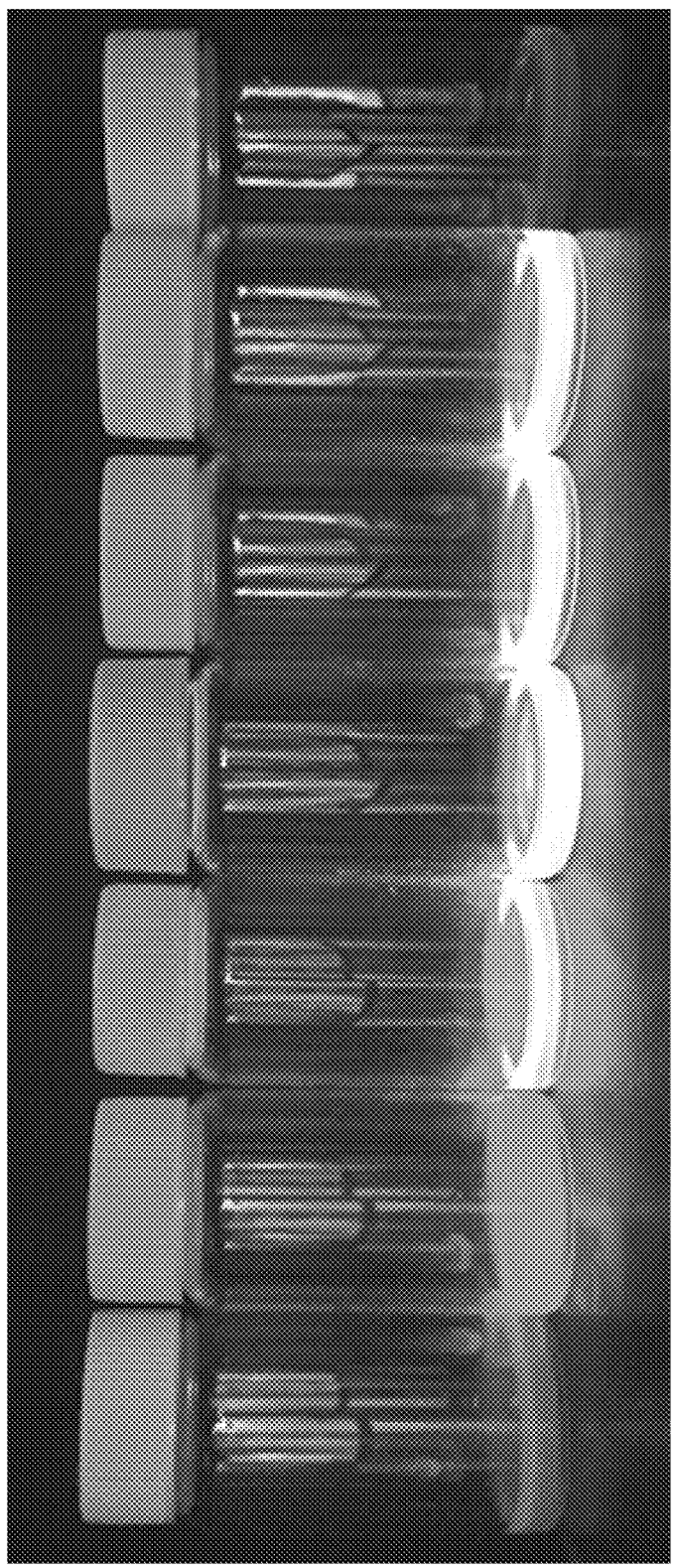

In an embodiment, the passivated QDs were applied in a green light-emitting diode (LED) application with an inverted device architecture: ITO/PEDOT:PSS/PVK/QDs/TPBi/LiF/Al (FIG. 17 of Example 1), achieved luminance and external quantum efficiencies of 330 cd m$^{-2}$ and 3%, respectively (FIGS. 18, 19 of Example 1), shown an electroluminescence of 515 nm (FIG. 20). Based on the promising result, the full color gamut in the visible range can be realized via a simple halide anion exchange (FIG. 21 of Example 1). Similar blue, red and even white LEDs can be produced.

An embodiment of the present disclosure includes methods of making passivated perovoskite quantum dots. A solution of perovoskite quantum dots is mixed with a precursor solution (e.g., a sulfur precursor solution or a halide precursor solution). A method of forming perovoskite quantum dot cores is provided in the Example and can be applied to forming different types of perovoskite quantum dot cores. A method of making the sulfur solution is provided in the Example and can be applied to forming different types of sulfur solutions such as di-dodecyl dimethylammonium sulfide ($S^{2-}-DDA$). In another embodiment, the halide precursor solution can include a di-dodecyl dimethylammonium bromide ($Br^--DDA^+$), di-dodecyl dimethylammonium chloride ($Cl^--DDA^+$), and a combination thereof. Subsequently, the passivated perovoskite quantum dots having the capping ligand are formed.

For example, an acid (e.g., oleic acid) is mixed with the perovoskite quantum dots to form a first mixture. The first mixture is mixed with the precursor solution (e.g., a sulfur precursor solution or a halide precursor solution), and the reaction product is precipitated and then re-dissolved in a solvent. The passivated perovskite quantum dots can be then be processed as desired. Additional details are provided in the Examples.

EXAMPLES

Example 1

Lead trihalide perovskite materials with the formula $APbX_3$ (where $A=Cs^+$, $CH_3NH^{3+}$, or $HC(NH_2)^{2+}$; $X=Br^-$, $I^-$, and/or $Cl^-$) have recently emerged as promising materials for solution-processed optoelectronic applications such as photovoltaics,[1-6] lasing,[7-10] light-emitting diodes[11-14] and photodetectors[15-17] because of their easily tunable optical bandgap as well as their attractive absorption, emission, and charge transport properties. $APbX_3$ materials with some, or all, of these characteristics, have been realized in various forms, including thin films,[18] single crystals,[19-20] nanowires,[21-22] and quantum dots.[23-24] Perovskite QDs in particular, such as $CsPbX_3$, have ushered the advantages of perovskite materials into the realm of quantum confinement. The results are QDs with emission lines that exhibit narrow full widths at half maximum (FWHM) and remarkably high photoluminescence quantum yields (PLQYs) (approximately ≥70%) and yet can be easily tuned over a very broad spectral window[25]

Despite the impressive metrics of the entire family of lead trihalide perovskites, however, poor stability, in particular with respect to temperature, moisture, and light exposure, remains a ubiquitous impediment for virtually all $APbX_3$ perovskite materials and devices.[26,27] The lack of stability has not only prevented the practical and commercial application of perovskite optoelectronics but has also constrained the exploration of their properties to highly sanitized conditions.[28] Under such a restrictive regime, non-linear optical properties essential for lithography[29], high-resolution optical microscopy,[30] and the characterization and generation of ultrafast optical signals[31] suffer the most. For the aforementioned reasons, surface passivation strategies of perovskite materials have been vigorously pursued (for example, Snaith et. al employed various organic Lewis bases such as thiophene and pyridine to passivate the surface of perovskite films to achieve high photovoltaic power conversion efficiency),[32] but to date, none have led to operational and long-term stability under ambient conditions and/or at high optical fluence.

Herein, we report the development of ultra-air- and photostable perovskite QDs through a new passivation technique (FIG. 1) in which the surface of QDs is coated with an inorganic-organic hybrid ion pair.[33] This novel approach yields high photoluminescence quantum yield (PLQY) with remarkably high operational stability in ambient conditions (60±5% lab humidity) and high pump fluences, thus overcoming one of the major challenges impeding the development of perovskite-based applications. By achieving such levels of robustness, we were able to induce with no signs of degradation amplified spontaneous emission (ASE) in solution-processed QD films not only through one photon (1PA) but also through two-photon absorption (2PA) processes. ASE with the latter in particular has not been previously reported before in the family of perovskite materials, and it demonstrates the potential of these materials for non-linear optical applications.

Figure 3:
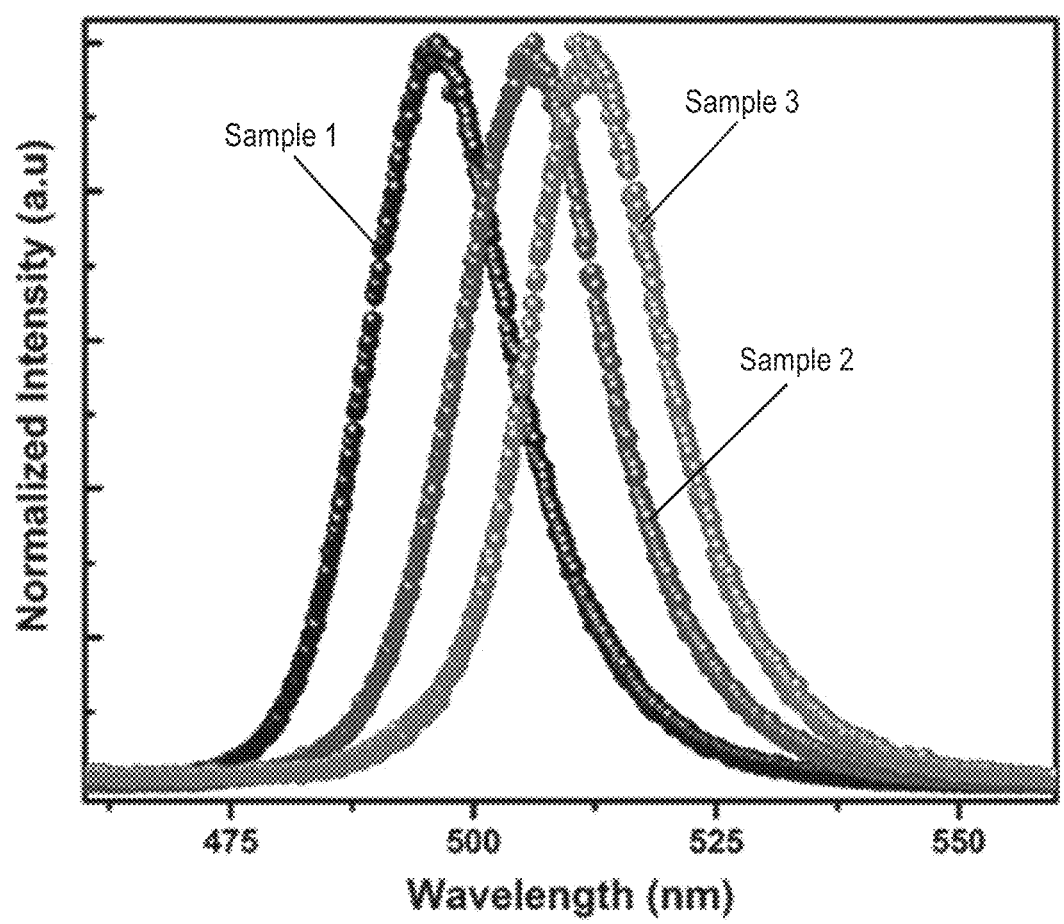
FIG. 3 demonstrates normalized PL emission peaks of $CsPbBr_3$ QDs of various sizes.

$CsPbBr_3$ quantum dots (QDs) were synthesized similarly to the modified hot-injection method previously reported by Protesescu et al.[25] As shown in FIG. 1, selective centrifugation of the crude solution yielded three samples of various QD sizes. Size distribution analysis revealed the presence of three different populations of QDs (referred to as samples 1, 2 and 3) with average sizes of ~8.2 nm, 9.2 nm, and ~10.6 nm, respectively (FIGS. 2A-2B). To investigate the quantum size effect, we measured the photoluminescence spectra of the synthesized samples. Clear red spectral shifts of 9 nm and 16 nm were observed in the PL position of samples 2 and 3, relative to the spectrum of sample 1, which is consistent with quantum confinement (FIG. 3). This observation is in line with recent reports on the same type of QDs.[24-25]

Figure 4A:
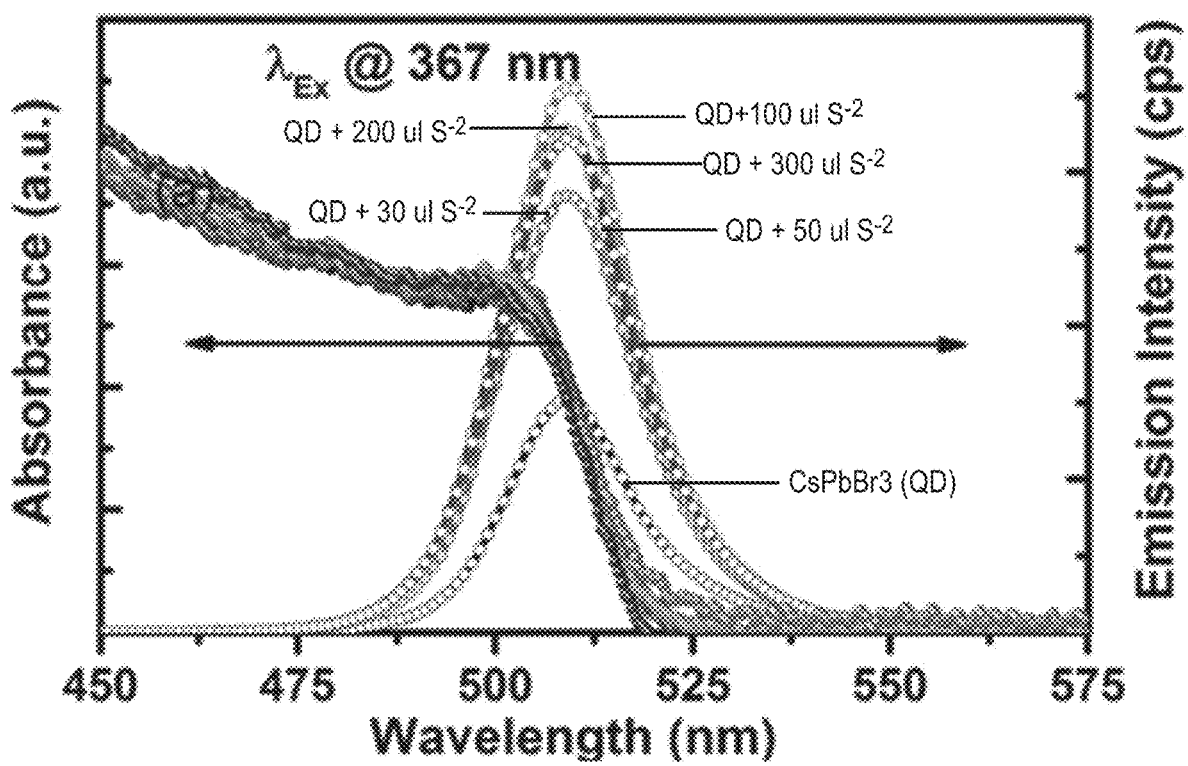
FIG. 4A shows absorption and emission spectra of the untreated QD sample and the treated QD with various amounts of sulfur; the beam width was fixed at 1 nm for the 367 nm excitation.
Figure 4B:
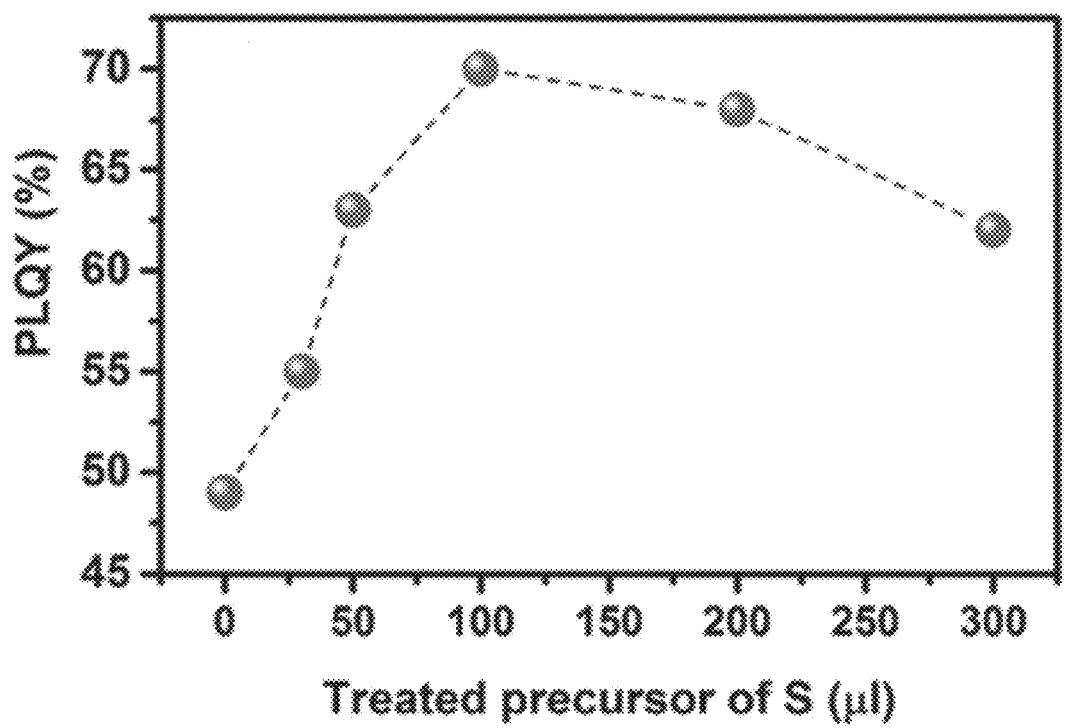
FIG. 4B is the corresponding PLQY.
Figure 5A:
FIGS. 5A-5D demonstrate energy-filtered TEM images and size distribution of the treated QDs.
Figure 5B:
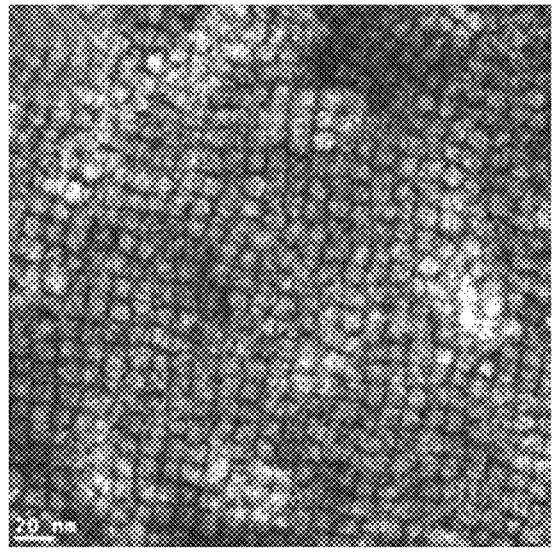
Figure 5C:
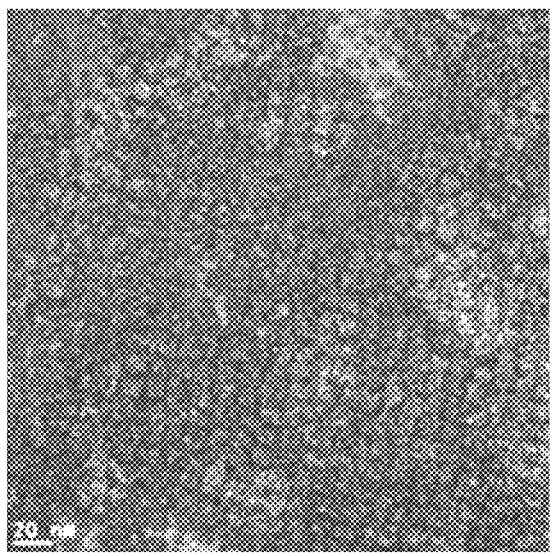
Figure 5D:
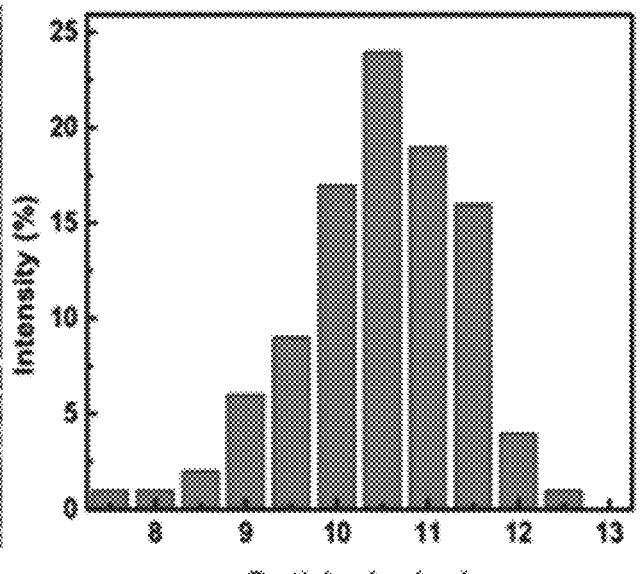

The passivation of surface defects in nanosized organometal halide perovskites can lead to a substantial increase in the photoluminescence quantum yield (PLQY) at room temperature[34]; however, the air and photostabilities of these materials remained elusive. The current study aimed to improve both the PLQY and stability by passivating the QDs, a prerequisite for using them in optoelectronic applications. Initially, we observed that the synthesized $CsPbBr_3$ QDs displayed a lower PLQY compared to previously reported values.[25] Moreover, the PLQY depended on the size of the QDs, reaching values of approximately 35%, 49% and 49% for samples 1, 2 and 3, respectively. To overcome these critical issues, we introduced an inorganic-organic hybrid ion pair (di-dodecyl dimethylammonium sulfide, $S^{2-}$-$DDA_+$)[35] to passivate the QDs, di-dodecyl dimethyl ammonium bromide (DDAB) was used as a source of $DDA_+$ to passivate the perovskite $CsPbBr_3$ QDs. While inorganic-organic hybrid ion pairs, such as $AsS_3^{3-}$-$DDA^+$, where used to cap metal chalcogenide nanocrysta[33], their implementation for perovskite materials has not been demonstrated. In this method, 50 μl of oleic acid (OA) was added to 1 mL of $CsPbBr_3$ QDs (15 mg/mL) under stirring, followed by the addition of a certain amount of sulfur precursor (see Experimental Section for details). The reaction product was subsequently precipitated with BuOH and re-dissolved in octane. We observed that the solution PLQY was enhanced from 49% to 70% upon the injection of 100 μl of sulfur precursor (FIG. 4B). Notably the original position of the emission peak of the CsPbBr3 QDs remained almost unaltered upon the addition of the sulfur precursor, and only an enhancement was observed (FIG. 4A). To understand the nature and the composition of the surface passivation, we employed energy-filtered TEM (EFTEM) analysis, from which we observed that sulfur plays a role in passivation (FIGS. 5A-5D). Also, CHNS elemental analysis further corroborated the existence of sulfur upon treatment (Table 1). Furthermore, the calculated elemental ratio of C, H, and N support the formation of hybrid ion pair ($S^{2-}$-$DDA^+$).

EF-TEM characterization was conducted on sulfur-treated nanocrystals. Elemental mapping was carried out for lead and sulfur. Results indicate a high correlation between lead and sulfur (FIGS. 5B-5D), suggesting that sulfur was indeed present on the nanocrystals as a capping layer rather than as a PbS shell.

TABLE 1

Elemental analysis results

| sample | Sample weight (mg) | N (%) | C (%) | H (%) | S (%) |
|---|---|---|---|---|---|
| CsPbBr$_3$ | 3.766 | 0.54 | 8.16 | 1.35 | 0 |
| Treated CsPbBr$_3$ | 5.262 | 0.30 | 6.26 | 1.11 | 0.20 |

Figure 6:
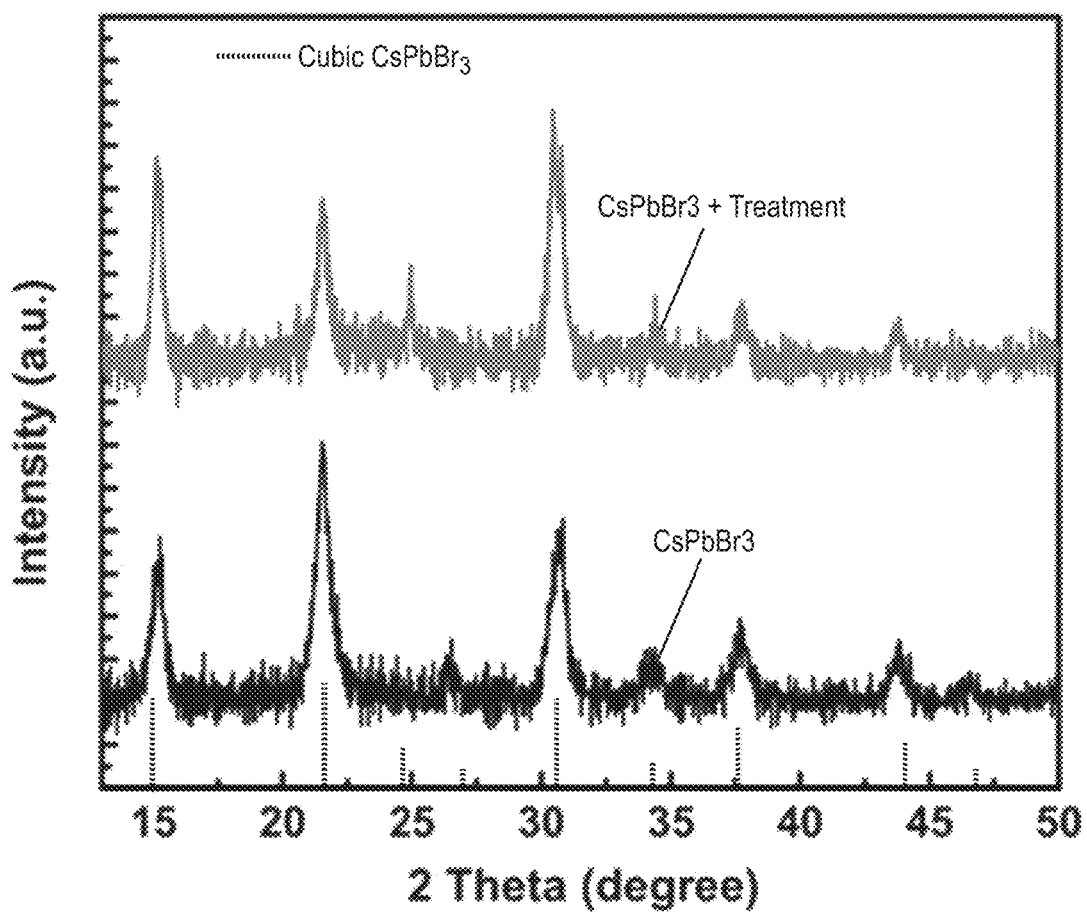
FIG. 6 shows XRD patterns of the untreated and treated samples.
Figure 7A:
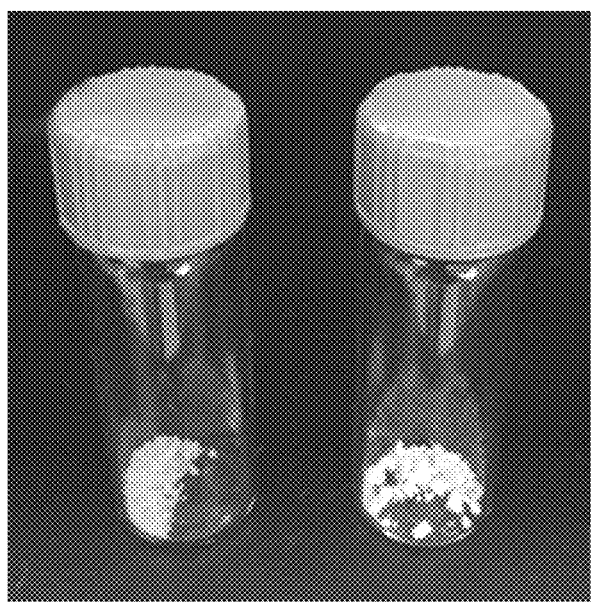
FIGS. 7A-7B are photographs of treated (left) and untreated sample (right); (7A) without and (7B) under UV light irradiation.
Figure 7B:
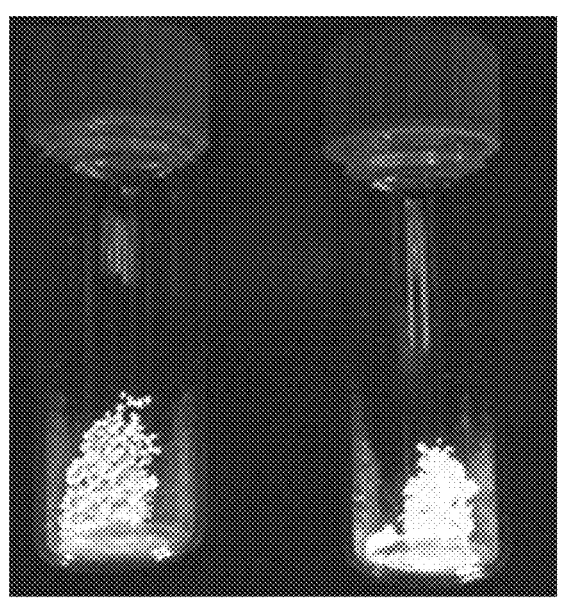

Passivated QD samples were characterized by X-ray powder diffraction (XRD). The XRD patterns of the treated samples were well indexed to the standard cubic CsPbBr3 phase, with no observable secondary phases (FIG. 6). On the other hand, untreated samples exhibited a diffraction pattern that cannot be indexed clearly to the pristine cubic perovskite phase, likely as a result of the samples' degradation under ambient conditions. The instability and degradation of an untreated QD sample were also substantiated by X-ray fluorescence (XRF) analysis, as indicated by the 1:2:5 atomic ratios of Cs, Pb, and Br, respectively, a considerable deviation from the 1:1:3 ratio expected for perovskites (Table 2). Moreover, treated samples were noticeably brighter than the untreated samples under UV light, a clear indicator of the high luminescence obtained after passivation (FIGS. 7A-7B).

TABLE 2

X-ray fluorescence (XRF) results of untreated sample

| Elem. | Line | Mass[%] | 3 sigma | Atomic[%] |
|---|---|---|---|---|
| 35 Br | K | 42.93 | 0.28 | 63.06 |
| 55 Cs | K | 14.54 | 0.42 | 12.84 |
| 82 Pb | L | 42.53 | 0.3 | 24.1 |

Both the treated and untreated samples were washed with 1-butanol, centrifuged and placed under vacuum. The color varied and the luminescence was improved with the applied treatment. X-ray fluorescence (XRF) was used to analyze the major elements of the sample. The Cs:Pb:Br ratio was approximately 1:2:5 for the untreated sample (see Table 2), confirming the instability of the inorganic perovskite, which is consistent with the XRD pattern (FIG. 6). The elemental ratio of the treated sample obtained by XRF analysis is not reasonable, perhaps because the sulfur K line (2.307 keV) is very close to the lead M line (2.42 keV) and because hybrid ion pair ligand passivation was performed. However, the XRD pattern (FIG. 6) of the treated sample corresponds to cubic phase CsPbBr$_3$, indicating high stability in air (60% humidity in the lab).

Figure 8:
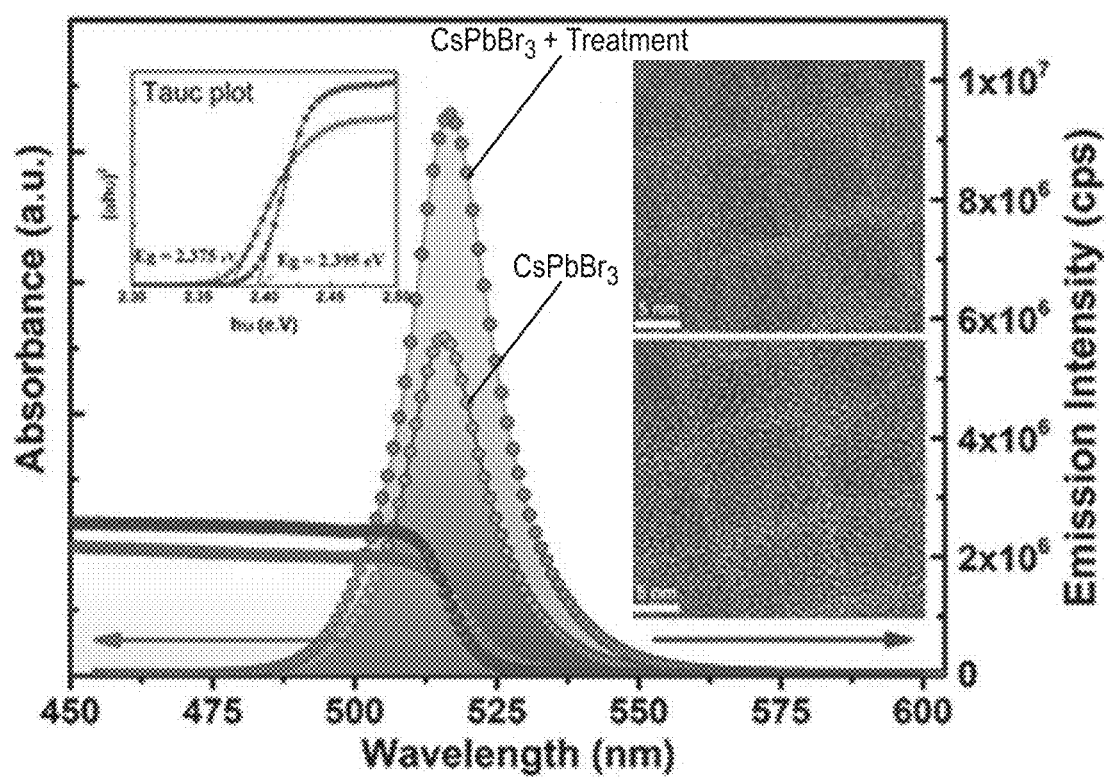
FIG. 8 demonstrates absorption and PL spectra of $CsPbBr_3$ QD film before and after surface treatment. (Top inset) TEM image of treated QD. (Bottom inset) TEM image of untreated QD.
Figure 9:
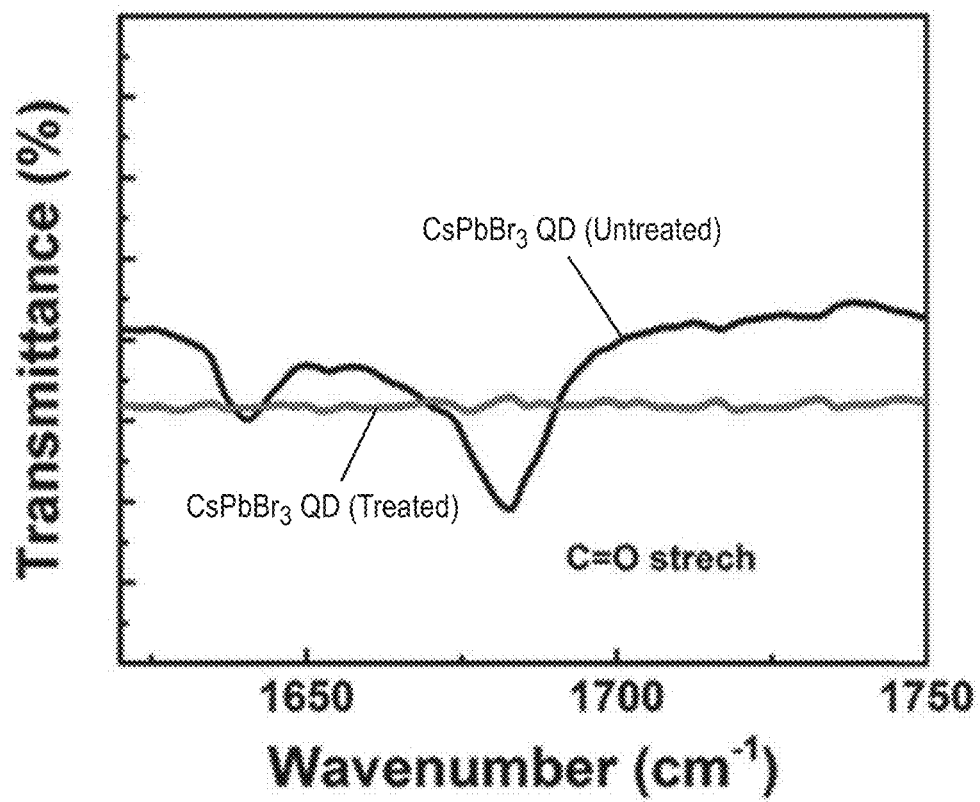
FIG. 9 shows FTIR spectra of untreated $CsPbBr_3$ QDs in toluene and treated sample in octane. The peak at 1680 cm$^{-1}$ is associated with the (C=O) stretching of the original oleate ligand.

For optical characterizations, the untreated and treated samples were spin-coated on a glass substrate to obtain a uniform thin film (see Experimental Section). FIG. 8 shows the absorption and photoluminescence (PL) spectra of the QD films before and after surface passivation. It should be noted that the PL signal is quite narrow in both cases, with an FWHM of 25 nm. Only a very slight change in the bandgap could be observed, as shown in the Tauc plot (FIG. 8, inset), suggesting that the particle size was essentially preserved even after the surface treatment. In addition to the characterizations performed by electronic spectroscopy, vibrational spectroscopy was used to probe the specific chemical functionalities on the surface of the QDs. The C═O stretching vibration of OA was used as a specific marker mode to probe the ligand exchange process. In this experiment, the absence of the 1680 cm$^{-1}$ peak (C═O stretching) in the FTIR spectrum of the treated sample (FIG. 9) provided a clear indication of the replacement of the native oleate functional group by the hybrid ion pair.

Figure 10A:
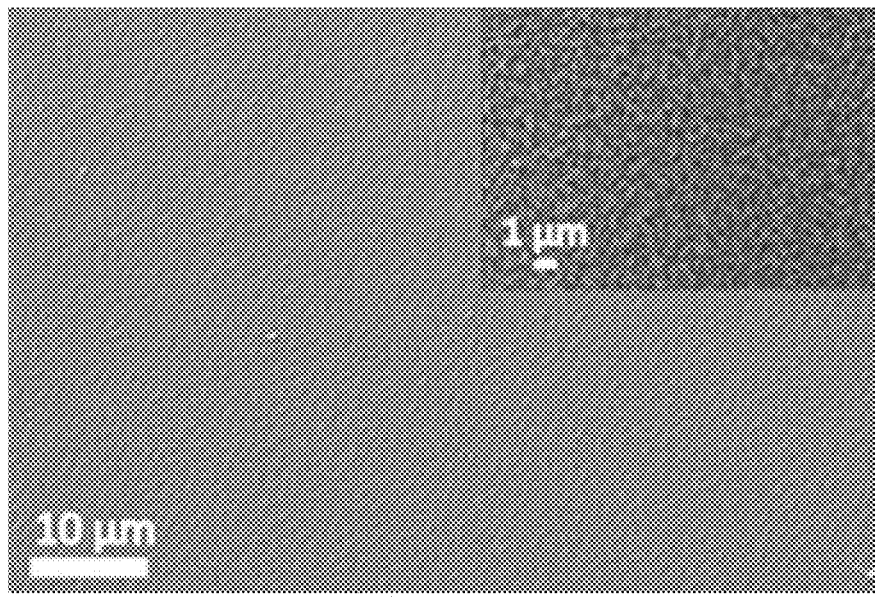
FIGS. 10A-10B are SEM images of FIG. 10A) CsPbBr$_3$ QDs thin film. Inset shows a high-resolution image.
Figure 10B:
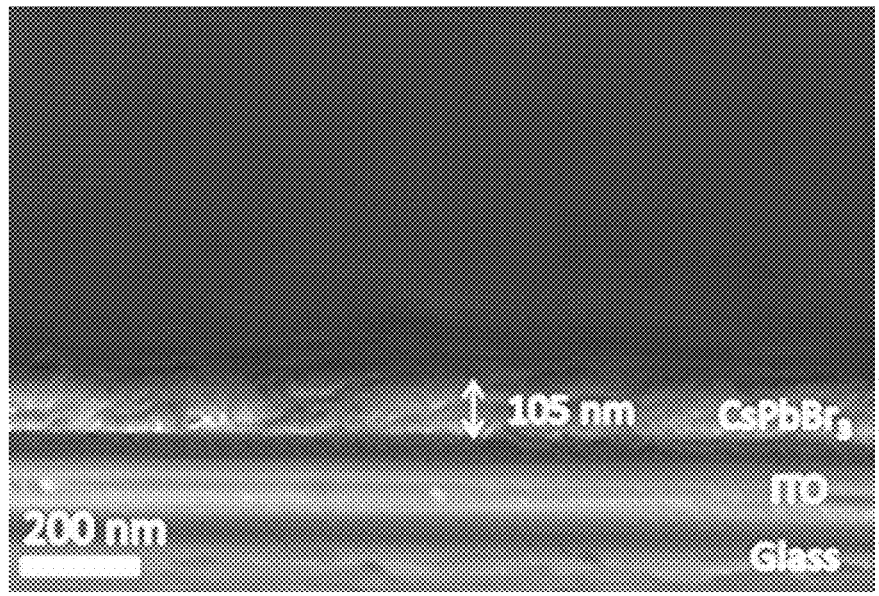
Figure 11A:
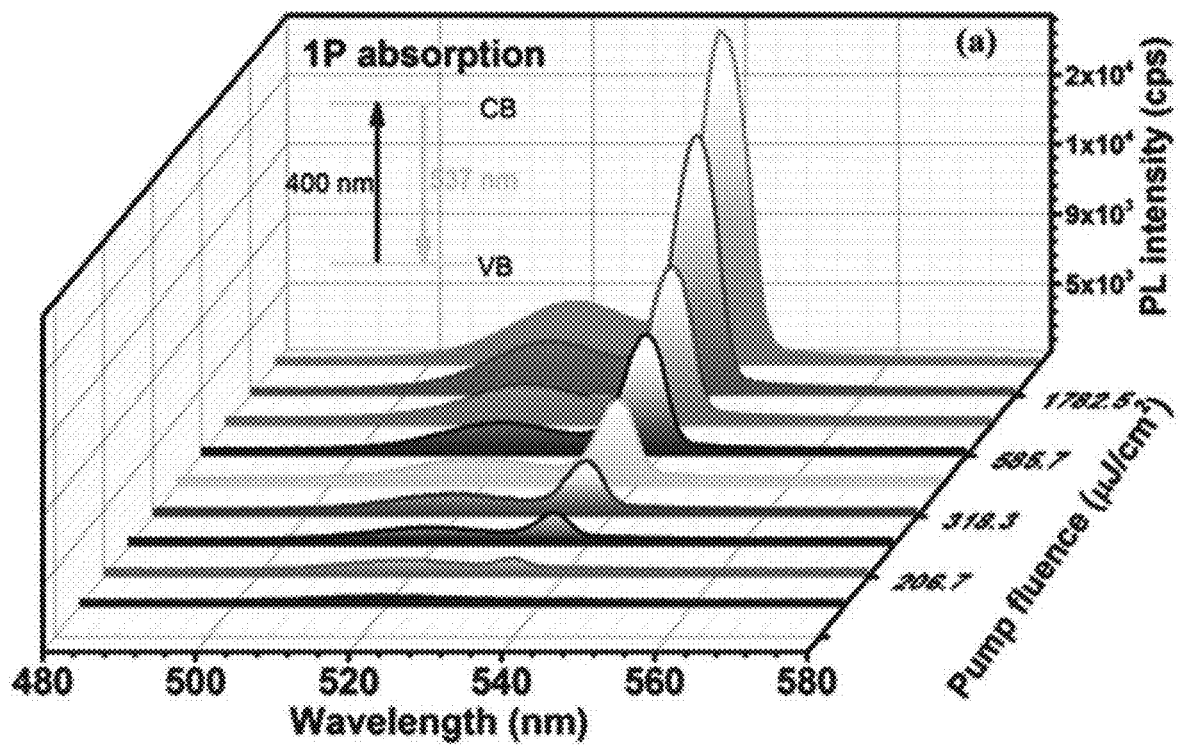
FIGS. 11A-11B demonstrate the pump-fluence relationship determined for the treated CsPbBr$_3$ QD film in (FIG. 11A) 1PA and (FIG. 11B) 2PA.
Figure 11B:
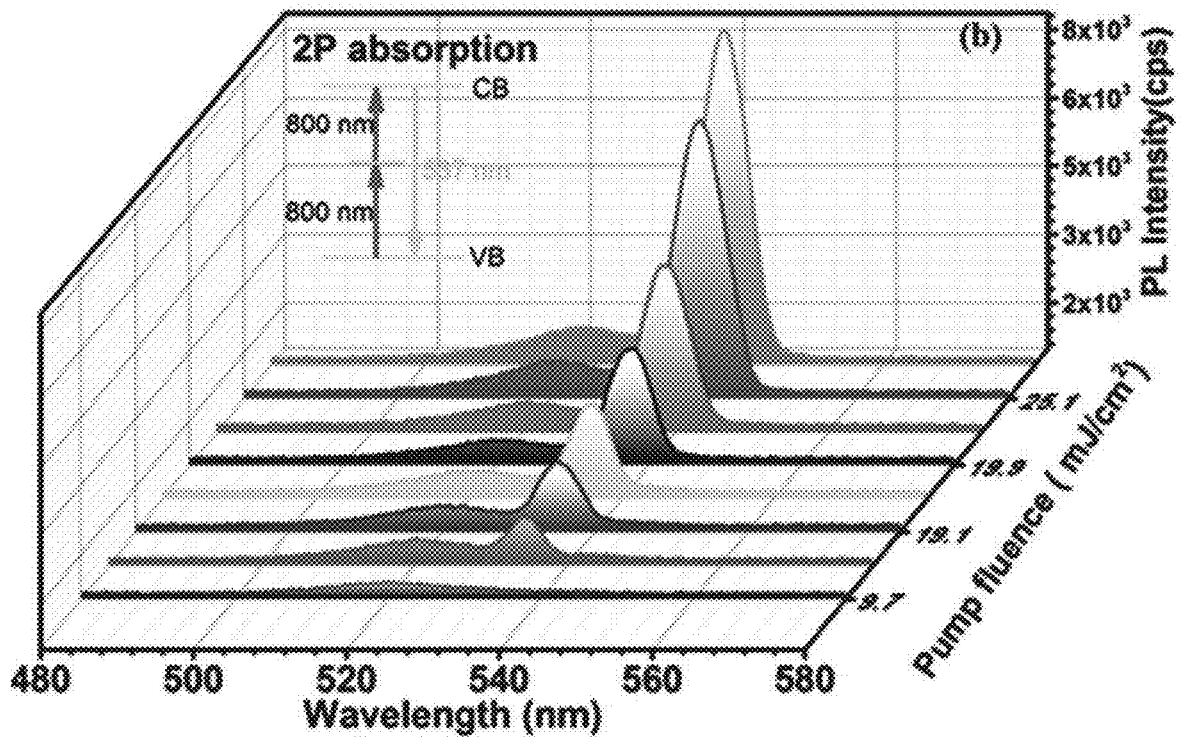

To confirm the air and photostability of the passivated CsPbBr$_3$ QDs films (thickness ~105 nm, FIGS. 10A-10B), we tested their propensity for amplified spontaneous emission (ASE) through one- and two-photon pumping under ambient conditions (room temperature, 60±5% humidity). The results are shown in FIGS. 11A-11B. As can be seen, with an increase in the pump fluence, the ASE generated at 533 nm shifted to 537 nm, which is consistent with the results of a previous report.[36] The onset of stimulated emission in the QD films was observed with the immediate increase in the ASE intensity (ASE peak at ≈ 533 nm) and the narrowing of the emission spectrum (FWHM≈4-7 nm, FIG. 11A inset) over the threshold pumping range. A red shift in the ASE peak (16-21 nm) relative to the PL peak was observed (FIG. 11B).

Figure 12A:
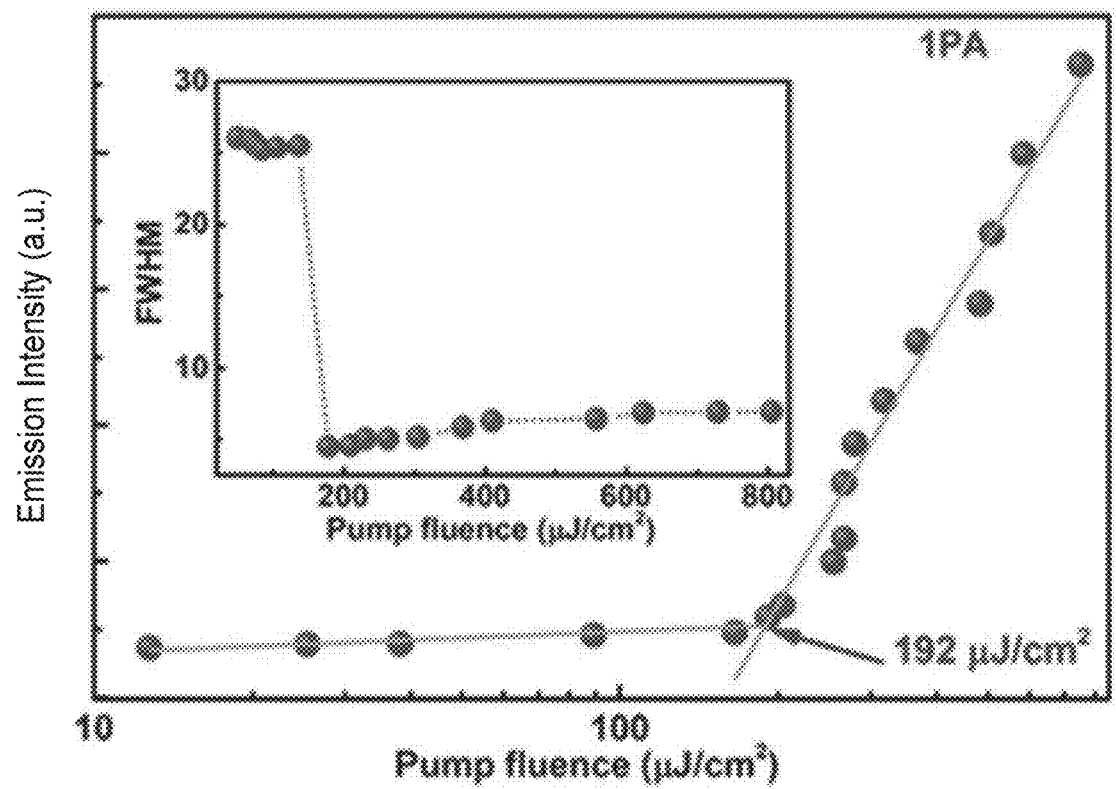
FIGS. 12A-12B illustrate the threshold behavior of the intensity of the ASE of the treated CsPbBr$_3$ QD film in (FIG. 12A) 1PA and (FIG. 12B) 2PA.
Figure 13A:
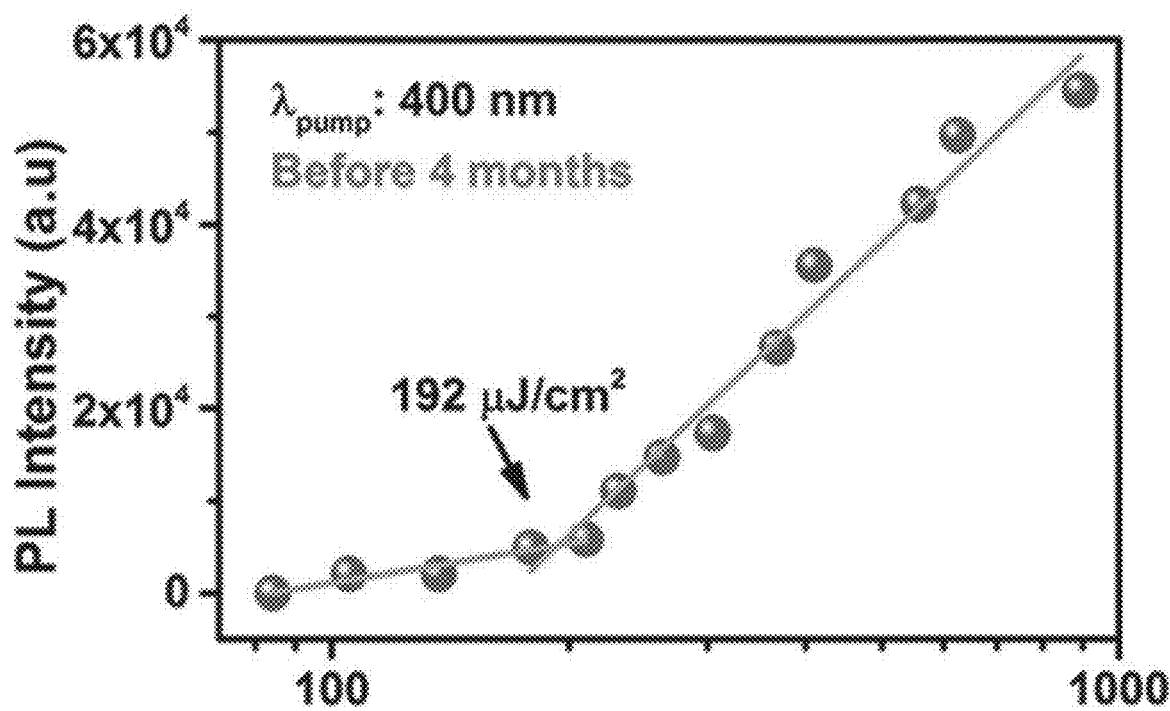
FIGS. 13A-13B show threshold behavior of passivated CsPbBr$_3$ QDs film before (FIG. 13A) and 4 months after (FIG. 13B) passivation.
Figure 13B:
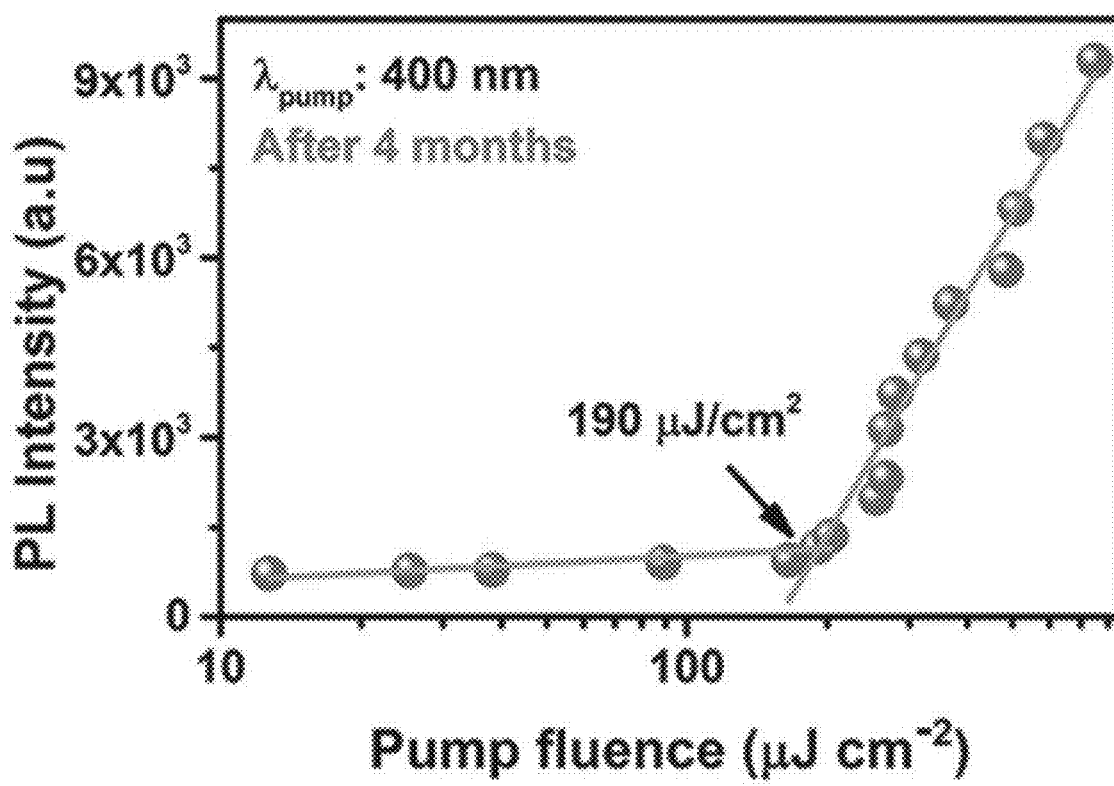

As shown in FIG. 12A, the ASE threshold fluence for one-photon pumping was approximately 192 µJ/cm$^2$, which is lower than the value reported for perovskite thin films.[37] On the other hand, the threshold obtained for the QD film in the current study is higher than that recently reported for the same QDs,[36] probably due to differences in the configurations of the experimental setups. However, the air and photostabilities of our treated QDs are the best reported to date for semiconductor QDs and even for perovskite thin films. It is worth noting that the untreated sample suffered from partial degradation within hours, showing a sharp contrast in performance, whereas the passivated QD film exhibited the same threshold and optical characteristics even after 4 months of open air storage and rounds of photostability testing (vide infra and also see FIG. 13A-13B), providing clear evidence of the ultra-stability of perovskite QD films under ambient conditions.

Figure 14A:
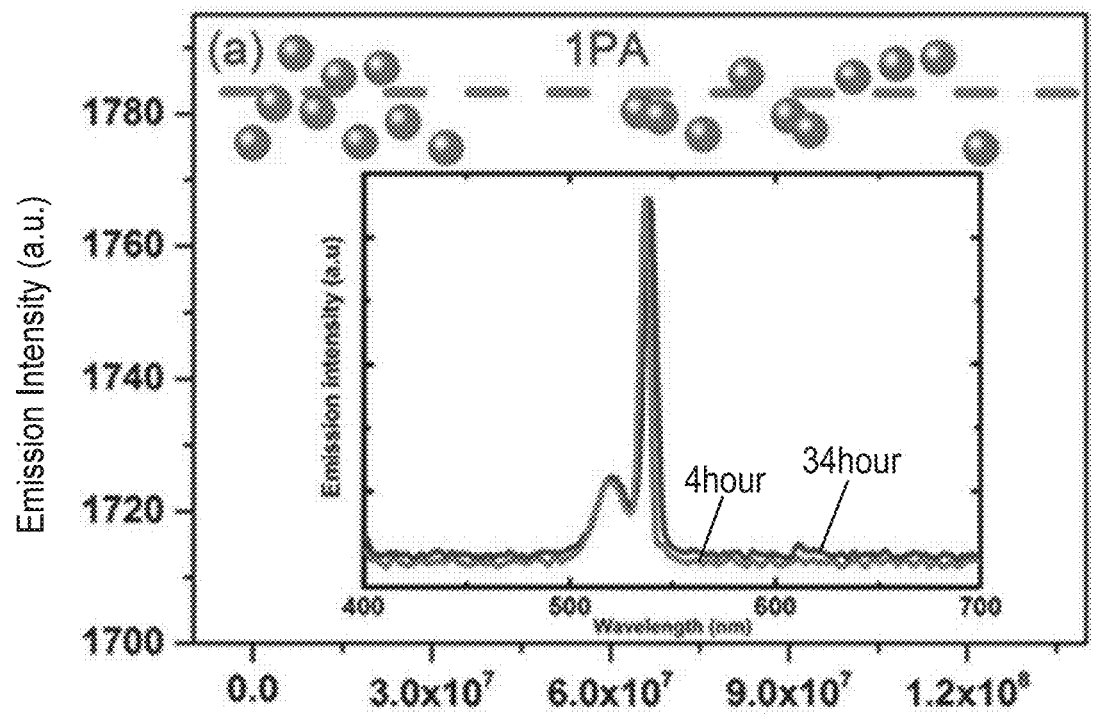
FIGS. 14A-14B show shot-dependent ASE intensity of the solution-processed CsPbBr$_3$ QDs film with approximately 1.2×10$^8$ laser excitation shots at (254 µJ/cm$^2$ pump fluence for 1PA (FIG. 14A), 18 mJ/cm$^2$ pump fluence for 2PA (FIG. 14B)) performed at room temperature under ambient conditions.
Figure 14B:
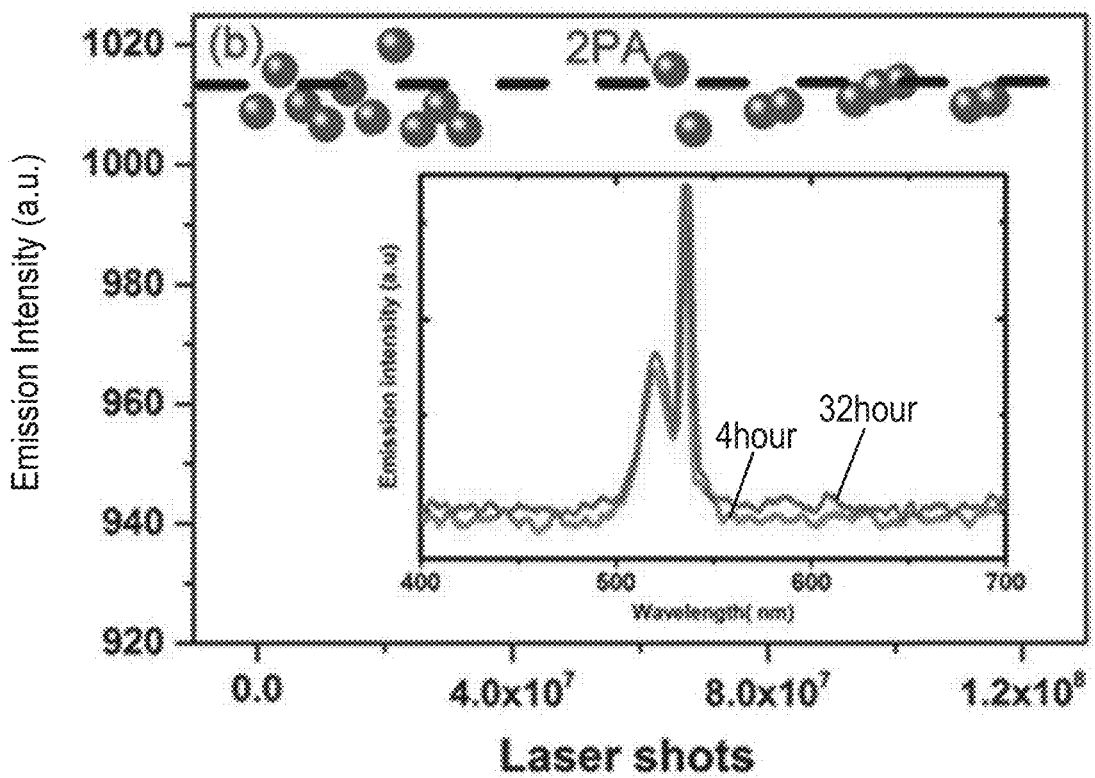

To test the photostability of our QDs films, we measured the variation in ASE intensity as a function of time under continuous femtosecond laser irradiation in ambient conditions, using a femtosecond laser system operated at a repetition rate of 1 kHz. Our results showed that there was almost no change in ASE intensity over 1.2×10$^8$ laser shots (corresponding to a period of 34 hours) for either one- or two-photon pumping (FIGS. 14A-14B). This value substantially exceeds the photo-stability of other semiconductor QD systems for which ASE has been observed.[38,39]

Figure 15:
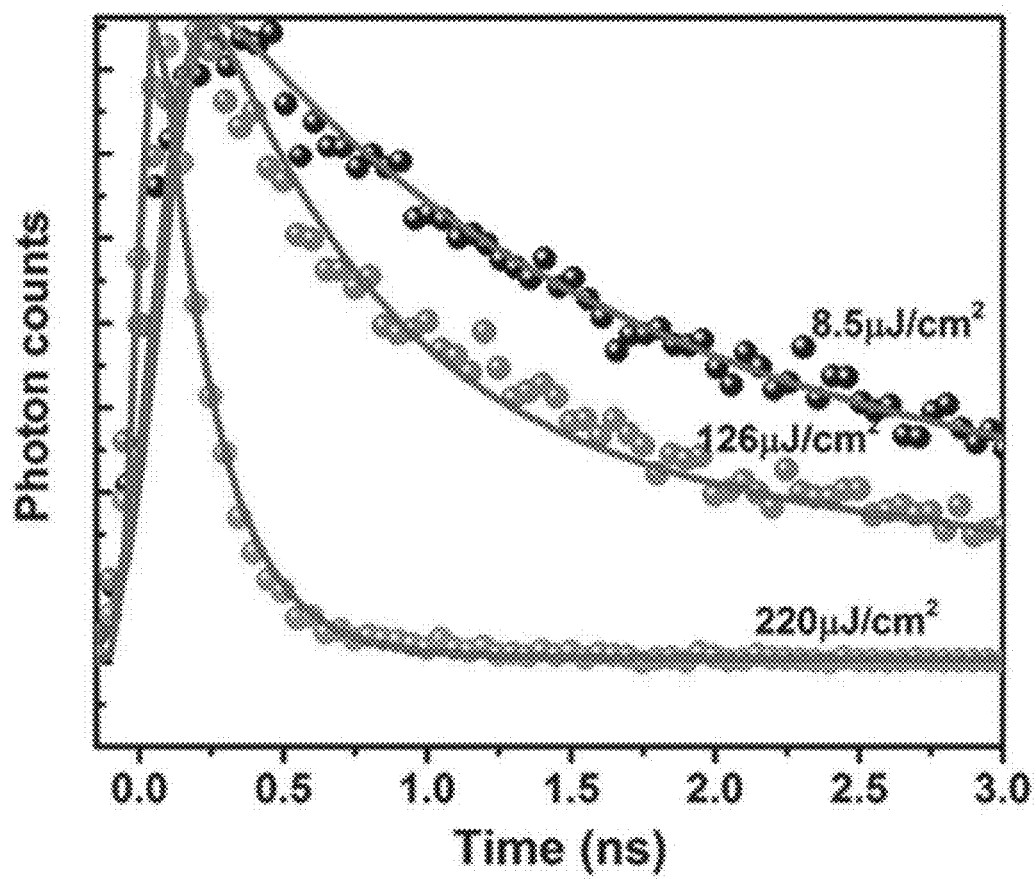
FIG. 15 demonstrates time-correlated single photon counting data (TCSPC) of CsPbBr$_3$ QD film.

We studied the excited-state dynamics of QDs by the time-correlated single photon counting (TCSPC) technique. At pump fluences below the ASE threshold (8.5 µJ/cm$^2$, FIG. 15), typical PL lifetime of 11 ns was observed. Well above the ASE threshold (220 µJ/cm$^2$; FIG. 15), an ASE lifetime of approximately 2.8 ns was recorded, which further decreased to 1.9 ns with the increase in pump fluence. Such a fast decay with increasing pump fluence could be attributed to the dominant contribution from the non-radiative decay channel.

We further investigated the pumping of the passivated perovskite QDs with a non-linear 2PA scheme. Note that 2PA is a third-order non-linear optical phenomenon in which a molecule absorbs two photons simultaneously, resulting in an electronic transition from the ground state to an excited state via virtual states. 2PA pumping has several advantages over 1PA pumping, for instance, minimum risk of photodamage to the sample, longer penetration depth in the absorbing material and the absence of a phase-matching requirement for the generation and wavelength tuning of coherent light.[39] In addition to these advantages, deleterious effects of the excitation light such as unwanted scattering and absorption losses are completely suppressed in 2PA.

Figure 16:
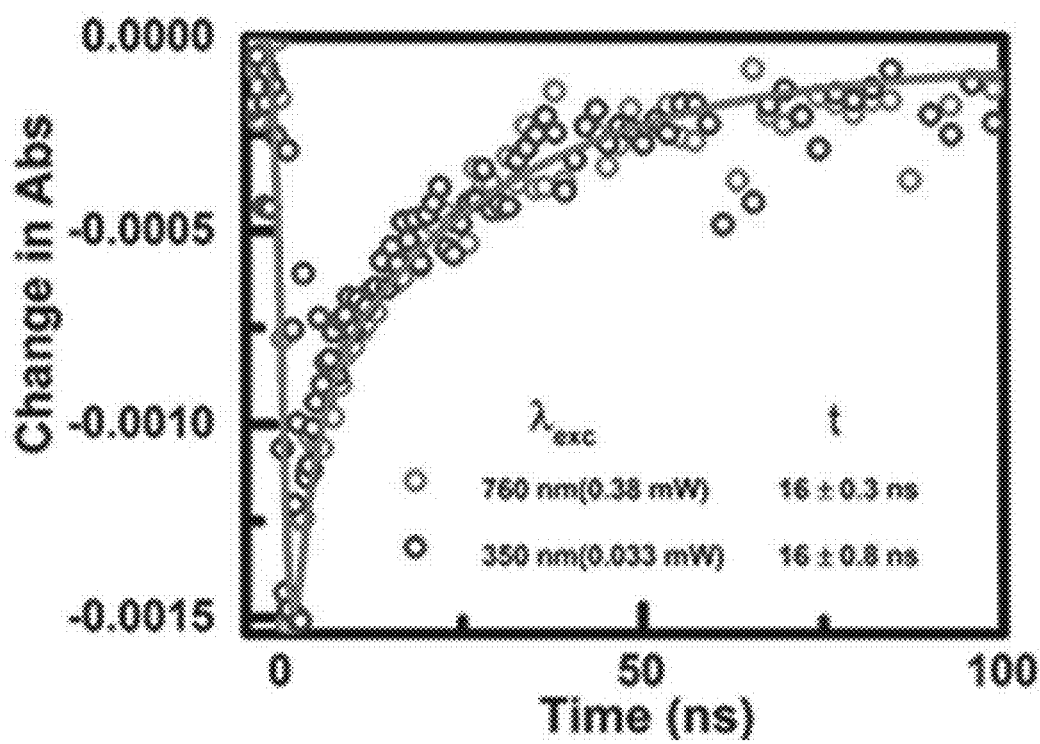
FIG. 16 shows the kinetics of nanosecond transient absorption spectroscopy of CsPbBr$_3$ QD film excited at 350 nm (blue dots) and 760 nm (dark yellow dots).

The ASE-induced in the perovskite QDs during optical pumping was achieved via 2PA at 800 nm. The following wavelength range highlights the distinct advantages offered by 2PA pumping for the perovskite QDs because high-powered laser sources are abundant within this range; moreover, the range is also an optical transparency window for water and biological media. It is worth noting that below and above the threshold fluence, the FWHM and peak position achieved through 2PA pumping are indistinguishable from those achieved by 1PA excitation; however, a decrease in the intensity of the ASE achieved by 2PA was observed. Femtosecond transient absorption with broadband capabilities shows that the dynamics of 2PA-induced ground-state bleaching were similar to those of 1PA, and the recovery time fits a single exponential function with a characteristic time constant of ~20 ns (FIG. 16).

Figure 12B:
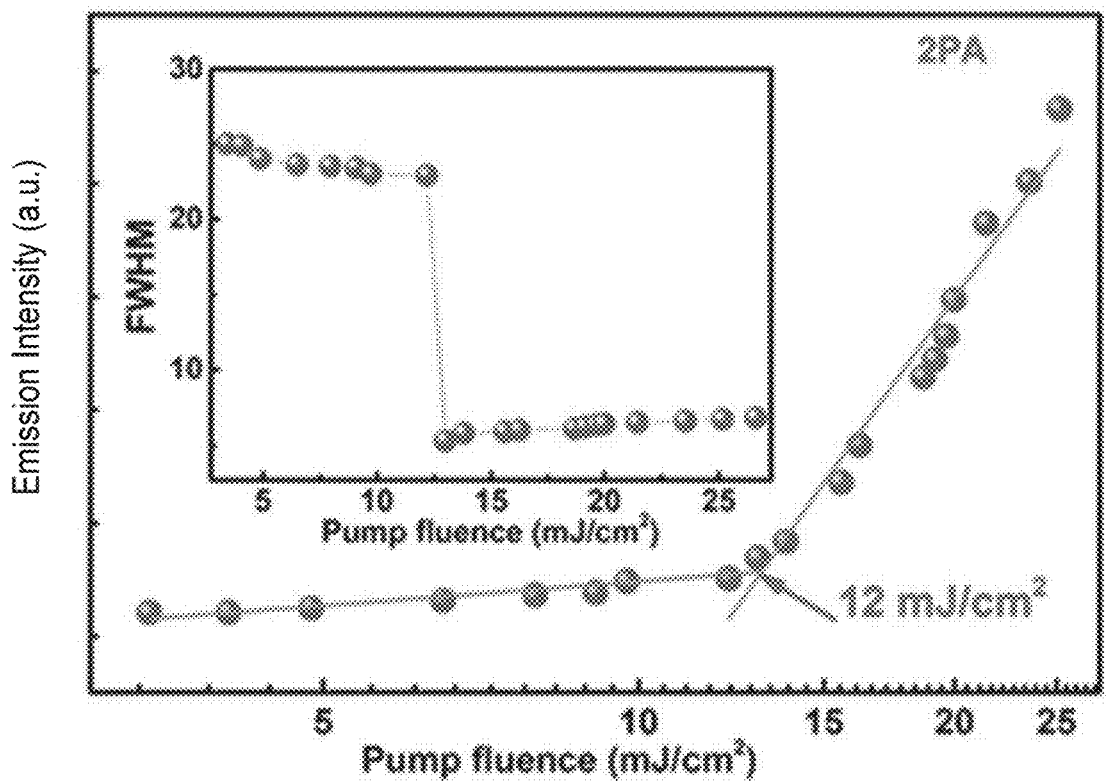

Although the excited-state dynamics were observed to be identical, 1PA and 2PA ASE showed markedly different thresholds. For two-photon excitation, the ASE threshold fluence was 12 mJ/cm$^2$ (FIG. 12B), which is comparable to that reported for 2PA ASE in other semiconductor QDs.[40] Nevertheless, the stability of our passivated perovskite QDs under the applied operating conditions largely surpasses (photostability unchanged after 1.2×10$^8$ laser shots) all previously reported levels for ASE in QDs, regardless of whether 1PA or 2PA induced that emission. Although few reports on the 2PA pumping of colloidal QDs exist[39, 41-43] ASE from 2PA pumping in the perovskite family of materials has not been reported prior to this work.

In summary, a passivation strategy for lead halide perovskite QDs was developed to alleviate the inherent instability of the material when operating under ambient conditions currently is the greatest challenge impeding the development of perovskite-based devices. Our passivation strategy is endowed perovskite QDs with unprecedented stability in the air (60±5% humidity) and under high laser fluences, with samples showing no noticeable degradation. An analytical investigation of the passivated perovskite QDs revealed the formation of a protective layer enriched with sulfide ($S^{2-}$-$DDA^+$). Because of the ultra-high stability of the resulting QDs, we were able to induce ultra-stable ASE in solution-processed QD films not only by 1PA but also by a 2PA process. ASE in the latter is a phenomenon that has yet to be observed in any perovskite material. Additionally, our perovskite QD films showed significant photo-stability under continuous pulsed laser excitation in ambient conditions for at least 34 hours (corresponds to 1.2×10$^8$ laser shots), substantially exceeding the stability of other colloidal QD systems in which ASE has been observed. The described QD passivation strategy and multiphoton-induced processes enable the practical implementation of perovskite QDs and facilitate the exploration of both their linear and non-linear applications. We believe that this surface passivation mechanism and the validity of the 2PA process will open new avenues of study and hold promise for overcoming the greatest problem precluding the development of perovskite-based materials for solar cell and non-linear applications.

EXPERIMENTAL SECTION

Synthesis 1-butanol (BuOH, HPLC grade), was purchased from Fisher Scientific. Oleic acid (OA, technical grade 90%), lead bromide (PbBr$_2$, 98%) and octane (98%) were purchased from Alpha Aesar. Sodium sulfide hydrate, cesium carbonate (Cs$_2$CO$_3$, 99.995%, metal basis), di-dodecyl dimethyl ammonium bromide (DDAB, 98%), oleylamine (OLA, technical grade 70%), and 1-octadecene (ODE, technical grade 90%) were purchased from Sigma-Aldrich. Toluene (HPLC grade) was purchased from Honeywell Burdick & Jackson. All chemicals were used as procured without further purification.

Preparation of Cs-Oleate

Cs$_2$CO$_3$ (0.814 g) along with ODE (40 mL) and OA (2.5 mL) were loaded into a 100 mL two-neck flask, dried for 1 h at 120° C., and then heated under N2 at 150 QC until all Cs2CO3 had reacted with OA. The solution was maintained at 150 QC before injection to prevent the solidification of Cs-oleate.

Preparation of S Precursor ($S^{2-}$-$DDA^+$)

Similarly to Jiang's method,[35] 3 mL of toluene containing 0.15 m mol of DDAB was mixed with 3 mL of 50 mM aqueous Na$_2$S solution. The $S^{2-}$ anions were then transferred from the aqueous phase to the toluene phase. The toluene phase was separated and used as a sulfur precursor (DDA-$S^{2-}$) in subsequent experiments.

Synthesis of CsPbBr$_3$ QDs

CsPbBr$_3$ quantum dots (QDs) were synthesized via a modified hot-injection method. ODE (125 mL), OLA (12.5 mL), OA (12.5 mL) and PbBr2 (1.725 g) were loaded into a 500 mL two-neck round-bottom flask and dried under vacuum for 1 h at 120° C. After the PbBr2 salt had completely dissolved, the temperature was raised to 180° C. under N2 gas. 10 mL Cs-oleate solution (0.814 g Cs2CO3, 40 ml ODE and 2.5 ml OA were loaded into a 100 mL two-neck flask, dried under vacuum for 1 h at 120° C., and then heated under N2 at 150° C. The solution was maintained at 150° C. before injection to prevent the solidification) was quickly injected; an ice-water bath was then used to cool the reaction mixture after 5 seconds. The crude solution was purified by selective centrifugation as shown in FIG. 1, yielded three samples with average sizes of ~8.2 nm, 9.2 nm and ~10.6 nm, respectively (referred to as samples 1, 2 and 3). To investigate the quantum size effect, we measured the photoluminescence spectra of the synthesized samples. Clear spectral red shifts of 9 nm and 16 nm were observed in the PL position of samples 2 and 3 relative to the spectrum of sample 1, which is consistent with quantum confinement (FIGS. 2A-2F).

Selected Purification of CsPbBr$_3$ QDs

The crude solution was cooled in a water bath and directly transferred to centrifuge tubes. After centrifuging the tubes at 7000 rpm for 15 min, the supernatant and precipitate were collected separately. The supernatant was mixed with BuOH for centrifugation, and the bottom sample was then collected and re-dissolved in toluene (sample 1). The precipitate was dispersed by adding toluene to collect the new supernatant (sample 2) after centrifugation and re-disperse the new precipitate in toluene (sample 3).

Treatment of CsPbBr$_3$ QDs and Preparation of CsPbB$_{r3}$ QDs Films

To 1 mL of the different CsPbBr$_3$ QDs (15 mg/mL), 50 µL of OA was added under stirring. A certain amount of sulfur precursor was then added sequentially. The sample was precipitated with twice the amount of BuOH and re-dissolved in 200 µL of octane. Thin films of CsPbBr$_3$ QDs were obtained by spin-coating the treated CsPbBr$_3$ QD solution under ambient conditions onto glass substrates. Moreover, the untreated sample was washed with BuOH alone and re-dissolved in octane to fabricate the thin films. The glass substrates were cleaned by standard procedure with detergent, de-ionized water, acetone, and isopropanol. The cleaned substrates were treated with plasma for 5 min before depositing the QD films. Highly smooth, densely packed and pinhole-free thin films were obtained by spin-coating at 500 rpm (10 sec) and then at 1500 rpm (40 sec).

Characterization

UV-vis absorption spectra were obtained using an absorption spectrophotometer from Ocean Optics. Carbon, hydrogen, oxygen, and sulfur analysis was performed using a Flash 2000 elemental analyzer (Thermo Fischer Scientific). Photoluminescence was tested using an FLS920 dedicated fluorescence spectrometer from Edinburgh Instruments. Quantum yield was measured using an Edinburgh Instruments integrating sphere with an FLS920-s fluorescence spectrometer. FTIR was performed using a Nicolet 6700 FT-IR spectrometer. Powder X-ray diffraction (XRD) patterns were recorded using Siemens diffractometer with Cu Kα radiation ($\lambda$=1.54178 Å). TEM analysis was carried out with a Titan™ TEM (FEI Company) operating at a beam energy of 300 keV and equipped with a Tridiem™ post-column energy filter (Gatan, IQD.). The samples were imaged in energy-filtered TEM (EFTEM) mode with a 20 eV energy slit inserted around the zero-energy-loss electrons to acquire high-resolution TEM (HRTEM) micrographs. The spatial distribution of the elements Pb and S was determined and acquired using the EFTEM technique by selecting the Pb 0-edge (86 eV) and S L-edge (165 eV) in the three-window mapping method. Morphological investigations and cross-sectional imaging of the QD films were carried out on a Karl Zeiss FESEM.

Experimental Details of Optical Pumping, Single Photon Counting and Transient Absorption All ASE pumping experiments were conducted at room temperature. The 1PA pumping experiments were performed using a femtosecond laser system operated at a wavelength 800 nm with 35 fs pulses and a repetition rate of 1 kHz. UV pump pulses at 400 nm were obtained in a straightforward manner by the second harmonic (frequency doubled) of the fundamental beam, where 100 μJ of the laser output was focused in a 100 μm BBO nonlinear crystal. The 2PA pumping experiments were carried out by directly using the fundamental beam at 800 nm.

Time-correlated single photon counting (TCSPC) for lifetime measurements was performed using a Halcyone MC multichannel fluorescence up-conversion spectrometer (Ultrafast Systems) at an excitation wavelength of 400 nm. Nanosecond transient absorption experiments were conducted using an EOS setup (Ultrafast Systems). Detailed information regarding the experimental setup has been published elsewhere.[44-45]

REFERENCES FOR EXAMPLE 1

1. Kojima, A.; Teshima, K.; Shirai, Y.; Miyasaka, T. Organometal Halide Perovskites as Visible-Light Sensitizers for Photovoltaic Cells. *J. Am. Chem. Soc.* 2009, 131 (17), 6050-6051.
2. Lee, M. M.; Teuscher, J.; Miyasaka, T.; Murakami, T. N.; Snaith, H. J. Efficient Hybrid Solar Cells Based on Meso-Superstructured Organometal Halide Perovskites. *Science* 2012, 338 (6107), 643-647.
3. Cai, B.; Xing, Y.; Yang, Z.; Zhang, W.-H.; Qiu, J. High performance hybrid solar cells sensitized by organolead halide perovskites. *Energy Environ. Sci.* 2013, 6 (5), 1480-1485.
4. Luo, J.; Im, J.-H.; Mayer, M. T.; Schreier, M.; Nazeeruddin, M. K.; Park, N.-G.; Tilley, S. D.; Fan, H. J.; Gratzel, M. Water photolysis at 12.3% efficiency via perovskite photovoltaics and Earth-abundant catalysts. *Science* 2014, 345 (6204), 1593-1596.
5. Zhou, H.; Chen, Q.; Li, G.; Luo, S.; Song, T.-b.; Duan, H.-S.; Hong, Z.; You, J.; Liu, Y.; Yang, Y. Interface engineering of highly efficient perovskite solar cells. *Science* 2014, 345 (6196), 542-546.
6. Jeon, N. J.; Noh, J. H.; Yang, W. S.; Kim, Y. C.; Ryu, S.; Seo, J.; Seok, S. I. Compositional engineering of perovskite materials for high-performance solar cells. *Nature* 2015, 517 (7535), 476-480.
7. Xing, G.; Mathews, N.; Lim, S. S.; Yantara, N.; Liu, X.; Sabba, D.; Gratzel, M.; Mhaisalkar, S.; Sum, T. C. Low-temperature solution-processed wavelength-tunable perovskites for lasing. *Nat. Mater.* 2014, 13 (5), 476-480.
8. Deschler, F.; Price, M.; Pathak, S.; Klintberg, L. E.; Jarausch, D.-D.; Higler, R.; Hüttner, S.; Leijtens, T.; Stranks, S. D.; Snaith, H. J.; Atatüre, M.; Phillips, R. T.; Friend, R. H. High Photoluminescence Efficiency and Optically Pumped Lasing in Solution-Processed Mixed Halide Perovskite Semiconductors. *J. Phys. Chem. Lett.* 2014, 5(8), 1421-1426.
9. Sutherland, B. R.; Hoogland, S.; Adachi, M. M.; Wong, C. T. O.; Sargent, E. H. Conformal Organohalide Perovskites Enable Lasing on Spherical Resonators. *ACS Nano* 2014, 8 (10), 10947-10952.
10. Zhu, H.; Fu, Y.; Meng, F.; Wu, X.; Gong, Z.; Ding, Q.; Gustafsson, M. V.; Trinh, M. T.; Jin, S.; Zhu, X. Y. Lead halide perovskite nanowire lasers with low lasing thresholds and high quality factors. *Nat. Mater.* 2015, 14 (6), 636-642.
11. Dohner, E. R.; Jaffe, A.; Bradshaw, L. R.; Karunadasa, H. I. Intrinsic White-Light Emission from Layered Hybrid Perovskites. *J. Am. Chem. Soc.* 2014, 136 (38), 13154-13157.
12. Tan, Z.-K.; Moghaddam, R. S.; Lai, M. L.; Docampo, P.; Higler, R.; Deschler, F.; Price, M.; Sadhanala, A.; Pazos, L. M.; Credgington, D.; Hanusch, F.; Bein, T.; Snaith, H. J.; Friend, R. H. Bright light-emitting diodes based on organometal halide perovskite. *Nat. Nano.* 2014, 9 (9), 687-692.
13. Kim, Y.-H.; Cho, H.; Heo, J. H.; Kim, T.-S.; Myoung, N.; Lee, C.-L.; Im, S. H.; Lee, T.-W. Multicolored Organic/Inorganic Hybrid Perovskite Light-Emitting Diodes. *Adv. Mater.* 2015, 27 (7), 1248-1254.
14. Li, G.; Tan, Z.-K.; Di, D.; Lai, M. L.; Jiang, L.; Lim, J. H.-W.; Friend, R. H.; Greenham, N. C. Efficient Light-Emitting Diodes Based on Nanocrystalline Perovskite in a Dielectric Polymer Matrix. *Nano Lett.* 2015, 15 (4), 2640-2644.
15. Dou, L.; Yang, Y.; You, J.; Hong, Z.; Chang, W.-H.; Li, G.; Yang, Y. Solution-processed hybrid perovskite photodetectors with high detectivity. *Nat. Commun.* 2014, 5.
16. Zhuo, S.; Zhang, J.; Shi, Y.; Huang, Y.; Zhang, B. Self-Template-Directed Synthesis of Porous Perovskite Nanowires at Room Temperature for High-Performance Visible-Light Photodetectors. *Angew. Chem. Int. Ed.* 2015, 54 (19), 5693-5696.
17. Sutherland, B. R.; Johnston, A. K.; Ip, A. H.; Xu, J.; Adinolfi, V.; Kanjanaboos, P.; Sargent, E. H. Sensitive, Fast, and Stable Perovskite Photodetectors Exploiting Interface Engineering. *ACS Photonics* 2015, 2 (8), 1117-1123.
18. Zhang, W.; Saliba, M.; Moore, D. T.; Pathak, S. K.; Horantner, M. T.; Stergiopoulos, T.; Stranks, S. D.; Eperon, G. E.; Alexander-Webber, J. A.; Abate, A.; Sadhanala, A.; Yao, S.; Chen, Y.; Friend, R. H.; Estroff, L. A.; Wiesner, U.; Snaith, H. J. Ultrasmooth organic-inorganic perovskite thin-film formation and crystallization for efficient planar heterojunction solar cells. *Nat. Commun.* 2015, 6.
19. Shi, D.; Adinolfi, V.; Comin, R.; Yuan, M.; Alarousu, E.; Buin, A.; Chen, Y.; Hoogland, S.; Rothenberger, A.; Katsiev, K.; Losovyj, Y.; Zhang, X.; Dowben, P. A.; Mohammed, O. F.; Sargent, E. H.; Bakr, O. M. Low trap-state density and long carrier diffusion in organolead trihalide perovskite single crystals. *Science* 2015, 347 (6221), 519-522.
20. Saidaminov, M. I.; Abdelhady, A. L.; Murali, B.; Alarousu, E.; Burlakov, V. M.; Peng, W.; Dursun, I.; Wang, L.; He, Y.; Maculan, G.; Goriely, A.; Wu, T.; Mohammed, O. F.; Bakr, O. M. High-quality bulk hybrid perovskite single crystals within minutes by inverse temperature crystallization. *Nat. Commun.* 2015, 6.
21. Zhang, D.; Eaton, S. W.; Yu, Y.; Dou, L.; Yang, P. Solution-Phase Synthesis of Cesium Lead Halide Perovskite Nanowires. *J. Am. Chem. Soc.* 2015, 137 (29), 9230-9233.
22. Fu, A.; Yang, P. Organic-inorganic perovskites: Lower threshold for nanowire lasers. *Nat. Mater.* 2015, 14 (6), 557-558.
23. Zhang, F.; Zhong, H.; Chen, C.; Wu, X.-g.; Hu, X.; Huang, H.; Han, J.; Zou, B.; Dong, Y. Brightly Luminescent and Color-Tunable Colloidal $CH_3NH_3PbX_3$ (X=Br, I, Cl) Quantum Dots: Potential Alternatives for Display Technology. *ACS Nano* 2015, 9 (4), 4533-4542.
24. Park, Y.-S.; Guo, S.; Makarov, N. S.; Klimov, V. I. Room Temperature Single-Photon Emission from Individual Perovskite Quantum Dots. *ACS Nano* 2015.
25. Protesescu, L.; Yakunin, S.; Bodnarchuk, M. I.; Krieg, F.; Caputo, R.; Hendon, C. H.; Yang, R. X.; Walsh, A.; Kovalenko, M. V. Nanocrystals of Cesium Lead Halide Perovskites ($CsPbX_3$, X=Cl, Br, and I): Novel Optoelectronic Materials Showing Bright Emission with Wide Color Gamut. *Nano Lett.* 2015, 15 (6), 3692-3696.
26. Akkerman, Q. A.; D'Innocenzo, V.; Accornero, S.; Scarpellini, A.; Petrozza, A.; Prato, M.; Manna, L. Tuning the Optical Properties of Cesium Lead Halide Perovskite Nanocrystals by Anion Exchange Reactions. *J. Am. Chem. Soc.* 2015, 137 (32), 10276-10281.
27. Kulbak, M.; Cahen, D.; Hodes, G. How Important Is the Organic Part of Lead Halide Perovskite Photovoltaic Cells? Efficient $CsPbBr_3$ Cells. *J. Phys. Chem. Lett.* 2015, 6 (13), 2452-2456.
28. Leo, K. Perovskite photovoltaics: Signs of stability. *Nat. Nano.* 2015, 10 (7), 574-575.
29. Haske, W.; Chen, V. W.; Hales, J. M.; Dong, W.; Barlow, S.; Marder, S. R.; Perry, J. W. 65 nm feature sizes using visible wavelength 3-D multiphoton lithography. *Opt. Express* 2007, 15 (6), 3426-3436.
30. Zipfel, W. R.; Williams, R. M.; Webb, W. W. Nonlinear magic: multiphoton microscopy in the biosciences. *Nat. Biotech.* 2003, 21 (11), 1369-1377.
31. Chong, E. Z.; Watson, T. F.; Festy, F. Autocorrelation measurement of femtosecond laser pulses based on two-photon absorption in GaP photodiode. *Appl. Phys. Lett.* 2014, 105 (6).
32. Noel, N. K.; Abate, A.; Stranks, S. D.; Parrott, E. S.; Burlakov, V. M.; Goriely, A.; Snaith, H. J. Enhanced Photoluminescence and Solar Cell Performance via Lewis Base Passivation of Organic-Inorganic Lead Halide Perovskites. *ACS Nano* 2014, 8 (10), 9815-9821.
33. Kovalenko, M. V.; Bodnarchuk, M. I.; Talapin, D. V. Nanocrystal Superlattices with Thermally Degradable Hybrid Inorganic-Organic Capping Ligands. *J. Am. Chem. Soc.* 2010, 132 (43), 15124-15126.
34. Stranks, S. D.; Burlakov, V. M.; Leijtens, T.; Ball, J. M.; Goriely, A.; Snaith, H. J. Recombination Kinetics in Organic-Inorganic Perovskites: Excitons, Free Charge, and Subgap States. *Phys. Rev. Appl.* 2014, 2 (3), 034007.
35. Jiang, P.; Zhu, C.-N.; Zhu, D.-L.; Zhang, Z.-L.; Zhang, G.-J.; Pang, D.-W. A room-temperature method for coating a ZnS shell on semiconductor quantum dots. *J. Mater. Chem. C* 2015, 3 (5), 964-967.
36. Yakunin, S.; Protesescu, L.; Krieg, F.; Bodnarchuk, M. I.; Nedelcu, G.; Humer, M.; De Luca, G.; Fiebig, M.; Heiss, W.; Kovalenko, M. V. Low-threshold amplified spontaneous emission and lasing from colloidal nanocrystals of caesium lead halide perovskites. *Nat. Commun.* 2015, 6.
37. Priante, D.; Dursun, I.; Alias, M. S.; Shi, D.; Melnikov, V. A.; Ng, T. K.; Mohammed, O. F.; Bakr, O. M.; Ooi, B. S. The recombination mechanisms leading to amplified spontaneous emission at the true-green wavelength in $CH_3NH_3PbBr_3$ perovskites. *Appl. Phys. Lett.* 2015, 106 (8), 081902.
38. Guzelturk, B.; Kelestemur, Y.; Gungor, K.; Yeltik, A.; Akgul, M. Z.; Wang, Y.; Chen, R.; Dang, C.; Sun, H.; Demir, H. V. Upconversion Lasers: Stable and Low-Threshold Optical Gain in CdSe/CdS Quantum Dots: An All-Colloidal Frequency Up-Converted Laser (Adv. Mater. 17/2015). *Adv. Mater.* 2015, 27 (17), 2678-2678.
39. Xing, G.; Liao, Y.; Wu, X.; Chakrabortty, S.; Liu, X.; Yeow, E. K. L.; Chan, Y.; Sum, T. C. Ultralow-Threshold Two-Photon Pumped Amplified Spontaneous Emission and Lasing from Seeded CdSe/CdS Nanorod Heterostructures. *ACS Nano* 2012, 6 (12), 10835-10844.
40. Cooney, R. R.; Sewall, S. L.; Sagar, D. M.; Kambhampati, P. Gain Control in Semiconductor Quantum Dots via State-Resolved Optical Pumping. *Phys. Rev. Lett.* 2009, 102 (12), 127404.
41. Achtstein, A. W.; Ballester, A.; Movilla, J. L.; Hennig, J.; Climente, J. I.; Prudnikau, A.; Antanovich, A.; Scott, R.; Artemyev, M. V.; Planelles, J.; Woggon, U. One- and Two-Photon Absorption in CdS Nanodots and Wires: The Role of Dimensionality in the One- and Two-Photon Luminescence Excitation Spectrum. *J. Phys. Chem. C* 2015, 119 (2), 1260-1267.
42. Nyk, M.; Szeremeta, J.; Wawrzynczyk, D.; Samoc, M. Enhancement of Two-Photon Absorption Cross Section in CdSe Quantum Rods. *J. Phys. Chem. C* 2014, 118 (31), 17914-17921.
43. Allione, M.; Ballester, A.; Li, H.; Comin, A.; Movilla, J. L.; Climente, J. I.; Manna, L.; Moreels, I. Two-Photon-Induced Blue Shift of Core and Shell Optical Transitions in Colloidal CdSe/CdS Quasi-Type II Quantum Rods. *ACS Nano* 2013, 7 (3), 2443-2452.
44. Bose, R.; Ahmed, G. H.; Alarousu, E.; Parida, M. R.; Abdelhady, A. L.; Bakr, O. M.; Mohammed, O. F. Direct Femtosecond Observation of Charge Carrier Recombination in Ternary Semiconductor Nanocrystals: The Effect of Composition and Shelling. *J. Phys. Chem. C* 2015, 119 (6), 3439-3446.
45. Mohammed, O. F.; Xiao, D.; Batista, V. S.; Nibbering, E. T. J. Excited-State Intramolecular Hydrogen Transfer (ESIHT) of 1,8-Dihydroxy-9,10-anthraquinone (DHAQ) Characterized by Ultrafast Electronic and Vibrational Spectroscopy and Computational Modeling. *J. Phys. Chem. A* 2014, 118 (17), 3090-3099.

Example 2

We demonstrate ultra-air- and photostable $CsPbBr_3$ quantum dots (QDs) by using an inorganic-organic hybrid ion pair as the capping ligand. This passivation approach to perovskite QDs yields high photoluminescence quantum yield with unprecedented operational stability in ambient conditions (60±5% lab humidity) and high pump fluences, thus overcoming one of the greatest challenges impeding the development of perovskite-based applications. Due to the robustness of passivated perovskite QDs, we were able to induce ultrastable amplified spontaneous emission (ASE) in solution processed QD films not only through one photon but also through two-photon absorption processes. The latter has not been observed before in the family of perovskite materials. More importantly, passivated perovskite QD films showed remarkable photostability under continuous pulsed laser excitation in ambient conditions for at least 34 h (corresponds to $1.2\times10^8$ laser shots), substantially exceeding the stability of other colloidal QD systems in which ASE has been observed.

Lead trihalide perovskite materials with the formula APbX$_3$ (where A=Cs$^+$, CH$_3$NH$^{3+}$, or HC(NH$_2$)$^{2+}$; X=Br$^-$, I$^-$, and/or Cl$^-$) have recently emerged as promising materials for solution-processed optoelectronic applications such as photo-voltaics,[1-6] lasing,[7-10] light-emitting diodes,[11-14] and photo-detectors[15-17] because of their easily tunable optical bandgap as well as their attractive absorption, emission, and charge transport properties.[18] APbX$_3$ materials[19] with some, or all, of these characteristics, have been realized in various forms, including thin films,[20] single crystals,[21,22] nanowires,[23,24] and quantum dots.[25,26] Perovskite quantum dots (QDs) in particular, such as CsPbX$_3$, have ushered the advantages of perovskite materials into the realm of quantum confinement. The results are QDs with emission lines that exhibit narrow widths at half-maximum (fwhm) and remarkably high photo-luminescence quantum yields (PLQYs) (approximately ≥70%) and yet can be easily tuned over a very broad spectral window.[27-30]

Despite the impressive metrics of the entire family of lead trihalide perovskites,[31] however, poor stability, in particular with respect to temperature, moisture, and light exposure, remains a ubiquitous impediment for virtually all APbX$_3$ perovskite materials and devices.[32,33] The lack of stability has not only prevented the practical and commercial application of perovskite optoelectronics but has also constrained the exploration of their properties to highly sanitized conditions.[34] Under such a restrictive regime, nonlinear optical properties essential for lithography,[35] high-resolution optical microscopy,[36] and the characterization and generation of ultrafast optical signals[37] suffer the most. For the aforementioned reasons, surface passivation strategies of perovskite materials have been vigorously pursued (for example, Snaith et. al employed various organic Lewis bases such as thiophene and pyridine to passivate the surface of perovskite films to achieve high photovoltaic power conversion efficiency),[38] but to date, none have led to operational and long-term stability under ambient conditions and/or at high optical fluence.

Figure 22:
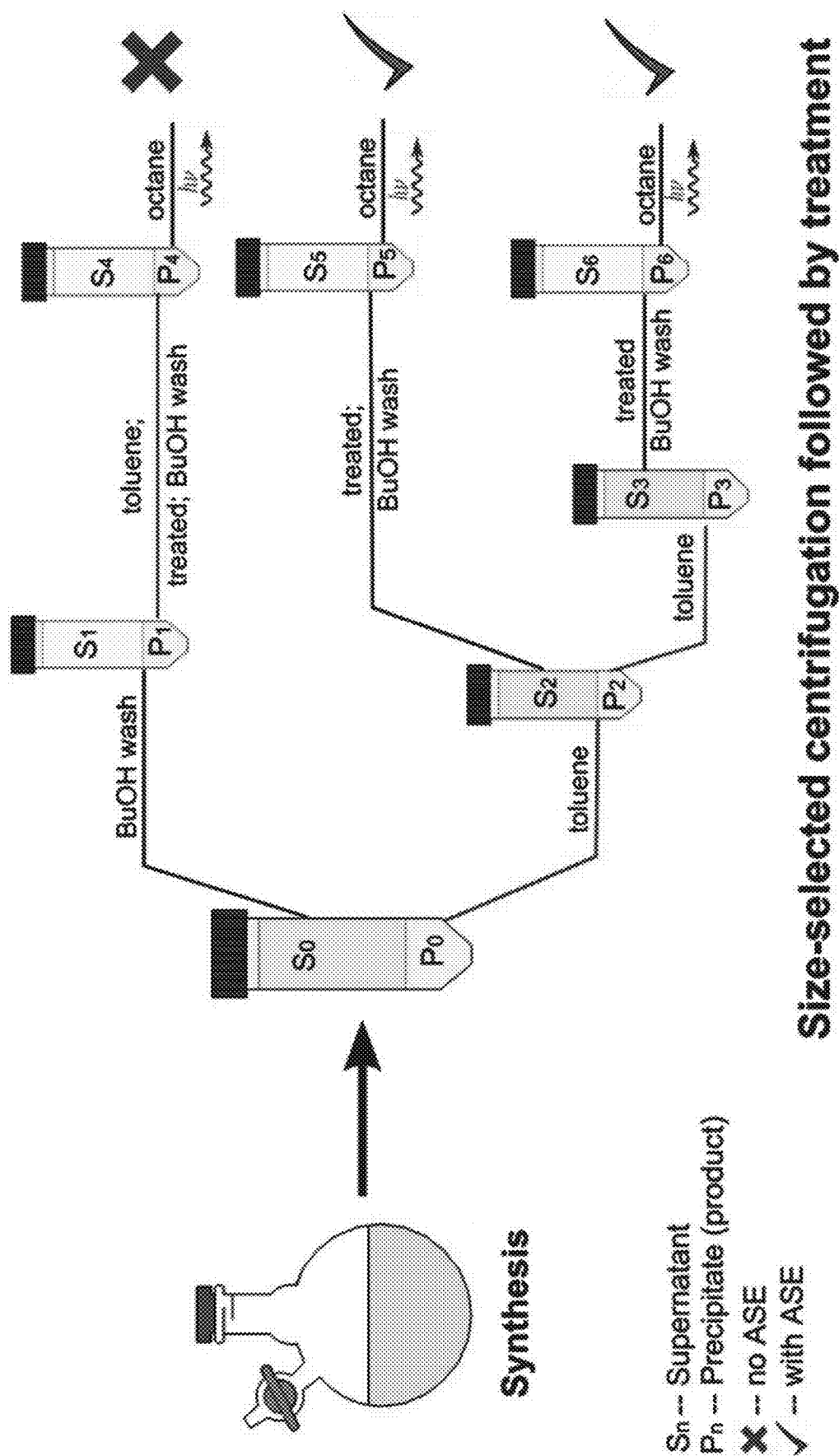
FIG. 22 is a scheme of size purification for ASE.
Figure 28:
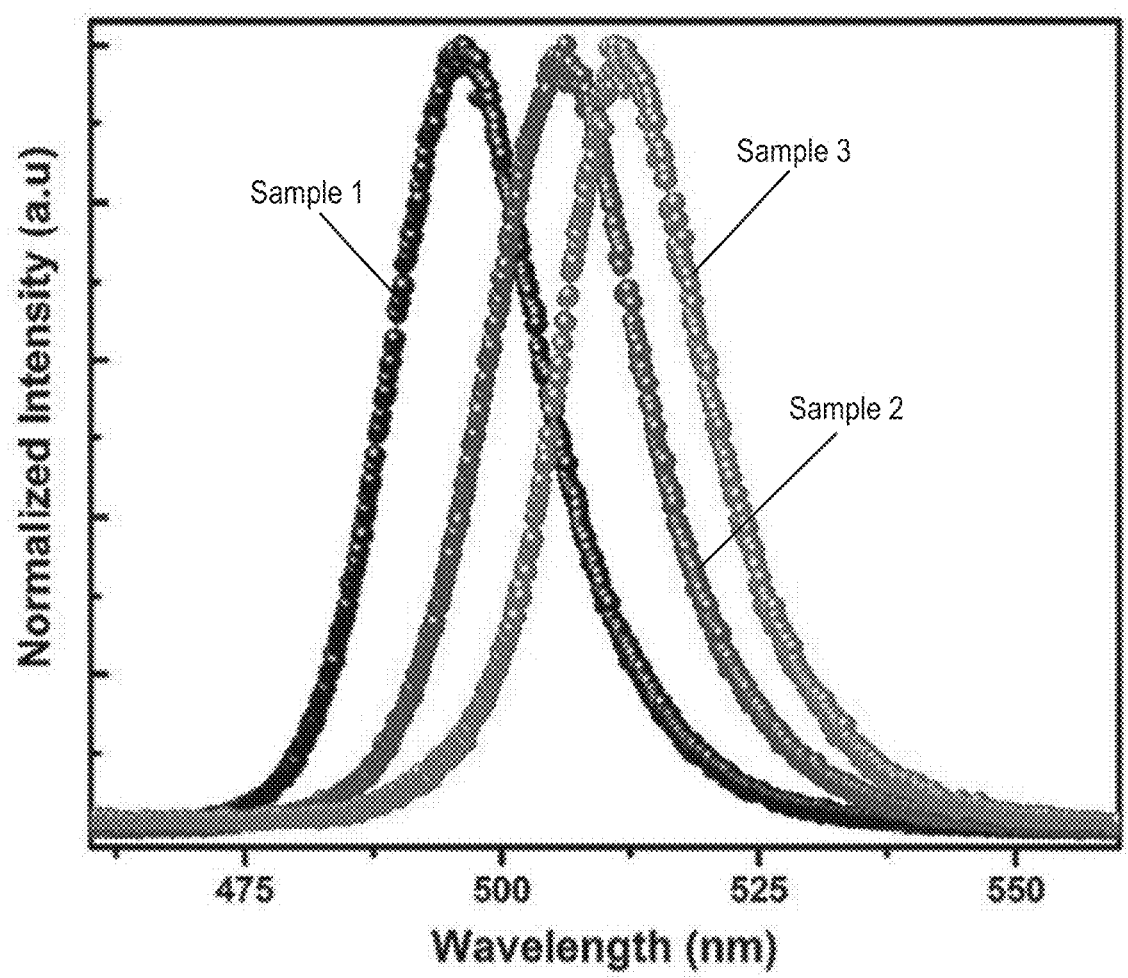
FIG. 28 shows normalized PL emission peaks of CsPbBr$_3$ QDs of various sizes.

Herein, this example discusses the development of ultra-air- and photostable perovskite QDs through a new passivation technique (FIG. 22) in which the surface of QDs is coated with an inorganic-organic hybrid ion pair.[39] This novel approach yields high PLQY with remarkably high operational stability in ambient conditions (60±5% lab humidity) and high pump fluences, thus overcoming one of the major challenges impeding the development of perovskite-based applications. By achieving such levels of robustness, we were able to induce with no signs of degradation amplified spontaneous emission (ASE) in solution-processed QD films not only through one photon (1PA) but also through two-photon absorption (2PA) processes. ASE with the latter in particular has not been previously reported before in the family of perovskite materials, and it demonstrates the potential of these materials for nonlinear optical applications. CsPbBr$_3$ quantum dots (QDs) were synthesized similarly to the modified hot-injection method previously reported by Protesescu et al.[27] As shown in FIG. 22, selective centrifugation of the crude solution yielded three samples of various QD sizes. Size distribution analysis revealed the presence of three different populations of QDs (referred to as samples 1, 2, and 3) with average sizes of ~8.2 nm, 9.2 nm, and ~10.6 nm, respectively (FIGS. 27A-27F). To investigate the quantum size effect, we measured the photoluminescence spectra of the synthesized samples. Clear red spectral shifts of 9 and 16 nm were observed in the PL position of samples 2 and 3, relative to the spectrum of sample 1, which is consistent with quantum confinement (FIG. 28). This observation is in line with recent reports on the same type of QDs.[26,27]

Figure 29A:
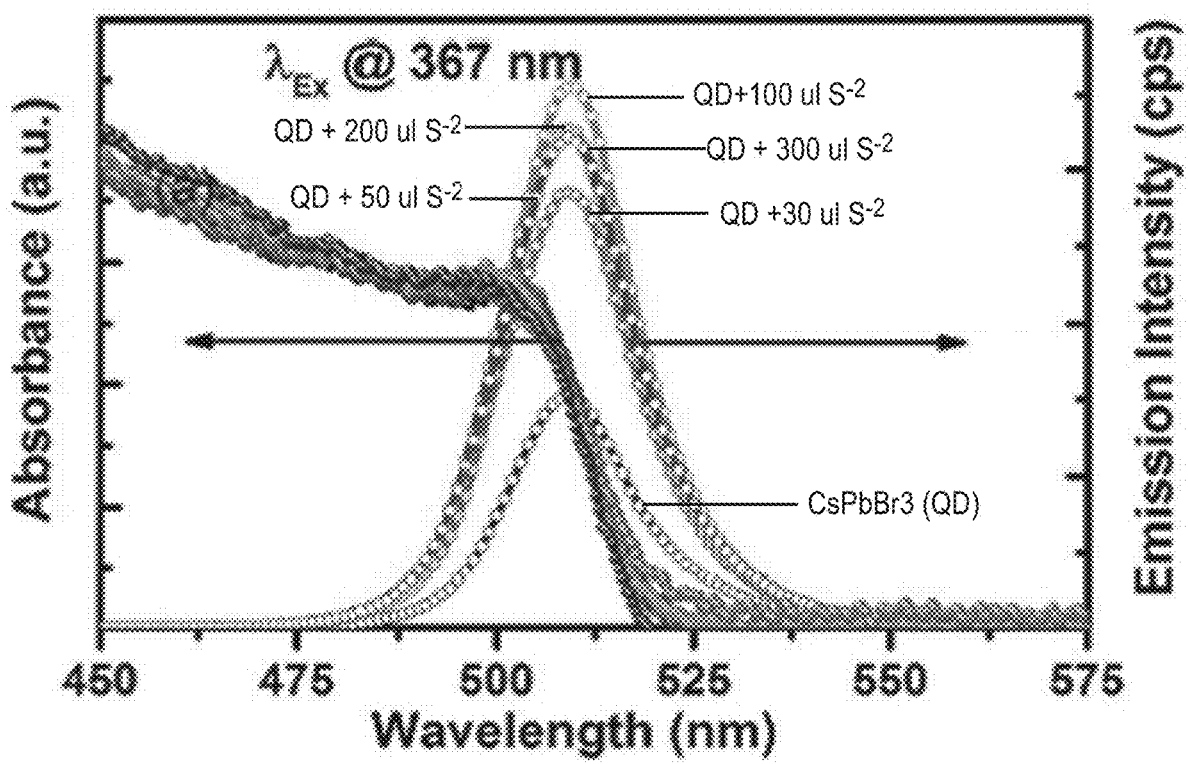
FIG. 29A shows absorption and emission spectra of the untreated QD sample and the treated QD with various amounts of sulfur; the beam width was fixed at 1 nm for the 367 nm excitation.
Figure 29B:
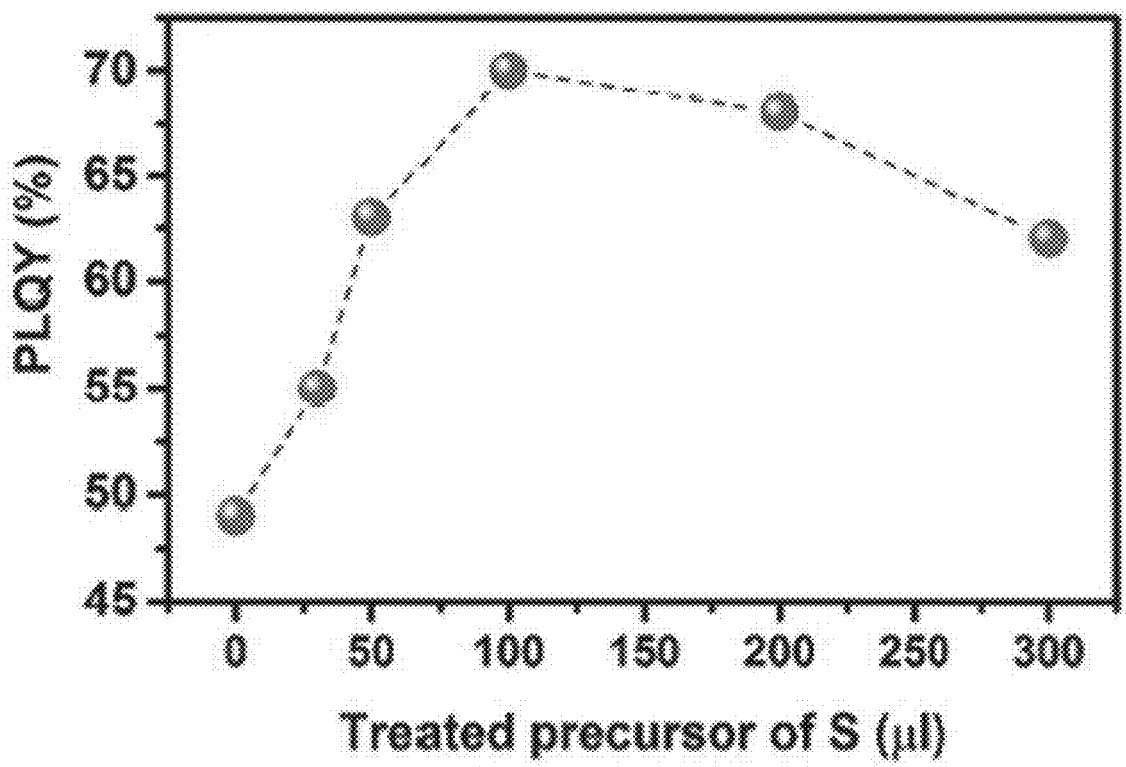
FIG. 29B is the corresponding PLQY.
Figure 30A:
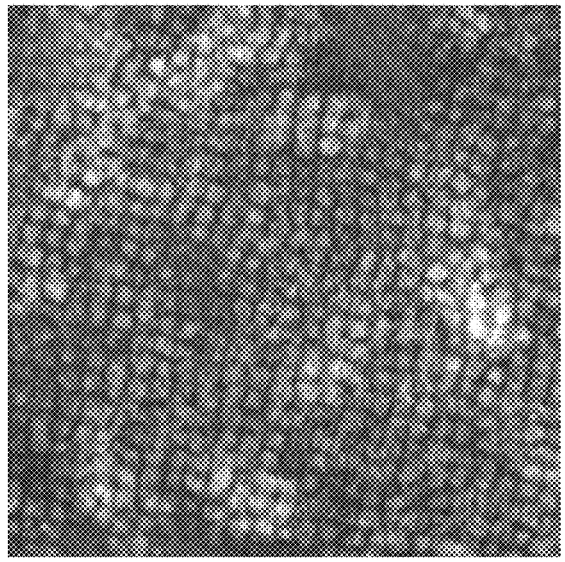
FIG. 30A shows the energy-filtered TEM RGB image of sulfur-treated CsPbBr$_3$ QD networks.
Figure 30B:
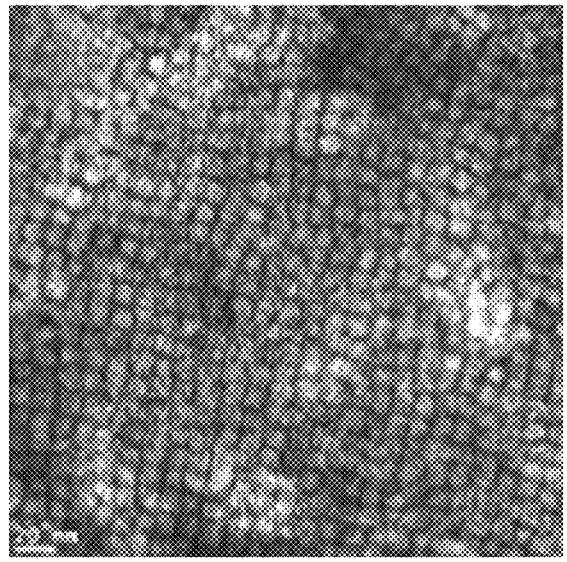
FIG. 30B is the EF-TEM image at the same location as panel 9A, with lead mapping.
Figure 30C:
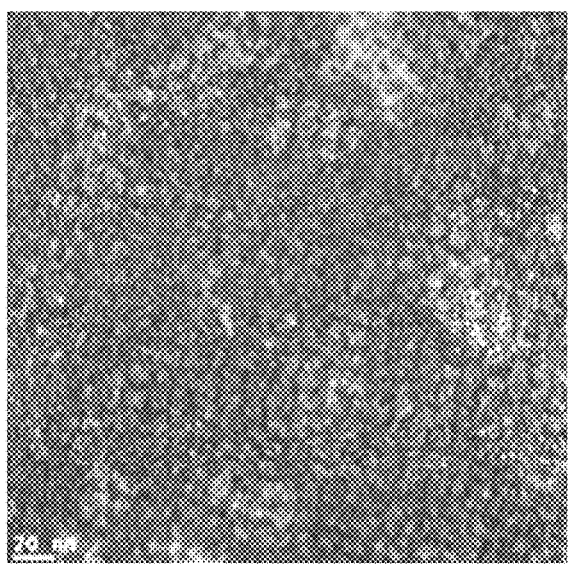
FIG. 30C shows EF-TEM mapping of sulfur.
Figure 30D:
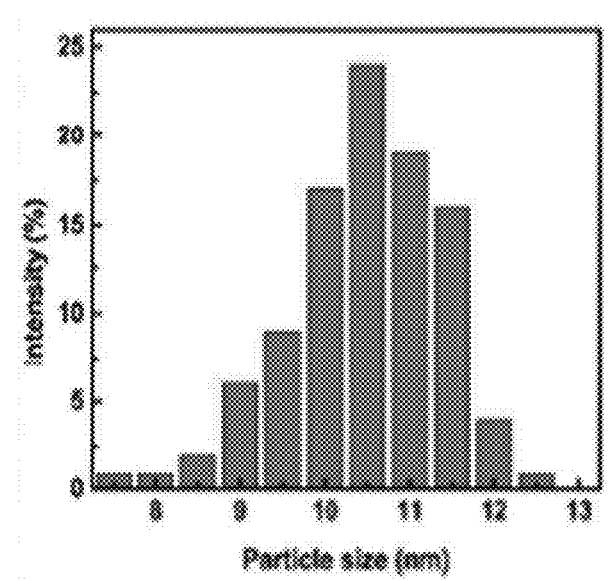
FIG. 30D shows the size distribution of QDs after treatment.

The passivation of surface defects in nanosized organometal halide perovskites can lead to a substantial increase in the photoluminescence quantum yield (PLQY) at room temperature;[40] however, the air and photostabilities of these materials remained elusive. The current study aimed to improve both the PLQY and stability by passivating the QDs, a prerequisite for using them in optoelectronic applications. Initially, we observed that the synthesized CsPbBr$_3$ QDs displayed a lower PLQY compared to previously reported values.[27] Moreover, the PLQY depended on the size of the QDs, reaching values of approximately 35%, 49%, and 49% for samples 1, 2 and 3, respectively. To overcome these critical issues, we introduced an inorganic-organic hybrid ion pair (didodecyl dimethylammonium sulfide, S$^{2-}$-DDA$^+$)[41] to passivate the QDs, didodecyl dimethylammonium bromide (DDAB) was used as a source of DDA$^+$ (see the Experimental Section in the sulfur precursor part) to passivate the perovskite CsPbBr$_3$ QDs. While inorganic-organic hybrid ion pairs, such as AsS$_3^{3-}$-DDA$^+$, were used to cap metal chalcogenide nanocrystal,[39] their implementation for perovskite materials has not been demonstrated. In this method, 50 µL of oleic acid (OA) was added to 1 mL of CsPbBr$_3$ QDs (15 mg/mL) under stirring, followed by the addition of a certain amount of sulfur precursor (see Experimental Section for details). The reaction product was subsequently precipitated with BuOH and redissolved in octane. We observed that the solution PLQY was enhanced from 49% to 70% upon the injection of 100 µL of sulfur precursor (FIG. 29B). Notably the original position of the emission peak of the CsPbBr$_3$ QDs remained almost unaltered upon the addition of the sulfur precursor, and only an enhancement was observed (FIG. 29A). To understand the nature and the composition of the surface passivation, we employed energy-filtered transmission electron microscopy (EFTEM) analysis, from which we observed that sulfur plays a role in passivation (FIG. 30A-30C). Also, CHNS elemental analysis further corroborated the existence of sulfur upon treatment (Table 1, example 2). Also, the molar ratio of N, C, and H in the treated sample is about 1:26:56, which is consistent with that of didodecyldimethylammonium ion (DDA$_+$), confirmed the formation of ion-pair ligand (S2$^-$-DDA$^+$).

TABLE 1 example 2. Elemental analysis results

| sample | Sample weight (mg) | N (%) | C (%) | H (%) | S (%) |
|---|---|---|---|---|---|
| CsPbBr$_3$ | 3.766 | 0.54 | 8.16 | 1.35 | 0 |
| Treated CsPbBr$_3$ | 5.262 | 0.30 | 6.26 | 1.11 | 0.20 |

Figure 23:
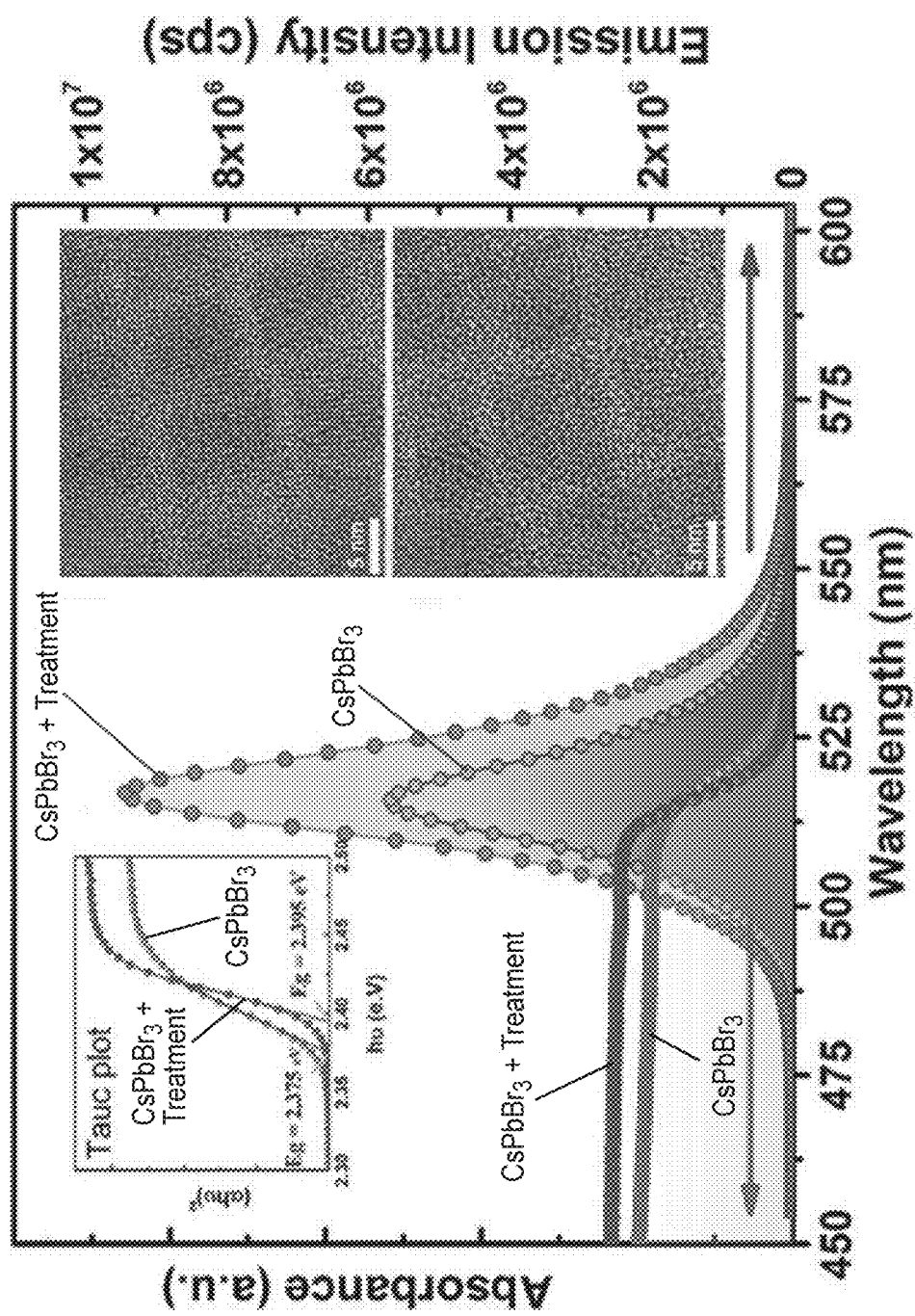
FIG. 23 displays absorption and PL spectra of CsPbBr$_3$ QD film before and after surface treatment. The top inset is a TEM image of treated QD. The bottom inset is a TEM image of untreated QD.
Figure 31:
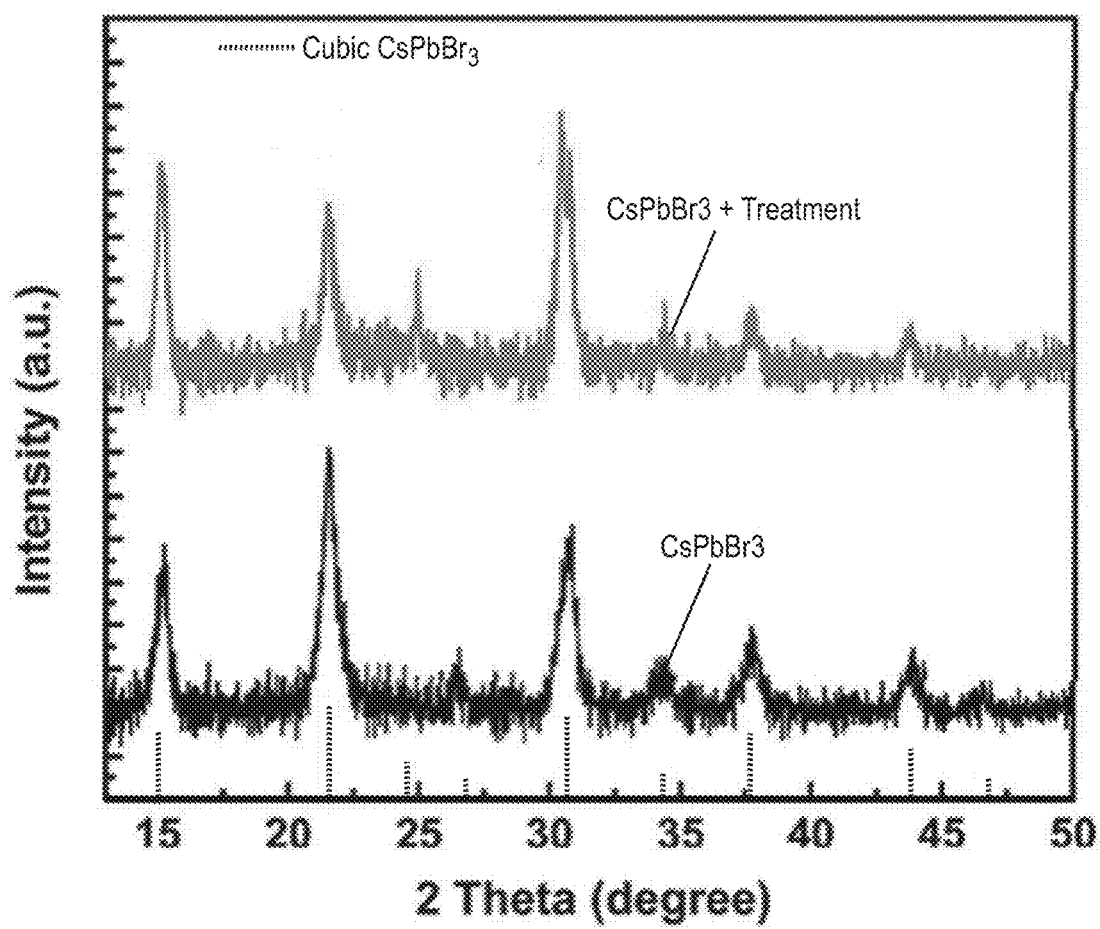
FIG. 31 shows XRD patterns of the untreated (bottom) and treated (top) samples.
Figure 32A:
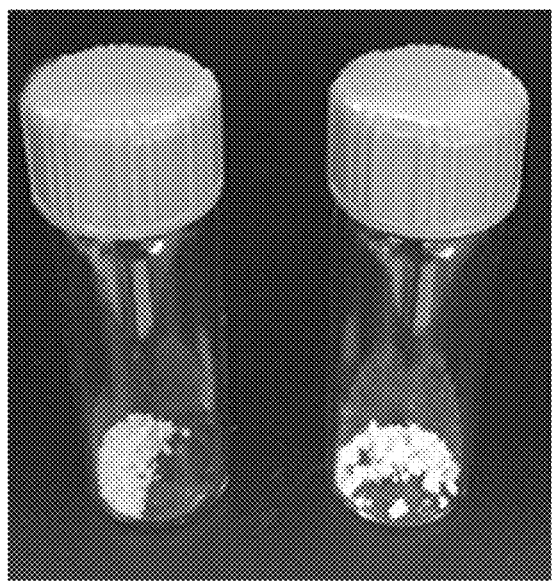
FIGS. 32A-32B are photographs of treated (left) and untreated sample (right) (32A) without and (32B) under UV light irradiation.
Figure 32B:
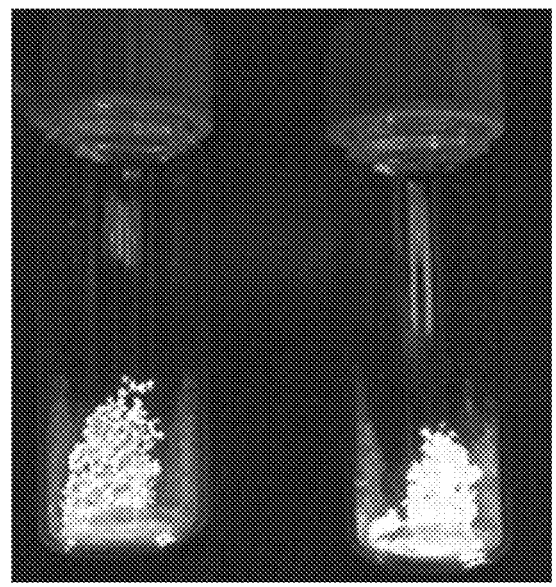

The untreated and treated samples were characterized by X-ray powder diffraction (XRD). The XRD patterns of both the samples were well indexed to the standard cubic CsPbBr$_3$ phase, with no observable secondary phases (FIG. 31). The instability and degradation of an untreated QD sample were also substantiated by X-ray fluorescence (XRF) analysis, as indicated by the 1:2:5 atomic ratios of Cs, Pb, and Br, respectively, a considerable deviation from the 1:1:3 ratio expected for perovskites (Table 2, example 2). Moreover, treated samples were noticeably brighter than the untreated samples under UV light, a clear indicator of the high luminescence obtained after passivation (FIGS. 32A-32B). For optical characterizations, the untreated and treated samples were spin-coated on a glass substrate to obtain a uniform thin film (see Experimental Section). FIG. 23 shows the absorption and photoluminescence (PL) spectra of the QD films before and after surface passivation. It should be noted that the PL signal is quite narrow in both cases, with an fwhm of 25 nm. Only a very slight change in the bandgap could be observed, as shown in the Tauc plot (FIG. 23, inset), suggesting that the particle size was essentially preserved even 153 after the surface treatment. In addition to the characterizations performed by electronic spectroscopy, vibrational spectroscopy was used to probe the specific chemical functionalities on the surface of the QDs. The C=O stretching vibration of OA was used as a specific marker mode to probe the ligand exchange process. In this experiment, the absence of the 1680 cm$^{-1}$ peak (C=O stretching) in the FTIR spectrum of the treated sample (FIG. 33) provided a clear indication of the replacement of the native oleate functional group by the hybrid ion pair.

TABLE 2

X-ray fluorescence (XRF) results of untreated sample

| Elem. | Line | Mass[%] | 3 sigma | Atomic[%] |
|---|---|---|---|---|
| 35 Br | K | 42.93 | 0.28 | 63.06 |
| 55 Cs | K | 14.54 | 0.42 | 12.84 |
| 82 Pb | L | 42.53 | 0.3 | 24.1 |

Figure 24A:
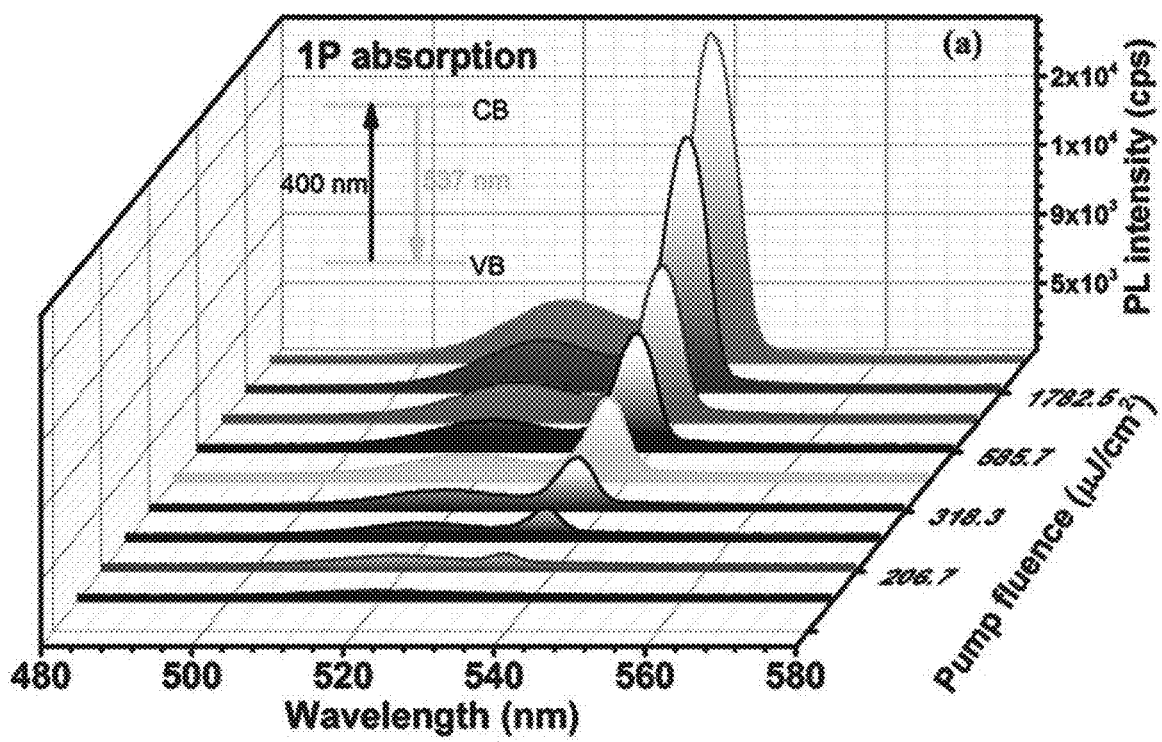
FIGS. 24A-24B illustrate the pump-fluence relationship determined for the treated CsPbBr$_3$ QD film in (24A) 1PA and (24B) 2PA.
Figure 24B:
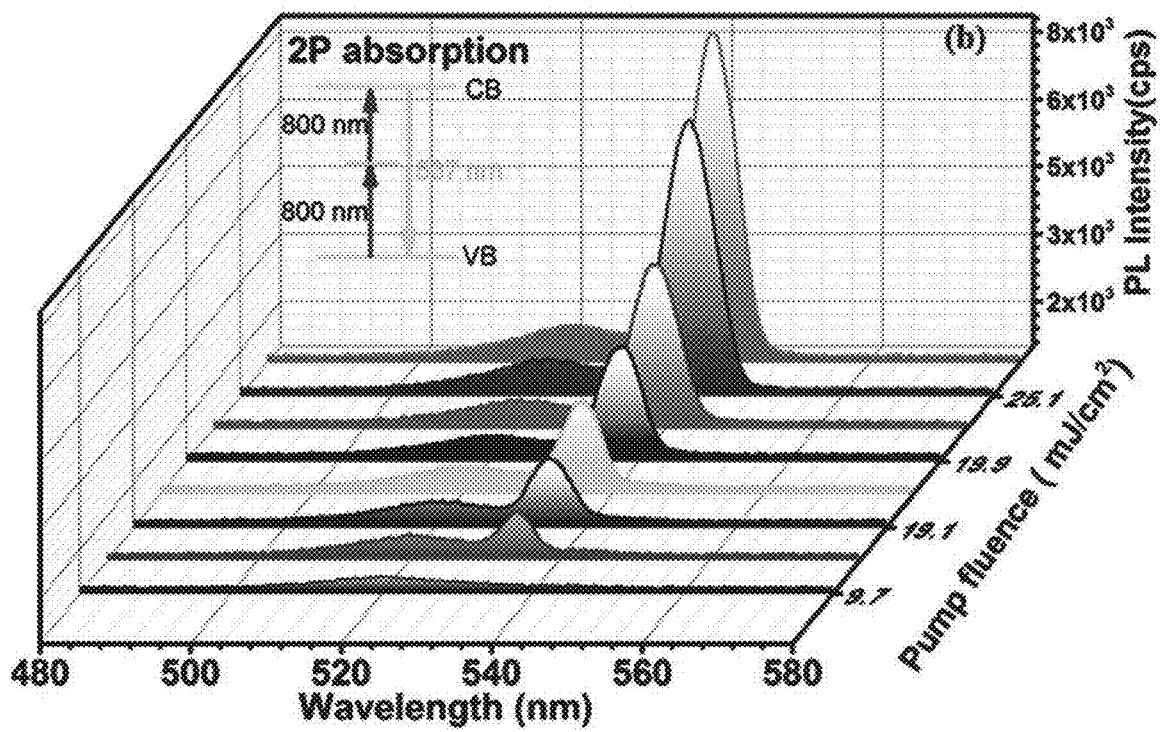
Figures 25A, 25B:
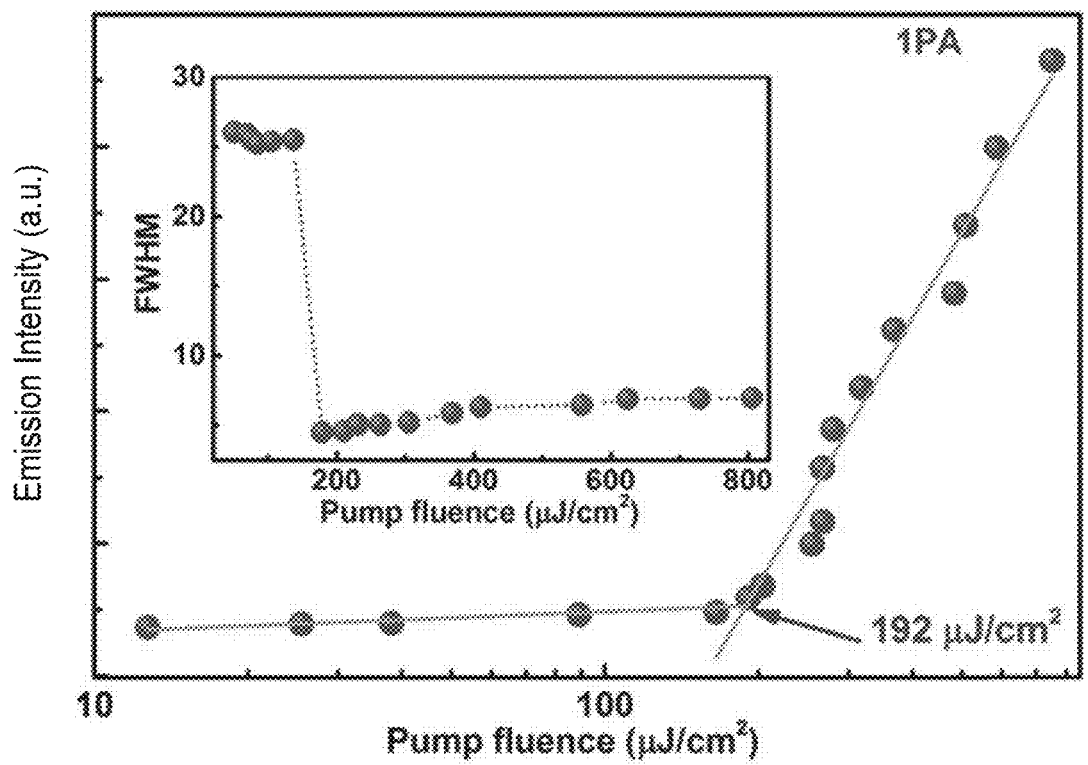
FIGS. 25A-25B illustrate the threshold behavior of the intensity of the ASE of the treated CsPbBr$_3$ QD film in (25A) 1PA and (25B) 2PA.
Figure 35A:
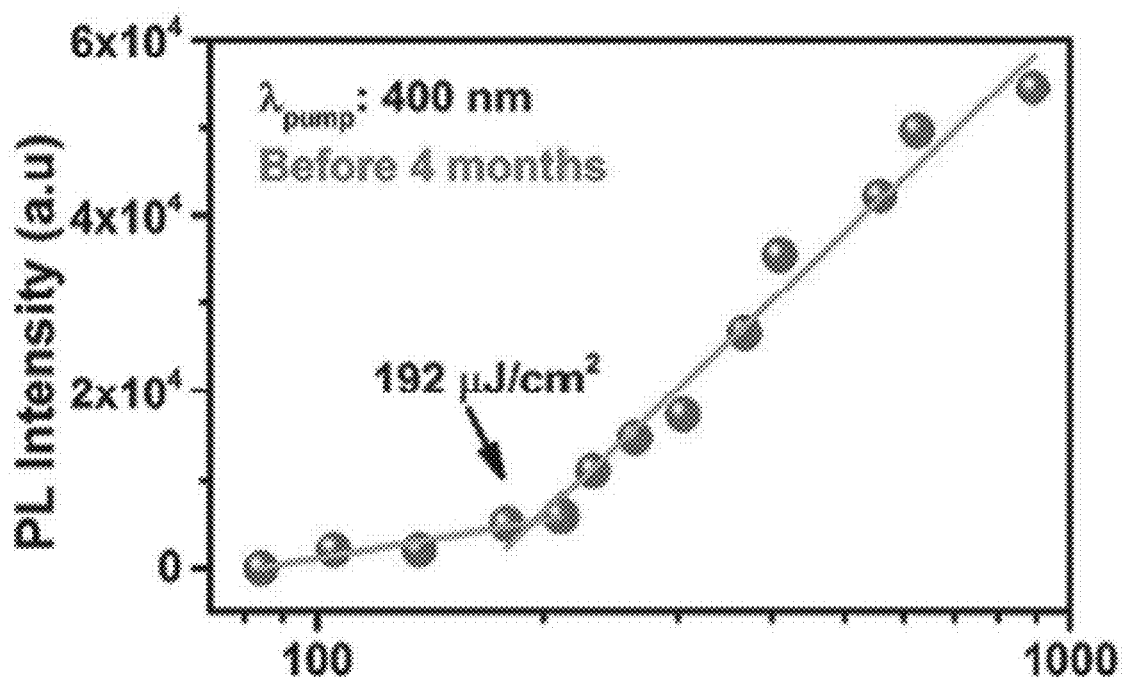
FIGS. 35A-35B illustrate threshold behavior of passivated CsPbBr$_3$ QDs film before and 4 months after passivation.
Figure 35B:
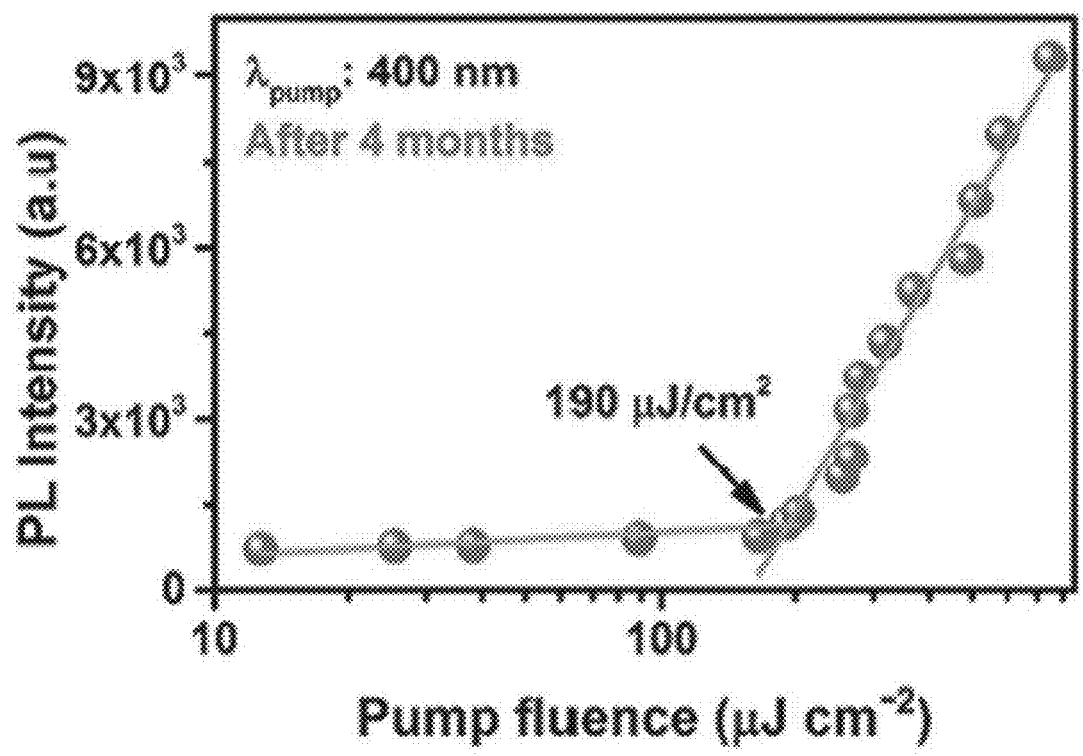

To confirm the air and photostability of the passivated CsPbBr$_3$ QDs films (thickness ~105 nm, FIG. 34A-34B), we tested their propensity for ASE through one- and two-photonpumping under ambient conditions (room temperature, 60±5% humidity). The results are shown in FIGS. 24A-24B. As can be seen, with an increase in the pump fluence, the ASE generated at 533 nm shifted to 537 nm, which is consistent with the results of a previous report.[42] The onset of stimulated emission in the QD films was observed with the immediate increase in the ASE intensity (ASE peak at ≈533 nm) and the narrowing of the emission spectrum (fwhm≈4-7 nm, FIG. 24A, inset) over the threshold pumping range. A red shift in the ASE peak (16-21 nm) relative to the PL peak was observed (FIG. 24A). As shown in FIG. 25A, the ASE threshold fluence for one-photon pumping was approximately 192 µJ/cm2, which is lower than the value reported for perovskite thin films[43] On the other hand, the threshold obtained for the QD film in the current study is higher than that recently reported for the same QDs,[42] probably due to differences in the configurations of the experimental setups. However, the air and photostabilities of our treated QDs are the best reported to date for semi-conductor QDs and even for perovskite thin films. It is worth noting that the untreated sample suffered from partial degradation within hours, showing a sharp contrast in performance, whereas the passivated QD film exhibited the same threshold and optical characteristics even after 4 months of open air storage and rounds of photostability testing (vide infra and also see FIGS. 35A-35B), providing clear evidence of the ultrastability of perovskite QD films under ambient conditions.

Figure 26A:
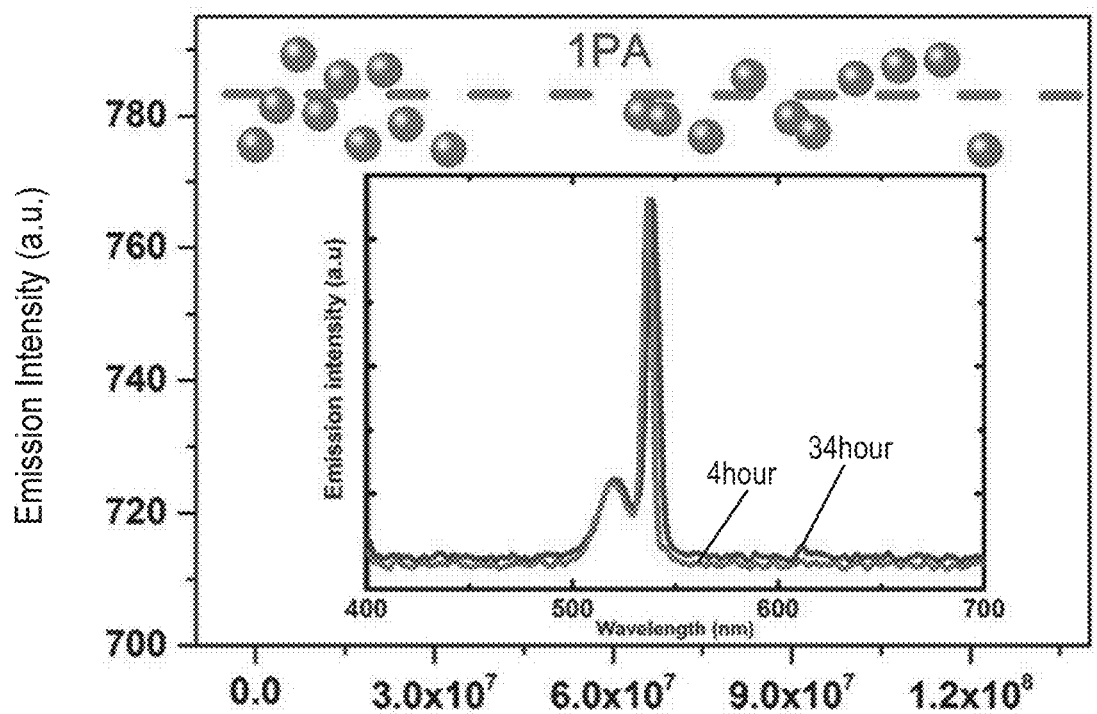
FIGS. 26A-26B show shot-dependent ASE intensity of the solution-processed CsPbBr$_3$ QDs film with approximately 1.2×10$^8$ laser excitation shots at (254 µJ/cm$^2$ pump fluence for 1PA, 18 mJ/cm$^2$ pump fluence for 2PA) performed at room temperature under ambient conditions.
Figure 26B:
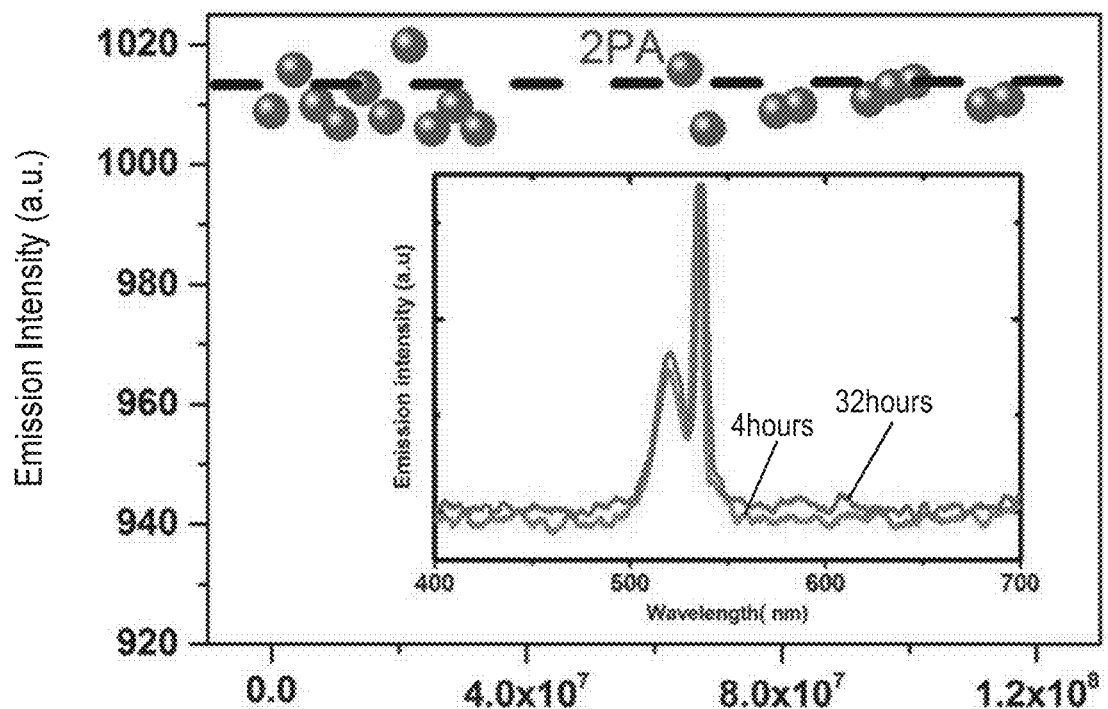

To test the photostability of our QDs films, we measured the variation in ASE intensity as a function of time under continuous femtosecond laser irradiation in ambient conditions, using a femtosecond laser system operated at a repetition rate of 1 kHz. Our results showed that there was almost no change in ASE intensity over 1.2×10$^8$ laser shots (corresponding to a period of 34 h) for either one- or two-photon pumping (FIGS. 26A-26B). This value substantially exceeds the photostability of other semiconductor QD systems for which ASE has been observed. 44,45

Figure 36:
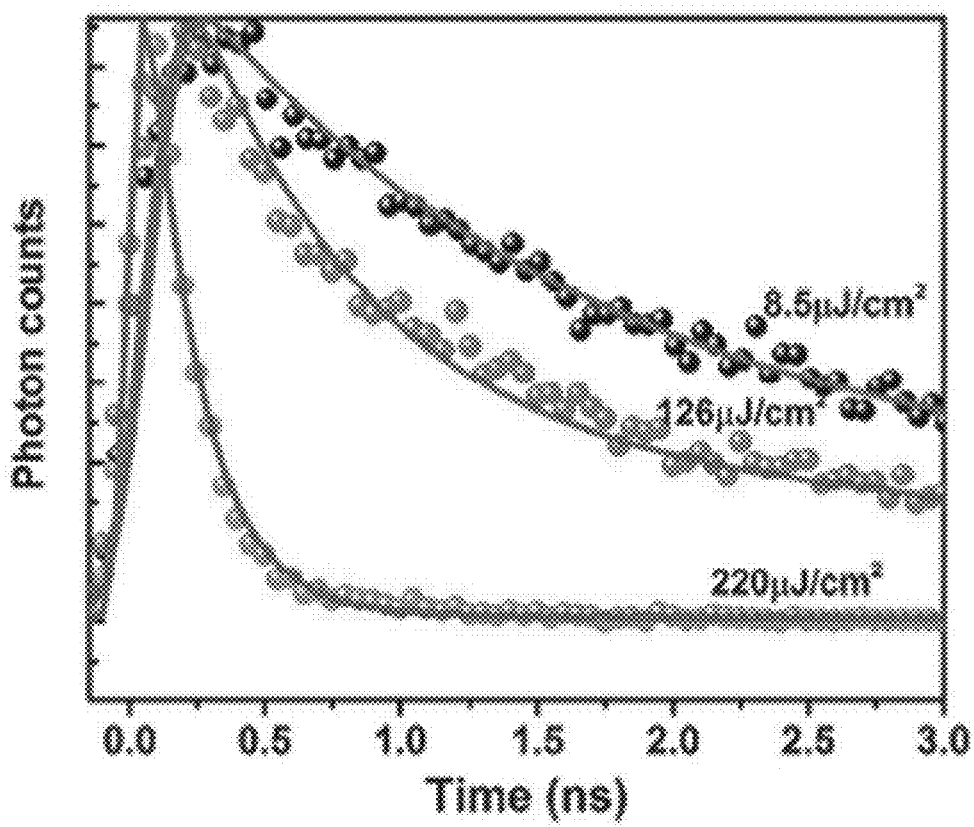
FIG. 36 illustrates time-correlated single photon counting data (TCSPC) of CsPbBr$_3$ QD film.

We studied the excited-state dynamics of QDs by the time-correlated single photon counting (TCSPC) technique. At pump fluences below the ASE threshold (8.5 pJ/cm$^2$, FIG. 36), typical PL lifetime of 11 ns was observed. Well above the ASE threshold (220 pJ/cm$^2$; FIG. 36), an ASE lifetime of approximately 2.8 ns was recorded, which further decreased to 1.9 ns with the increase in pump fluence. Such a fast decay with increasing pump fluence could be attributed to the dominant contribution from the nonradiative decay channel.

We further investigated the pumping of the passivated perovskite QDs with a nonlinear 2PA scheme. Note that 2PA is a third-order nonlinear optical phenomenon in which a molecule absorbs two photons simultaneously, resulting in an electronic transition from the ground state to an excited state via virtual states. 2PA pumping has several advantages over 1PA pumping, for instance, minimum risk of photodamage to the sample, longer penetration depth in the absorbing material and the absence of a phase-matching requirement for the generation and wavelength tuning of coherent light[45] In addition to these advantages, deleterious effects of the excitation light such as unwanted scattering and absorption losses are completely suppressed in 2PA.

Figure 37:
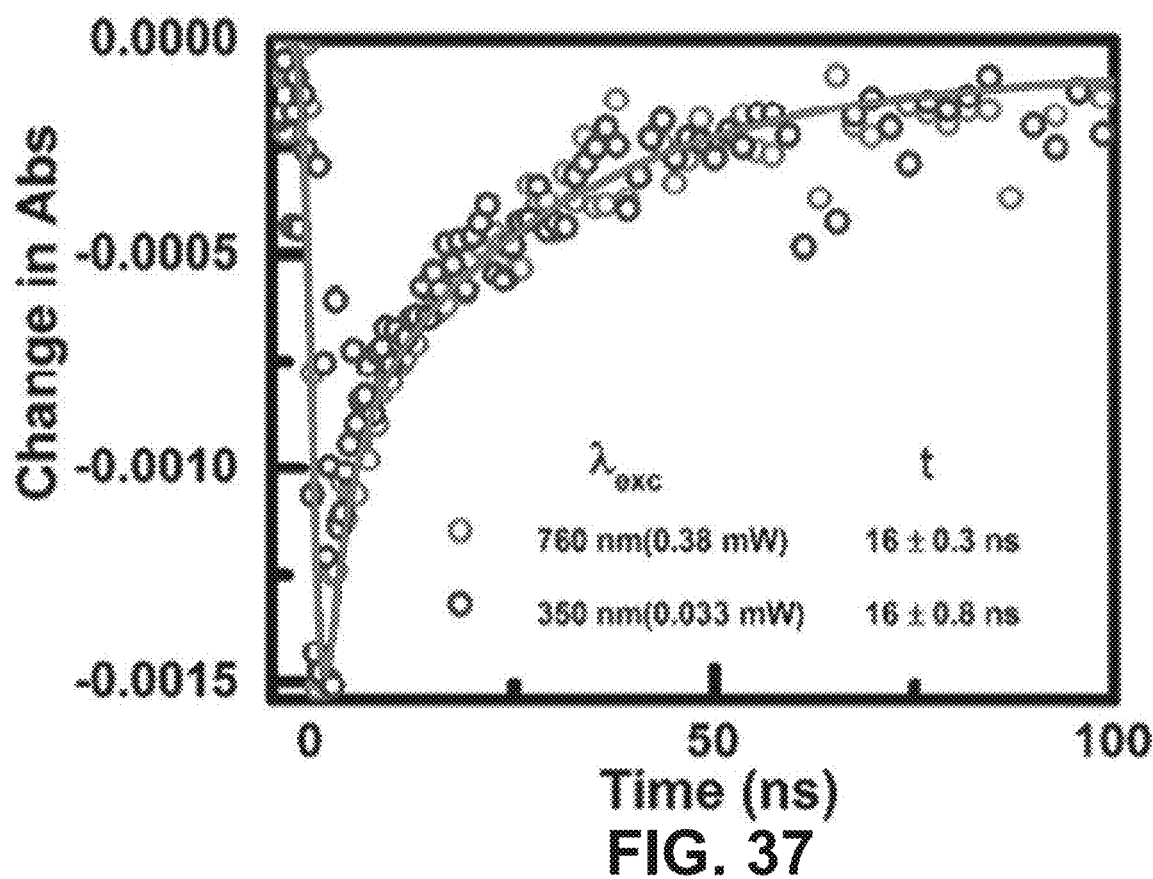
FIG. 37 illustrates kinetics of nanosecond transient absorption spectroscopy of CsPbBr$_3$ QD film excited at 350 nm (blue dots) and 760 nm (dark yellow dots).

The ASE-induced in the perovskite QDs during optical pumping was achieved via 2PA at 800 nm. The following wavelength range highlights the distinct advantages offered by 2PA pumping for the perovskite QDs because high-powered laser sources are abundant within this range; moreover, the range is also an optical transparency window for water and biological media. It is worth noting that below and above the threshold fluence, the fwhm and peak position achieved through 2PA pumping are indistinguishable from those achieved by 1PA excitation; however, a decrease in the intensity of the ASE achieved by 2PA was observed. Femtosecond transient absorption with broadband capabilities shows that the dynamics of 2PA-induced ground-state bleaching were similar to those of 1PA, and the recovery time fits a single exponential function with a characteristic time constant of ~20 ns (FIG. 37)

Although the excited-state dynamics were observed to be identical, 1PA and 2PA ASE showed markedly different thresholds. For two-photon excitation, the ASE threshold fluence was 12 mJ/cm² (FIG. 25B), which is comparable to that reported for 2PA ASE in other semiconductor QDs.[46] Nevertheless, the stability of our passivated perovskite QDs under the applied operating conditions largely surpasses (photostability unchanged after 1.2×10⁸ laser shots) all previously reported levels for ASE in QDs, regardless of whether 1PA or 2PA induced that emission. Although few reports on the 2PA pumping of colloidal QDs exist,[45,47-49] ASE from 2PA pumping in the perovskite family of materials has not been reported prior to this work.

In summary, a passivation strategy for lead halide perovskite QDs was developed to alleviate the inherent instability of the material when operating under ambient conditions currently is the greatest challenge impeding the development of perovskite-based devices. Our passivation strategy is endowed perovskite QDs with unprecedented stability in the air (60±5% humidity) and under high laser fluences, with samples showing no noticeable degradation. An analytical investigation of the passivated perovskite QDs revealed the formation of a protective layer enriched with sulfide ($S^{2-}$-$DDA^+$). Because of the ultrahigh stability of the resulting QDs, we were able to induce ultrastable ASE in solution-processed QD films not only by 1PA but also by a 2PA process. ASE in the latter is a phenomenon that has yet to be observed in any perovskite material. Additionally, our perovskite QD films showed significant photostability under continuous pulsed laser excitation in ambient conditions for at other colloidal QD systems in which ASE has been observed. The described QD passivation strategy and multiphoton-induced processes enable the practical implementation of perovskite QDs and facilitate the exploration of both their linear and nonlinear applications. We believe that this surface passivation mechanism and the validity of the 2PA process will open new avenues of study and hold promise for overcoming the greatest problem precluding the development of perovskite-based materials for solar cell and nonlinear applications.

EXPERIMENTAL SECTION

Synthesis. 1-Butanol (BuOH, HPLC grade), was purchased from Fisher Scientific. Oleic acid (OA, technical grade 90%), lead bromide (PbBr2, 98%), and octane (98%) were purchased from Alpha Aesar. Sodium sulfide hydrate, cesium carbonate ($Cs_2CO_3$, 99.995%, metal basis), didodecyl dimethylammonium bromide (DDAB, 98%), oleylamine (OLA, technical grade 70%), and 1-octadecene (ODE, technical grade 90%) were purchased from Sigma-Aldrich. Toluene (HPLC grade) was purchased from Honeywell Burdick & Jackson. All chemicals were used as procured without further purification. Preparation of Cs-Oleate. $Cs_2CO_3$ (0.814 g) along with ODE (40 mL) and OA (2.5 mL) were loaded into a 100 mL two-neck flask, dried for 1 h at 120° C., and then heated under $N_2$ at 150° C. until all $Cs_2CO_3$ had reacted with OA. The solution was maintained at 150° C. before injection to prevent the solidification of Cs-oleate.

Preparation of S Precursor ($S^{2-}$-$DDA^+$). Similarly to Jiang's method, 41.3 mL of toluene containing 0.15 m mol of DDAB was mixed with 3 mL of 50 mM aqueous $Na_2S$ solution. The $S^{2-}$ anions were then transferred from the aqueous phase to the toluene phase. The toluene phase was separated and used as a sulfur precursor ($DDA$-$S^{2-}$) in subsequent experiments.

Synthesis of $CsPbBr_3$ QDs. In contrast to the methods reported elsewhere[27,32] in the current study, the OLA and OA were not predried, and not all solvents used were anhydrous. ODE (125 mL) and $PbBr_2$ (1.725 g) were loaded into a 500 mL two-neck round-bottom flask and dried under vacuum for 1 h at 120° C. OLA (12.5 mL) and OA (12.5 mL) were then injected at 120° C. under $N_2$. After the $PbBr_2$ salt had completely dissolved, the temperature was raised to 180° C., and Cs-oleate solution (10 mL, prepared as described above) was quickly injected; an ice-water bath was then used to cool the reaction mixture after 5 s.

Selected Purification of $CsPbBr_3$ QDs. The crude solution was cooled in a water bath and directly transferred to centrifuge tubes. After centrifuging the tubes at 7000 rpm for 15 min, the supernatant and precipitate were collected separately. The supernatant was mixed with BuOH for centrifugation, and the bottom sample was then collected and redissolved in toluene (sample 1). The precipitate was dispersed by adding toluene to collect the new supernatant (sample 2) after centrifugation and redisperse the new precipitate in toluene (sample 3).

Treatment of $CsPbBr_3$ QDs and Preparation of $CsPbBr_3$ QDs Films. To 1 mL of the different $CsPbBr_3$ QDs (15 mg/mL), 50 µL of OA was added under stirring. A certain amount of sulfur precursor was then added sequentially. The sample was precipitated with twice the amount of BuOH and redissolved in 200 µL of octane. Thin films of $CsPbBr_3$ QDs were obtained by spin-coating the treated $CsPbBr_3$ QD solution under ambient conditions onto glass substrates. Moreover, the untreated sample was washed with BuOH alone and redissolved in octane to fabricate the thin films. The glass substrates were cleaned by standard procedure with detergent, deionized water, acetone, and isopropanol. The cleaned substrates were treated with plasma for 5 min before depositing the QD films. Highly smooth, densely packed and pinhole-free thin films were obtained by spin-coating at 500 rpm (10 s) and then at 1500 rpm (40 s).

Characterization. UV-vis absorption spectra were obtained using an absorption spectrophotometer from Ocean Optics. Carbon, hydrogen, oxygen, and sulfur analysis was performed using a Flash 2000 elemental analyzer (Thermo Fischer Scientific). Photoluminescence was tested using an FLS920 dedicated fluorescence spectrometer from Edinburgh Instruments. Quantum yield was measured using an Edinburgh Instruments integrating sphere with an FLS920-s fluorescence spectrometer. FTIR was performed using a Nicolet 6700 FT-IR spectrometer. Powder XRD patterns were recorded using Siemens diffractometer with Cu Kα radiation (λ=1.54178 Å). TEM analysis was carried out with a Titan TEM (FEI Company) operating at a beam energy of 300 keV and equipped with a Tridiem postcolumn energy filter (Gatan, IQD). The samples were imaged in EFTEM mode with a 20 eV energy slit inserted around the zero-energy-loss electrons to acquire high-resolution TEM (HR-TEM) micrographs. The spatial distribution of the elements Pb and S was determined and acquired using the EFTEM technique by selecting the PbO-edge (86 eV) and S L-edge (165 eV) in the three-window mapping method. Morphological investigations and cross-sectional imaging of the QD films were carried out on a Karl Zeiss FESEM.

Experimental Details of Optical Pumping, Single Photon Counting, and Transient Absorption. All ASE pumping experiments were conducted at room temperature. The 1PA pumping experiments were performed using a femtosecond laser system operated at a wavelength 800 nm with 35 fs pulses and a repetition rate of 1 kHz. UV pump pulses at 400 nm were obtained in a straightforward manner by the second harmonic (frequency doubled) of the fundamental beam, where 100 µJ of the laser output was focused in a 100 µm BBO nonlinear crystal. The 2PA pumping experiments were carried out by directly using the fundamental beam at 800 nm.

TCSPC for lifetime measurements was performed using a Halcyone MC multichannel fluorescence up-conversion spectrometer (Ultrafast Systems) at an excitation wavelength of 400 nm. Nanosecond transient absorption experiments were conducted using an EOS setup (Ultrafast Systems). Detailed information regarding the experimental setup has been published elsewhere. [50,51]

Supporting Information

EF-TEM characterization was conducted on sulfur-treated NCs. Elemental mapping was carried out for lead and sulfur. Results indicate a high correlation between lead and sulfur (FIG. 30B, 30C), suggesting that sulfur was indeed present on the NCs as a capping layer rather than as a PbS shell.

Both the treated and untreated samples were washed with 1-butanol, centrifuged and placed under vacuum. The color varied and the luminescence was improved with the applied treatment. X-ray fluorescence (XRF) was used to analyze the major elements of the sample. The Cs:Pb:Br ratio was approximately 1:2:5 for the untreated sample, confirming the instability of the inorganic perovskite, which is consistent with the XRD pattern (FIG. 31). The elemental ratio of the treated sample obtained by XRF analysis is not reasonable, perhaps because the sulfur K line (2.307 keV) is very close to the lead M line (2.42 keV) and because hybrid ion pair ligand passivation was performed. However, the XRD pattern (FIG. 31) of the treated sample corresponds to cubic phase $CsPbBr_3$, indicating high stability in air (60% humidity in the lab, KAUST, Saudi Arabia).

REFERENCES, EXAMPLE 2

(1) Kojima, A.; Teshima, K.; Shirai, Y.; Miyasaka, T. Organometal Halide Perovskites as Visible-Light Sensitizers for Photovoltaic Cells. J. Am. Chem. Soc. 2009, 131, 6050-6051.
(2) Lee, M. M.; Teuscher, J.; Miyasaka, T.; Murakami, T. N.; Snaith, H. J. Efficient Hybrid Solar Cells Based on Meso-Superstructured Organometal Halide Perovskites. Science 2012, 338, 643-647.
(3) Cai, B.; Xing, Y.; Yang, Z.; Zhang, W.-H.; Qiu, J. High Performance Hybrid Solar Cells Sensitized by Organolead Halide Perovskites. Energy Environ. Sci. 2013, 6, 1480-1485.
(4) Luo, J.; Im, J.-H.; Mayer, M. T.; Schreier, M.; Nazeeruddin, M. K.; Park, N.-G.; Tilley, S. D.; Fan, H. J.; Grafzel, M. Water Photolysis at 12.3% Efficiency via Perovskite Photovoltaics and Earth-abundant Catalysts. Science 2014, 345, 1593-1596.
(5) Zhou, H.; Chen, Q.; Li, G.; Luo, S.; Song, T.-b.; Duan, H.-S.; Hong, Z.; You, J.; Liu, Y.; Yang, Y. Interface Engineering of Highly Efficient Perovskite Solar Cells. Science 2014, 345, 542-546. The Journal of Physical Chemistry Letters DOI: 10.1021/acs.jpclett.5b02J. Phys. Chem. Lett
(6) Jeon, N. J.; Noh, J. H.; Yang, W. S.; Kim, Y. C.; Ryu, S.; Seo, J.; Seok, S. I. Compositional Engineering of Perovskite Materials for High-Performance Solar Cells. Nature 2015, 517, 476-480.
(7) Xing, G.; Mathews, N.; Lim, S. S.; Yantara, N.; Liu, X.; Sabba, D.; Grätzel, M.; Mhaisalkar, S.; Sum, T. C. Low-Temperature Solution-Processed Wavelength-Tunable Perovskites for Lasing. Nat. Mater. 2014, 13, 476-480.
(8) Deschler, F.; Price, M.; Pathak, S.; Klintberg, L. E.; Jarausch, D.-D.; Higler, R.; Hüttner, S.; Leijtens, T.; Stranks, S. D.; Snaith, H. J.; et al. High Photoluminescence Efficiency and Optically Pumped Lasing in Solution-Processed Mixed Halide Perovskite Semiconductors. J. Phys. Chem. Lett. 2014, 5, 1421-1426.
(9) Sutherland, B. R.; Hoogland, S.; Adachi, M. M.; Wong, C. T. O.; Sargent, E. H. Conformal Organohalide Perovskites Enable Lasing on Spherical Resonators. ACS Nano 2014, 8, 10947-10952.
(10) Zhu, H.; Fu, Y.; Meng, F.; Wu, X.; Gong, Z.; Ding, Q.; Gustafsson, M. V.; Trinh, M. T.; Jin, S.; Zhu, X. Y. Lead halide perovskite nanowire lasers with low lasing thresholds and high quality factors. Nat. Mater. 2015, 14, 636-642.
(11) Dohner, E. R.; Jaffe, A.; Bradshaw, L. R.; Karunadasa, H. I. Intrinsic White-Light Emission from Layered Hybrid Perovskites. J. Am. Chem. Soc. 2014, 136, 13154-13157.
(12) Tan, Z.-K.; Moghaddam, R. S.; Lai, M. L.; Docampo, P.; Higler, R.; Deschler, F.; Price, M.; Sadhanala, A.; Pazos, L. M.; Credgington, D.; et al. Bright Light-Emitting Diodes Based On Organometal Halide Perovskite. Nat. Nanotechnol. 2014, 9, 687-692.
(13) Kim, Y.-H.; Cho, H.; Heo, J. H.; Kim, T.-S.; Myoung, N.; Lee, C.-L.; Im, S. H.; Lee, T.-W. Multicolored Organic/Inorganic Hybrid Perovskite Light-Emitting Diodes. Adv. Mater. 2015, 27, 1248-1254.
(14) Li, G.; Tan, Z.-K.; Di, D.; Lai, M. L.; Jiang, L.; Lim, J. H.-W.; Friend, R. H.; Greenham, N. C. Efficient Light-Emitting Diodes Based on Nanocrystalline Perovskite in a Dielectric Polymer Matrix. Nano Lett. 2015, 15, 2640-2644.
(15) Dou, L.; Yang, Y.; You, J.; Hong, Z.; Chang, W.-H.; Li, G.; Yang, Y. Solution-processed hybrid perovskite photodetectors with high detectivity. Nat. Commun. 2014, 5, 5404.
(16) Zhuo, S.; Zhang, J.; Shi, Y.; Huang, Y.; Zhang, B. Self-Template-Directed Synthesis of Porous Perovskite Nanowires at Room Temperature for High-Performance Visible-Light Photodetectors. Angew. Chem., Int. Ed. 2015, 54, 5693-5696.
(17) Maculan, G.; Sheikh, A. D.; Abdelhady, A. L.; Saidaminov, M. I.; Haque, M. A.; Murali, B.; Alarousu, E.; Mohammed, O. F.; Wu, T.; Bakr, M. O. CH3NH3PbCl3 Single Crystals: Inverse Temperature Crystallization and Visible-Blind UV-Photodetector. J. Phys. Chem. Lett. 2015, 6, 3781-3786.
(18) Manser, J. S.; Reid, B.; Kamat, P. V. Evolution of Organic-Inorganic Lead Halide Perovskite from Solid-State Iodoplumbate Complexes. J. Phys. Chem. C 2015, 119, 17065-17073.
(19) Kamat, P. V. Emergence of New Materials for Light-Energy Conversion: Perovskites, Metal Clusters, and 2-D Hybrids. J. Phys. Chem. Lett. 2014, 5, 4167-4168.
(20) Zhang, W.; Saliba, M.; Moore, D. T.; Pathak, S. K.; Horantner, M. T.; Stergiopoulos, T.; Stranks, S. D.; Eperon, G. E.; Alexander-Webber, J. A.; Abate, A.; et al. Ultrasmooth Organic-Inorganic Perovskite Thin-Film Formation and Crystallization for Efficient Planar Heterojunction Solar Cells. Nat. Commun. 2015, 6, 6142.
(21) Shi, D.; Adinolfi, V.; Comin, R.; Yuan, M.; Alarousu, E.; Buin, A.; Chen, Y.; Hoogland, S.; Rothenberger, A.; Katsiev, K.; et al. Low Trap-State Density and Long Carrier Diffusion in Organolead Trihalide Perovskite Single Crystals. Science 2015, 347, 519-522.
(22) Saidaminov, M. I.; Abdelhady, A. L.; Murali, B.; Alarousu, E.; Burlakov, V. M.; Peng, W.; Dursun, I.;

Wang, L.; He, Y.; Maculan, G.; et al. High-Quality Bulk Hybrid Perovskite Single Crystals within Minutes by Inverse Temperature Crystallization. Nat. Commun. 2015, 6, 7586.

(23) Zhang, D.; Eaton, S. W.; Yu, Y.; Dou, L.; Yang, P. Solution-Phase Synthesis of Cesium Lead Halide Perovskite Nanowires. J. Am. Chem. Soc. 2015, 137, 9230-9233.

(24) Fu, A.; Yang, P. Organic-Inorganic Perovskites: Lower Threshold for Nanowire Lasers. Nat. Mater. 2015, 14, 557-558.

(25) Zhang, F.; Zhong, H.; Chen, C.; Wu, X.-g.; Hu, X.; Huang, H.; Han, J.; Zou, B.; Dong, Y. Brightly Luminescent and Color-Tunable Colloidal $CH_3NH_3PbX_3$ (X=Br—, I—, Cl—) Quantum Dots: Potential Alternatives for Display Technology. ACS Nano 2015, 9, 4533-4542. 491

(26) Park, Y.-S.; Guo, S.; Makarov, N. S.; Klimov, V. I. Room Temperature Single-Photon Emission from Individual Perovskite Quantum Dots. ACS Nano 2015, 9, 10386-10393.

(27) Protesescu, L.; Yakunin, S.; Bodnarchuk, M. I.; Krieg, F.; Caputo, R.; Hendon, C. H.; Yang, R. X.; Walsh, A.; Kovalenko, M. V. Nanocrystals of Cesium Lead Halide Perovskites ($CsPbX_3$, X=Cl, Br, and I): Novel Optoelectronic Materials Showing Bright Emission with Wide Color Gamut. Nano Lett. 2015, 15, 3692-3696.

(28) Scholes, G. D.; Rumbles, G. Excitons in Nanoscale Systems. Nat. Mater. 2006, 5, 683-696.

(29) Hoffman, J. B.; Choi, H.; Kamat, P. V. Size-Dependent Energy Transfer Pathways in CdSe Quantum Dot—Squaraine Light-Harvesting Assemblies: Förster versus Dexter. J. Phys. Chem. C 2014, 118, 18453-18461.

(30) Hines, D. A.; Kamat, P. V. Recent Advances in Quantum Dot Surface Chemistry. ACS Appl. Mater. Interfaces 2014, 6 (5), 3041-3057.

(31) Kamat, P. V. Evolution of Perovskite Photovoltaics and Decrease in Energy Payback Time. J. Phys. Chem. Lett. 2013, 4 (21), 3733-3734.

(32) Akkerman, Q. A.; D'Innocenzo, V.; Accornero, S.; Scarpellini, A.; Petrozza, A.; Prato, M.; Manna, L. Tuning the Optical Properties of Cesium Lead Halide Perovskite Nanocrystals by Anion Exchange Reactions. J. Am. Chem. Soc. 2015, 137, 10276-10281.

(33) Kulbak, M.; Cahen, D.; Hodes, G. How Important is the Organic Part of Lead Halide Perovskite Photovoltaic Cells? Efficient $CsPbBr_3$ Cells. J. Phys. Chem. Lett. 2015, 6, 2452-2456.

(34) Leo, K. Perovskite photovoltaics: Signs of stability. Nat. Nanotechnol. 2015, 10, 574-575.

(35) Haske, W.; Chen, V. W.; Hales, J. M.; Dong, W.; Barlow, S.; Marder, S. R.; Perry, J. W. 65 nm Feature Sizes using Visible Wavelength 3-D Multiphoton Lithography. Opt. Express 2007, 15, 3426-3436.

(36) Zipfel, W. R.; Williams, R. M.; Webb, W. W. Nonlinear Magic: Multiphoton Microscopy in the Biosciences. Nat. Biotechnol. 2003, 21, 1369-1377.

(37) Chong, E. Z.; Watson, T. F.; Festy, F. Autocorrelation Measurement of Femtosecond Laser Pulses Based on Two-Photon Absorption in Gap Photodiode. Appl. Phys. Lett. 2014, 105, 062111.

(38) Noel, N. K.; Abate, A.; Stranks, S. D.; Parrott, E. S.; Burlakov, V. M.; Goriely, A.; Snaith, H. J. Enhanced Photoluminescence and Solar Cell Performance via Lewis Base Passivation of Organic-Inorganic Lead Halide Perovskites. ACS Nano 2014, 8, 9815-9821.

(39) Kovalenko, M. V.; Bodnarchuk, M. I.; Talapin, D. V. Nanocrystal Superlattices with Thermally Degradable Hybrid Inorganic-Organic Capping Ligands. J. Am. Chem. Soc. 2010, 132, 15124-15126.

(40) Stranks, S. D.; Burlakov, V. M.; Leijtens, T.; Ball, J. M.; Goriely, A.; Snaith, H. J. Recombination Kinetics in Organic-Inorganic Perovskites: Excitons, Free Charge, and Subgap States. Phys. Rev. Appl. 2014, 2, 034007.

(41) Jiang, P.; Zhu, C.-N.; Zhu, D.-L.; Zhang, Z.-L.; Zhang, G.-J.; Pang, D.-W. A Room-Temperature Method for Coating a Zns Shell on Semiconductor Quantum Dots. J. Mater. Chem. C 2015, 3, 964-967.

(42) Yakunin, S.; Protesescu, L.; Krieg, F.; Bodnarchuk, M. I.; Nedelcu, G.; Humer, M.; De Luca, G.; Fiebig, M.; Heiss, W.; Kovalenko, M. V. Low-threshold amplified spontaneous emission and lasing from colloidal nanocrystals of caesium lead halide perovskites. Nat. Commun. 2015, 6, 8056.

(43) Priante, D.; Dursun, I.; Alias, M. S.; Shi, D.; Melnikov, V. A.; Ng, T. K.; Mohammed, O. F.; Bakr, O. M.; Ooi, B. S. The Recombination Mechanisms Leading to Amplified Spontaneous Emission at the True-Green Wavelength in $CH_3NH_3PbBr_3$ Perovskites. Appl. Phys. Lett. 555 2015, 106, 081902.

(44) Guzelturk, B.; Kelestemur, Y.; Gungor, K.; Yeltik, A.; Akgul, M. Z.; Wang, Y.; Chen, R.; Dang, C.; Sun, H.; Demir, H. V. Upconversion Lasers: Stable and Low-Threshold Optical Gain in CdSe/CdS Quantum Dots: An All-Colloidal Frequency Up-Converted Laser (Adv. Mater. 17/2015). Adv. Mater. 2015, 27, 2678-2678.

(45) Xing, G.; Liao, Y.; Wu, X.; Chakrabortty, S.; Liu, X.; Yeow, E. K. L.; Chan, Y.; Sum, T. C. Ultralow-Threshold Two-Photon Pumped Amplified Spontaneous Emission and Lasing from Seeded CdSe/CdS Nanorod Heterostructures. ACS Nano 2012, 6, 10835-10844.

(46) Cooney, R. R.; Sewall, S. L.; Sagar, D. M.; Kambhampati, P. Gain Control in Semiconductor Quantum Dots via State-Resolved Optical Pumping. Phys. Rev. Lett. 2009, 102, 127404.

(47) Achtstein, A. W.; Ballester, A.; Movilla, J. L.; Hennig, J.; Climente, J. I.; Prudnikau, A.; Antanovich, A.; Scott, R.; Artemyev, M. V.; Planelles, J.; et al. One- and Two-Photon Absorption in CdS Nanodots and Wires: The Role of Dimensionality in the One- and Two-Photon Luminescence Excitation Spectrum. J. Phys. Chem. C 2015, 119, 1260-1267.

(48) Nyk, M.; Szeremeta, J.; Wawrzynczyk, D.; Samoc, M. Enhancement of Two-Photon Absorption Cross Section in CdSe Quantum Rods. J. Phys. Chem. C 2014, 118, 17914-17921.

(49) Allione, M.; Ballester, A.; Li, H.; Comin, A.; Movilla, J. L.; Climente, J. I.; Manna, L.; Moreels, I. Two-Photon-Induced Blue Shift of Core and Shell Optical Transitions in Colloidal CdSe/CdS Quasi-Type II Quantum Rods. ACS Nano 2013, 7, 2443-2452.

(50) Aly, S. M.; Ahmed, G. H.; Shaheen, B. S.; Sun, J.; Mohammed, 0. F. Molecular-Structure Control of Ultrafast Electron Injection at Cationic Porphyrin-CdTe Quantum Dot Interfaces. J. Phys. Chem. Lett. 2015, 6, 791-795.

(51) Mohammed, 0. F.; Xiao, D.; Batista, V. S.; Nibbering, E. T. J. Excited-State Intramolecular Hydrogen Transfer (ESIHT) of 1,8-Dihydroxy-9,10-anthraquinone (DHAQ) Characterized by UltrafastElectronic and Vibrational Spectroscopy and Computational Modeling. J. Phys. Chem. A 2014, 118, 3090-3099.

Example 3

Lead halide perovskites have recently emerged as promising candidate materials for optoelectronic applications such as photovoltaics,[1-3] lasing,[4-6] and photodetectors,[7-9] due to their size-tunable optical bandgaps, attractive absorption, narrow emission, and extraordinary charge transport properties. These impressive characteristics have also triggered intense interest in applying perovskites to the field of light-emitting diodes (LEDs).[10] However, perovskite LEDs (PeLEDs) still exhibit overall low performance in comparison to other materials technologies, such as Cd-based quantum dots (QDs).[11-13] Moreover, recent advances in integrating lead halide perovskites in PeLEDs have been mainly limited to hybrid organic-inorganic perovskites, such as $CH_3NH_3PbBr_3$.[14,15] The highest performance so far achieved was obtained for a green PeLED with $CH_3NH_3PbBr_3$ using a self-organized conducting polymer anode exhibiting a current efficiency of 42.9 cd $A^{-1}$ and an external quantum efficiency (EQE) of up to 8.53%.[16] Unfortunately, such hybrid organic-inorganic perovskite materials and their resultant devices are hampered by their limited stability.[17-19]

All-inorganic perovskite QDs (APQDs), such as $CsPbX_3$ (X=Cl, Br, and I), exhibit superior thermal stability compared to their hybrid analogues. They have the potential to be integrated into various optoelectronic devices that can exploit their quantum confinement effects. Kovalenko and co-workers fabricated $CsPbX_3$ QDs with exceptionally tunable optical properties and high photoluminescence (PL) quantum yield, suggesting a major opportunity to employ this family of materials for LEDs.[20] Unfortunately, the highest EQE reported so far is 0.19%,[21] which is partly due to the QDs being capped with relatively insulating long ligands that are required for the processing and stability of the QDs.[22,23] Replacing these long ligands (usually oleylamine (OAm) and oleic acid (OA)) with shorter ligands without degrading or destabilizing the APQD films remains the key challenge preventing the fabrication of efficient LEDs from APQDs.

Here, we realize highly stable films of $CsPbX_3$ QDs capped with a halide ion pair (e.g., di-dodecyl dimethyl ammonium bromide, DDAB), a relatively short ligand that facilitates carrier transport in the QD film and ultimately enables us to fabricate efficient PeLEDs. The synthesis of these films was only possible through the design of a ligand-exchange strategy that includes an intermediate step to desorb protonated OAm, which otherwise would result in the degradation of APQDs through a direct conventional ligand-exchange route. As a result of our novel ligand exchange strategy, we were able to utilize halide ion pair-capped $CsPbBr_3$ QDs in green PeLED with a device structure of ITO/PEDOT: PSS/PVK/QDs/TPBi/LiF/Al, achieving an EQE of 0.65% with a luminance of 165 cd $m^{-2}$ at a voltage of 7.5V, which is much higher compared to the APQD LEDs without ligand exchange. Furthermore, we demonstrated the flexibility and generality of our ligand exchange strategy by exploiting mixed halide ion pairs to tune the emission of the QDs and further to fabricate blue PeLEDs possessing an EQE of 0.18% with a maximum luminance of 35 cd $m^{-2}$ at a voltage 7.5 V. The reported efficiencies for both green and blue PeLEDs in this work represent a major leap for the family of APQD materials and pave the way to further their exploitation in optoelectronics through judicious surface engineering.

Figure 43:
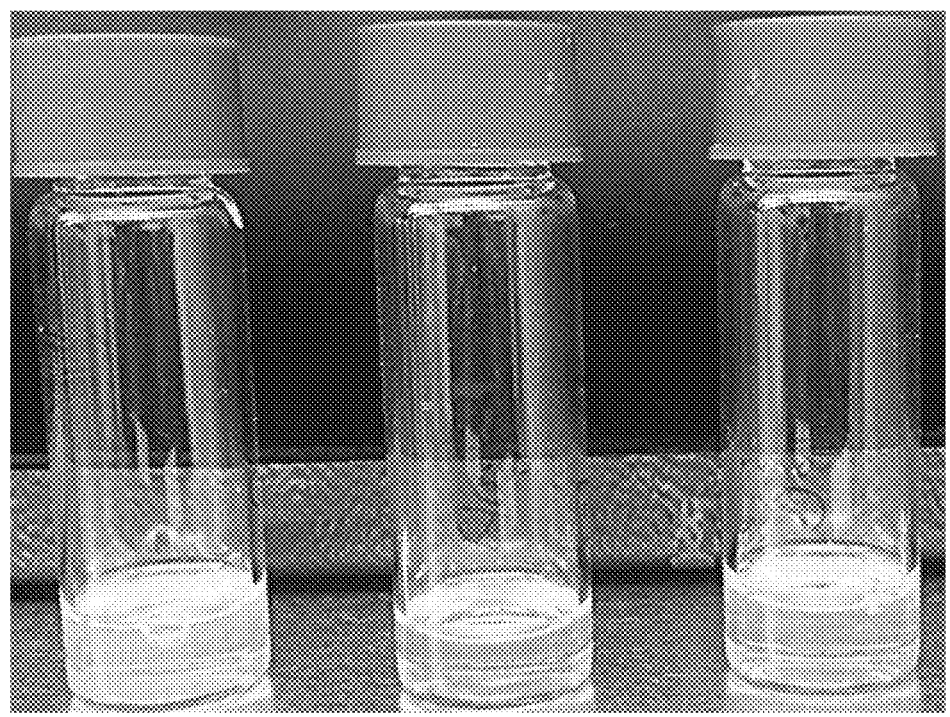
FIG. 43 is a series of photo images of different QDs samples. From left to right: P-QDs, OA-QDs, and DDAB-OA-QDs, respectively.

The APQDs were synthesized via a modified hot-injection synthesis strategy by injecting cesium oleate into a $PbBr_2$ solution at 180° C. and stirring for 5 sec.[24] The as-obtained reaction mixture containing QDs was quenched in an ice bath and purified for further treatment (see Experimental Section for details). These purified QDs (herein referred as P-QDs) are soluble in nonpolar solvents such as toluene due to the presence of organic ligands (i.e., OA and OAm) on the QD surface. The solution of P-QDs/toluene exhibits a bright green color (FIG. 43), which will turn into light brown immediately with the addition of OA, suggesting instability problems with the presence of excess OA and possible formation of large aggregates (the products were referred as OA-QDs). However, upon the introduction of DDAB in the final treatment step, a luminous bright green color reappeared (the products were referred to as DDAB-OA-QDs) (FIG. 43).

Figure 38A:
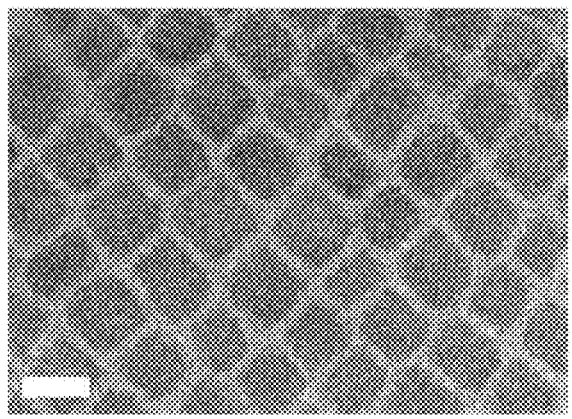
FIGS. 38A-38F are TEM images with scale bar of 10 nm.
Figure 38B:
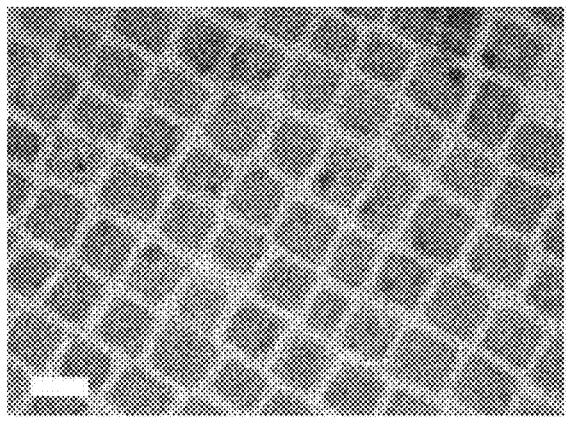
Figure 38C:
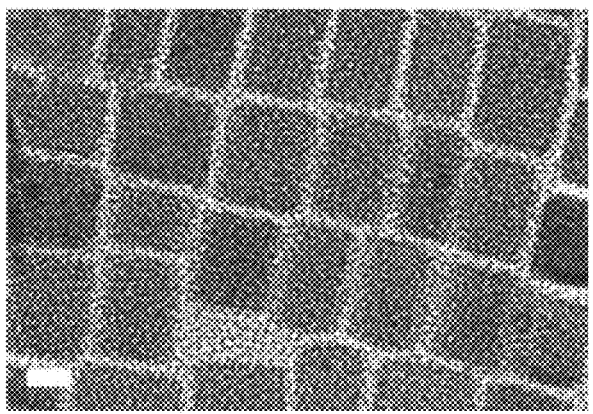
Figure 38D:
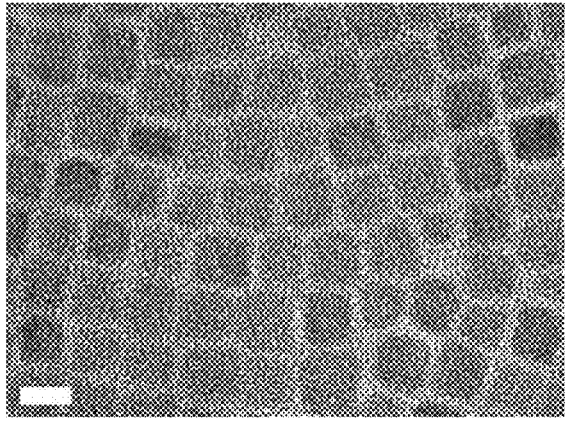
Figure 44:
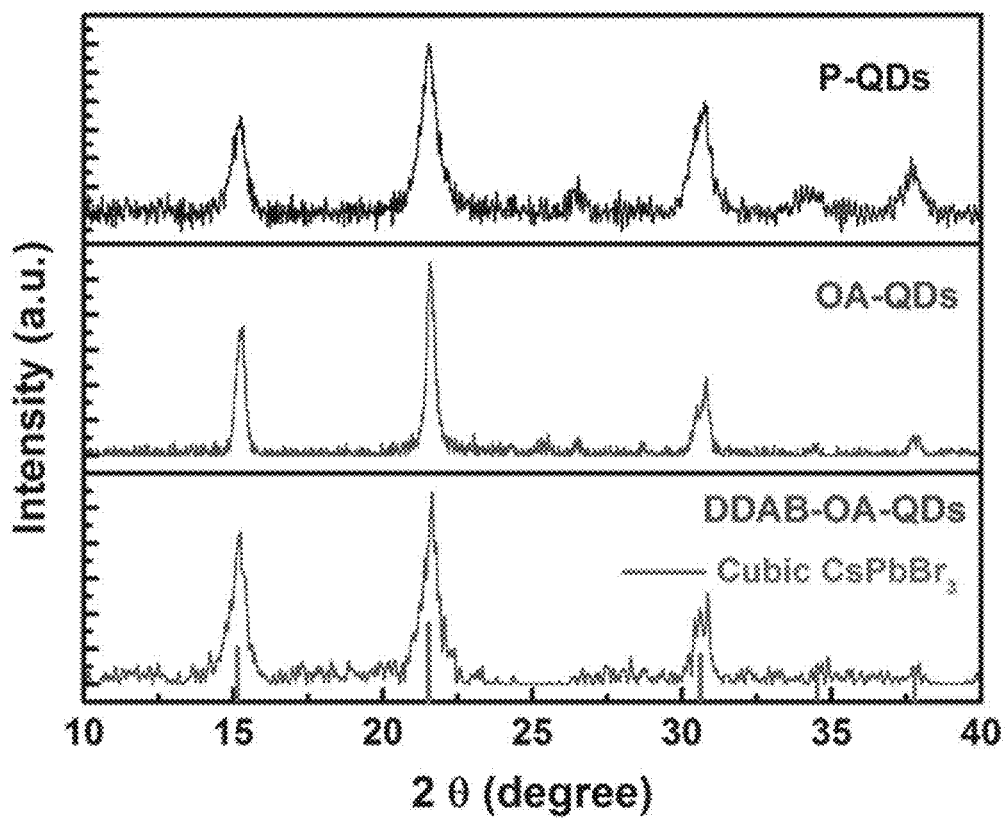
FIG. 44 shows the X-ray diffraction pattern of P-QDs, OA-QDs, and DDAB-OA-QDs. OA-QDs and DDAB-OA-QDs were washed with butanol first and re-dispersed in toluene. For OA-QDs, the supernatant after centrifugation was used for characterization. However, no precipitate was found for DDAB-OA-QDs. All of the samples were spin coated on a clean glass substrate for XRD analysis.
Figure 45:
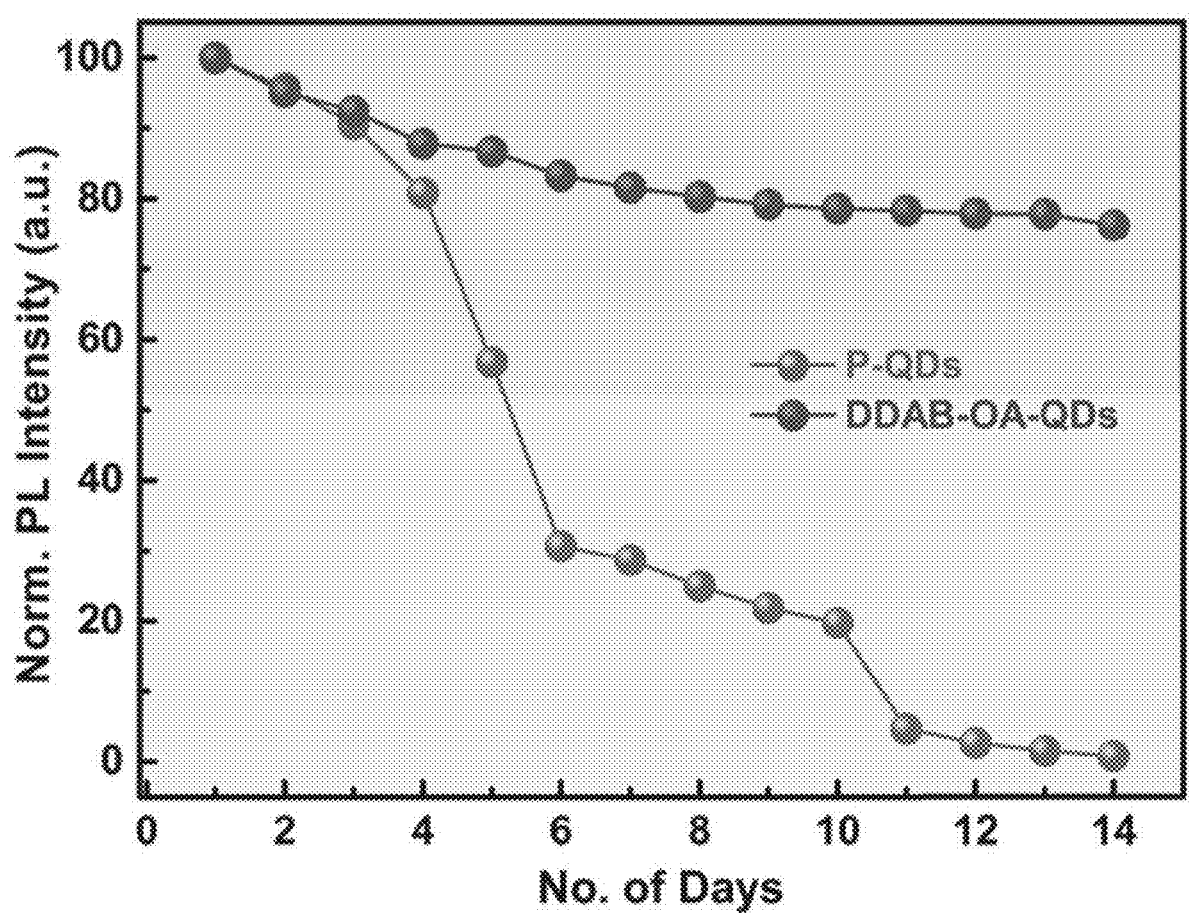
FIG. 45 demonstrates PL intensity stability curves as a function of number of days for the P-QDs and DDAB-OA-QDs samples respectively. Both the samples were dissolved in toluene and measured under ambient condition.

High-resolution transmission electron microscopy (HR-TEM) was used to track the morphological changes during the treatment procedures. As shown in FIG. 38A, the P-QDs are cubic shaped and monodisperse, with an average size of 10 nm (FIG. 38A). The OA-QDs were washed with butanol and re-dispersed in toluene after removal of precipitates via centrifugation for TEM characterization. For the OA-QDs that were cleaned immediately after the addition of OA, TEM shows an increased average particle size (FIG. 38B), while more obvious size increment can be observed if the QDs were kept with OA for 30 min before further cleaning (FIG. 38C). However, the particle sizes and shapes can be preserved with immediate DDAB treatment after the addition of OA (FIG. 38D). X-ray diffraction (XRD) confirmed the cubic crystal phase of all the samples, in accordance with previous reports (FIG. 44).[25,26]

Figure 38E:
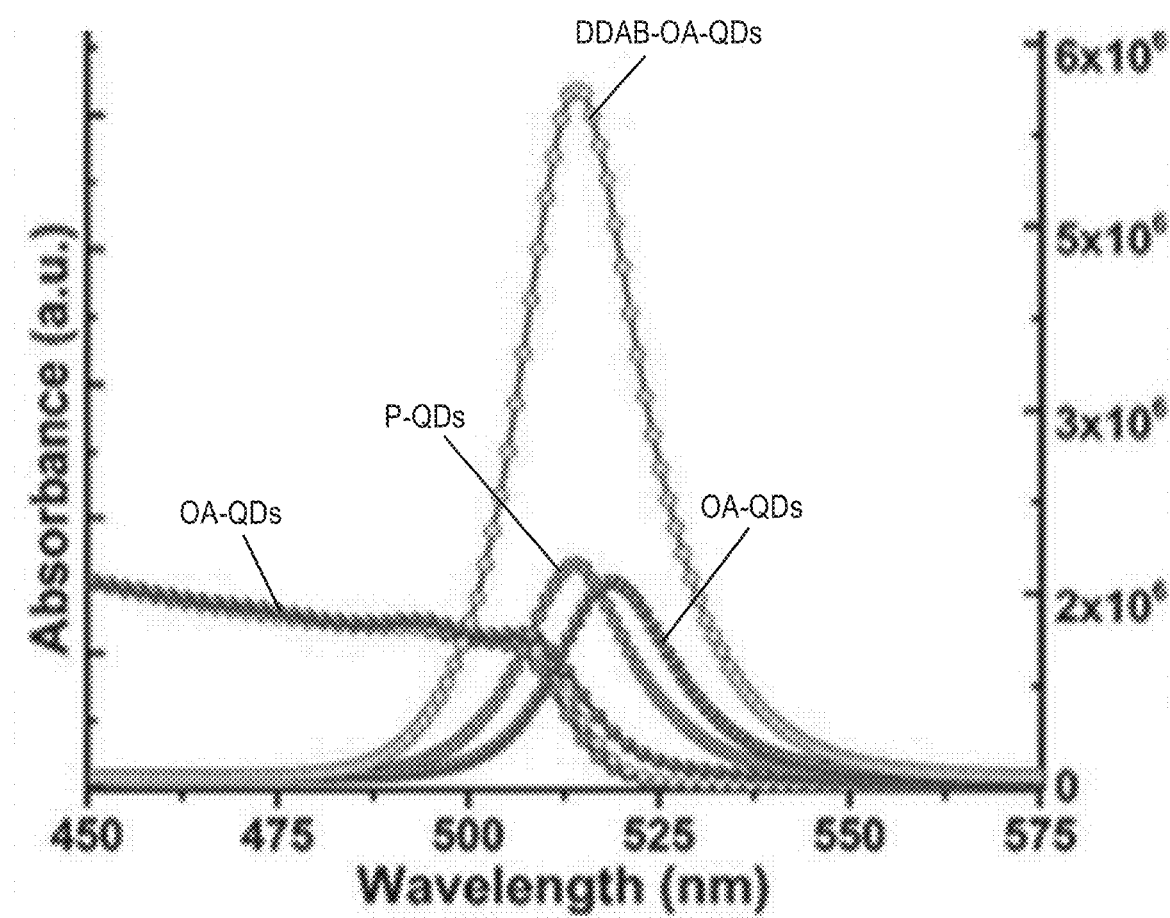

FIG. 38E shows the UV-Visible absorption spectra of the QDs before (P-QDs) and after (DDAB-OA-QDs) ligand exchange. The close match of the two spectra implies that the size of QDs was preserved during ligand exchange. The enhanced PL intensity at 513 nm, along with the quantum yield increasing from 49% to 71% for DDAB-OA-QDs, indicate a better passivation of the surface trap states.[27] Notably, a 4 nm shift in PL spectra was noticed after OA treatment, possibly due to the adsorption of OA on the QD surface or the formation of slightly larger particles.

Figure 38F:
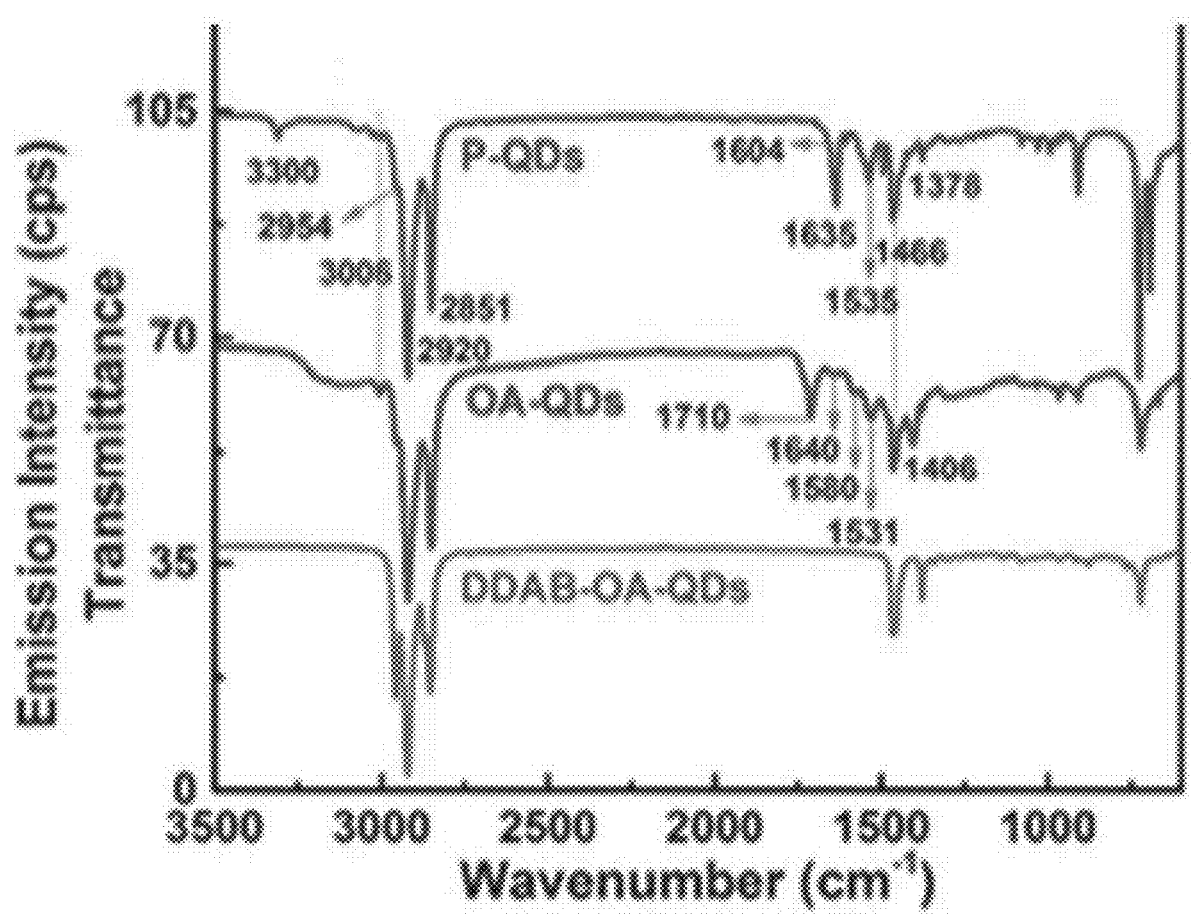

To elucidate the ligand exchange process, Fourier transform infrared spectroscopy (FTIR) was used to examine the presence of ligand types in the as-synthesized and treated QD samples. As displayed in FIG. 38F, all the samples show $CH_2$ and $CH_3$ symmetric and asymmetric stretching vibrations in the range of 2840-2950 $cm^{-1}$, and $CH_2$ bending vibration at 1466 $cm^{-1}$, which are the typical absorption bands for species with hydrocarbon groups.[28] The FTIR spectrum for the P-QDs sample shows an N—H stretching mode at 3300 $cm^{-1}$, indicating the presence of OAm on the P-QD surface.[29] The strong signal at 1635 $cm^{-1}$ can be assigned to the asymmetric $NH_3+$ deformation,[30] consistent with the appearance of N 1S at 401.8 eV in the XPS analysis (discussed below). The absorptions at 1605, 1535 and 1406 $cm^{-1}$ are ascribed to two asymmetric vibrations and one symmetric stretching vibration of the carboxylate group, indicating that oleate anions are complexed on the QD surface.[31,32] With the addition of OA, OAm gets protonated by excess protons, and further reacts with deprotonated OA to form an acid-base complex, resulting in their desorption from the QD surface.[33,34] Subsequently, the excess OA adsorbs on the QD surfaces, as can be inferred from the emergence of the characteristic C=O stretching vibration band at 1710 $cm^{-1}$ in the IR spectrum of the OA-QD sample.[35] To shed more light on the ligand exchange process, we quantified the zeta potentials of various QD samples. In contrast with a negative value of −16 mV for the P-QDs, the OA-QDs shows a positive value of 10 mV, confirming the adsorption of OA on the QD surface and resulting in a polarity change. Such a scenario of protonation and desorption of OAm through the addition of OA has also been reported previously.[36,37]

However, both characteristic bands of N—H in OAm and C=O in OA disappear in the IR spectrum of the DDAB-OA-QDs, indicating a complete exchange of OA by DDAB on the QD surface. Such an exchange process may arise from the stronger affinity of Br-ions to the positive sites ($Pb^{2+}$ or $Cs^+$) on the QD surface compare to that of oleate group,[22,38] as well as the stronger affinity of $DDA^+$ with the negative sites (Br) or adsorbed Br on the QD surface In addition, due to the larger steric hindrance of the branched structure of $DDA^+$, fewer $DDA^+$ ions may be adsorbed onto the QD surface, inducing a more negatively polarized QD due to the Br-rich surface,[39] which is confirmed by a zeta potential value of −60 mV. Such a large zeta potential along with the large steric hindrance of $DDA^+$ ensure a higher stability of the DDAB-OA-QD solution (FIGS. 34A-34B). Such a passivation strategy, therefore, offers a solution to the instability problems caused by the highly dynamic binding of OAm and OA with the QDs,[34] so as to achieve a more stable ligand capping of the QDs through an X-type[22,23] binding using the ion pair ligand.

Figure 39A:
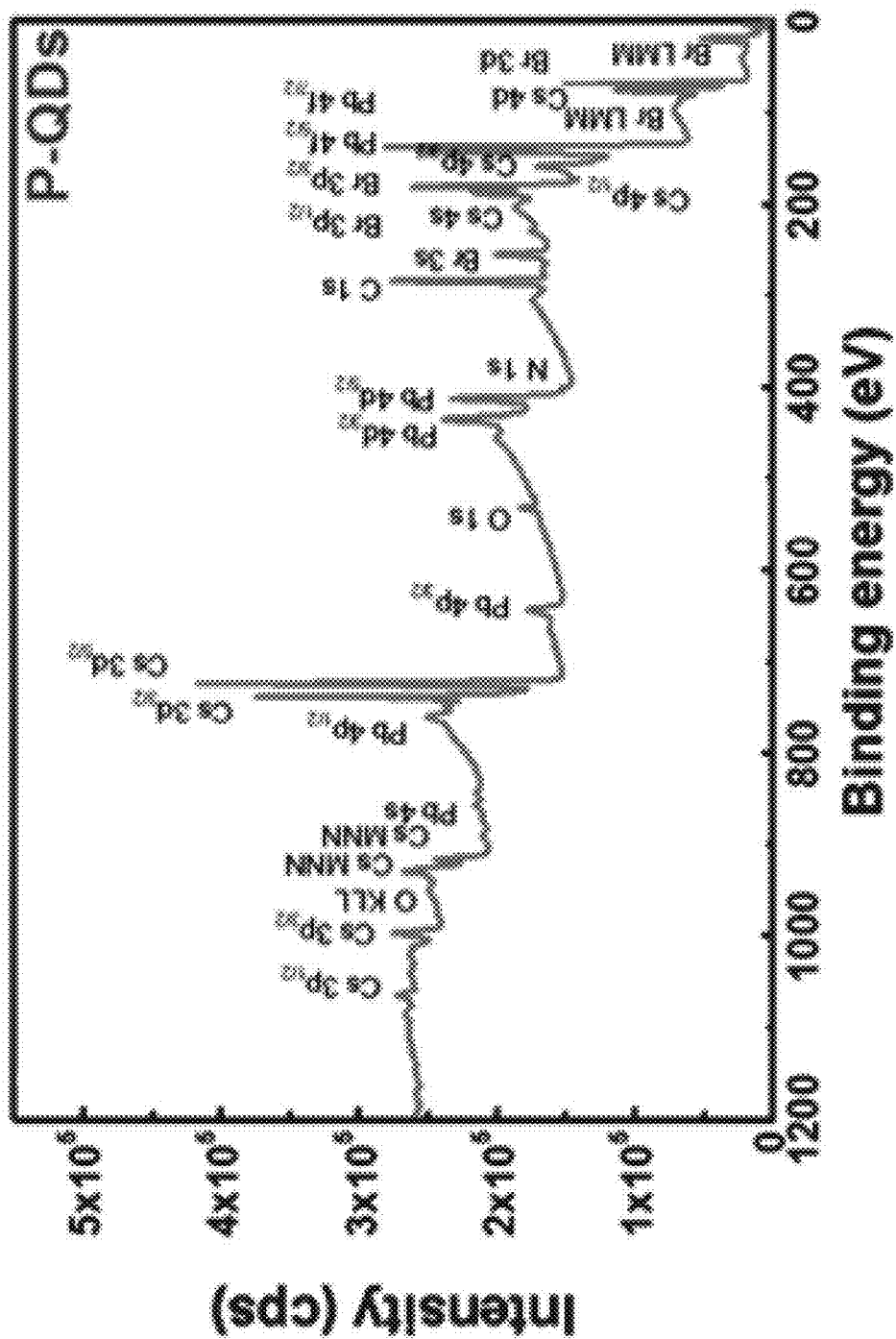
FIGS. 39A-39D are the X-ray photoelectron spectroscopy studies showing the (39A) Survey spectrum of P-QDs, (39B-39D) High resolution N 1s core level spectra of P-QDs, OA-QDs and DDAB-OA-QDs (washed with butanol and dispersed in toluene), respectively.
Figure 39B:
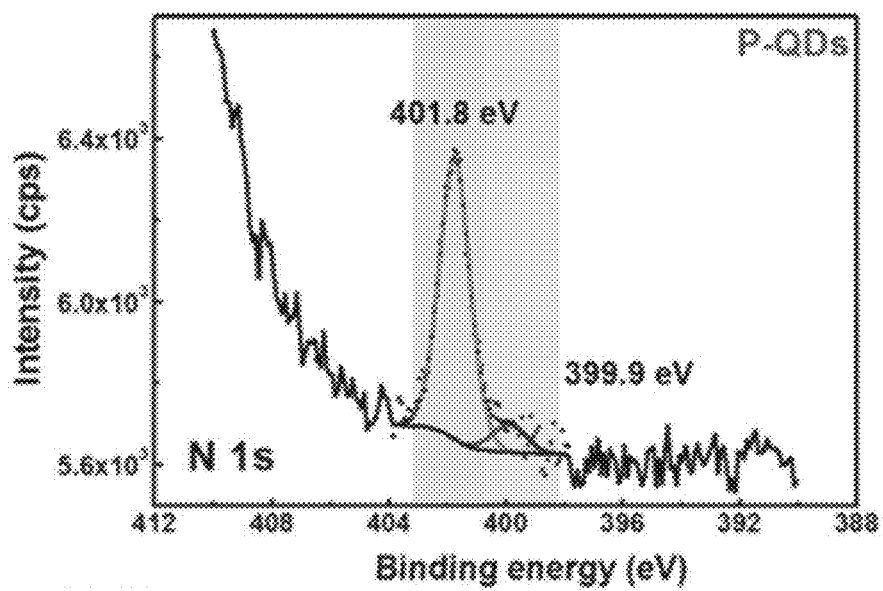
Figure 39C:
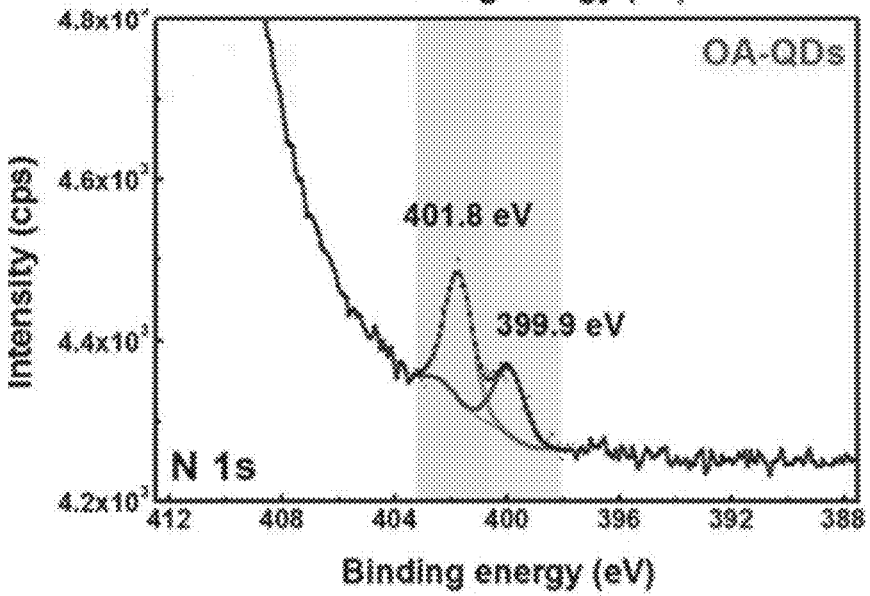
Figure 39D:
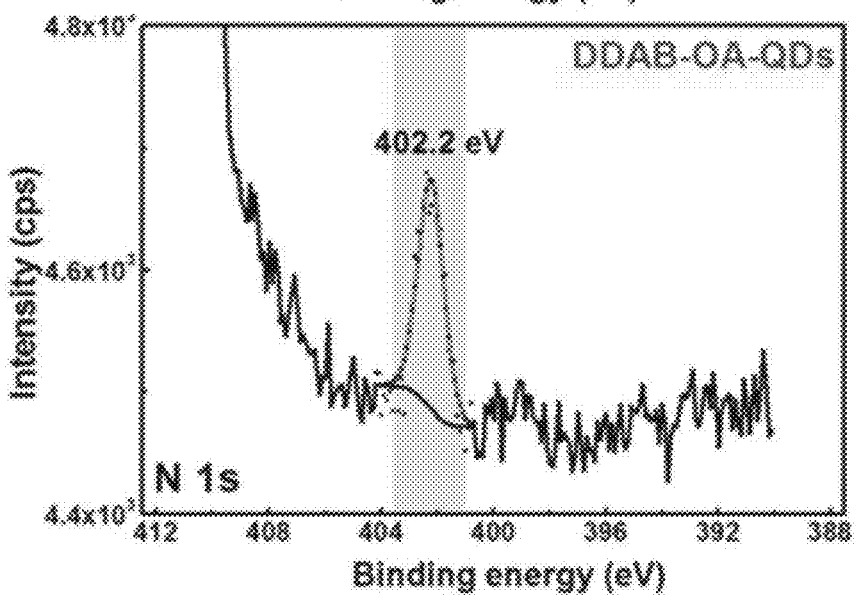
Figure 46:
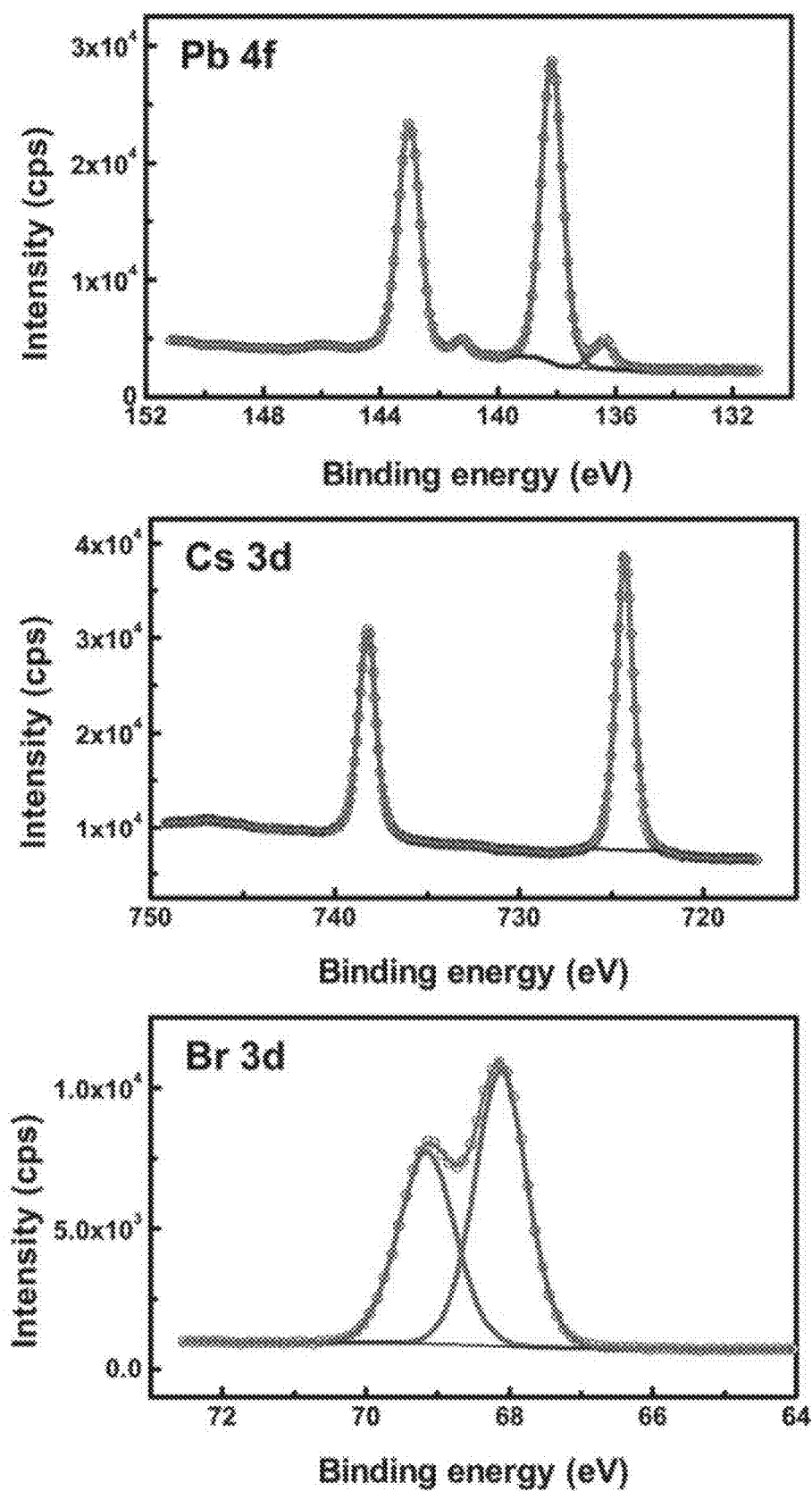
FIG. 46 shows the XPS spectra of P-QDs for the Pb (4f), Cs (3d) and Br (3d) orbitals as marked in the figure respectively.

We also probed into the surface composition of all of the QD samples using XPS. The representative survey spectrum of P-QDs confirms the presence of Cs, Pb, Br, C, N, and O elements (FIG. 39A).[39] No significant changes were observed for the Cs 3d, Pb 4f, Br 3d core levels spectra for the three samples (FIG. 46), yet the high-resolution spectra of the N 1s core level obtained from the three samples show noticeable changes (FIGS. 39B-39D). The N 1s core level for P-QDs was fitted with two components at 399.9 eV and 401.8 eV. The dominant peak at 401.8 eV corresponds to protonated amine groups (—$NH_3+$) while the peak at 399.9 eV is attributed to amine groups.[40,41] The N 1s core level for OA-QDs was fitted with similar components with reduced intensity. The existence of two N 1s core level suggested several equilibria from ammonium to amine that could exist.[34] However, the N 1s core level for DDAB-OA-QDs was fitted with a single peak at 402.2 eV corresponding to tert-ammonium cations from di-dodecyl dimethylammonium bromide.[42,43]

Figure 40:
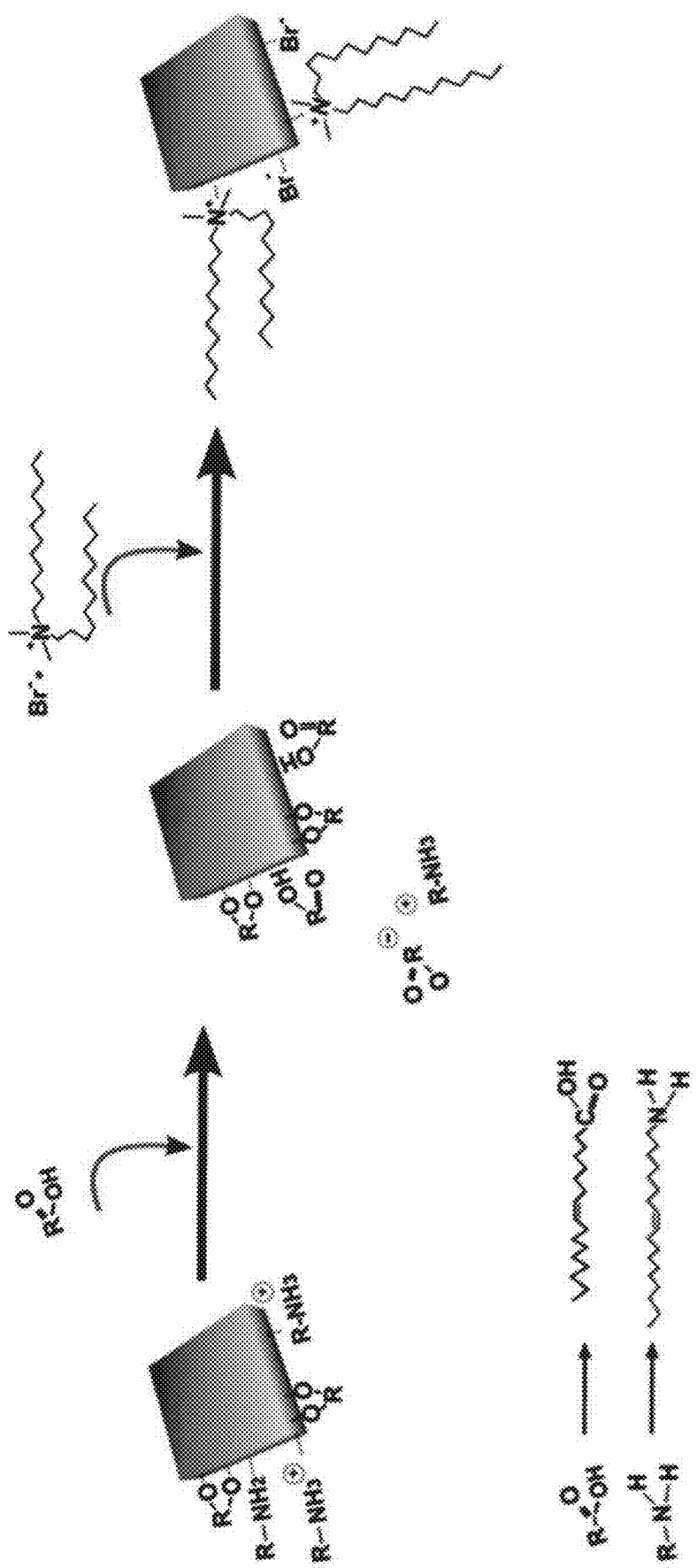
FIG. 40 displays the ligand exchange mechanism on the CsPbBr$_3$ QD surface.
Figure 47:
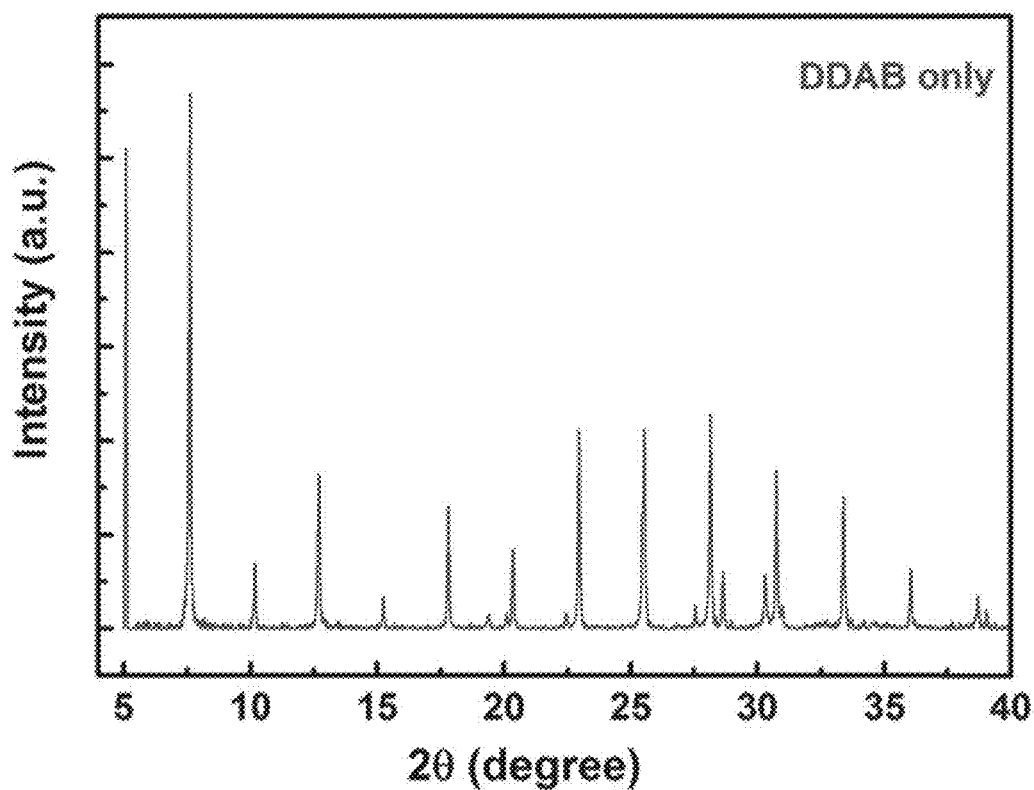
FIG. 47 shows the XRD pattern of the precipitate from only DDAB treated QDs after 2.5 h.
Figure 48:
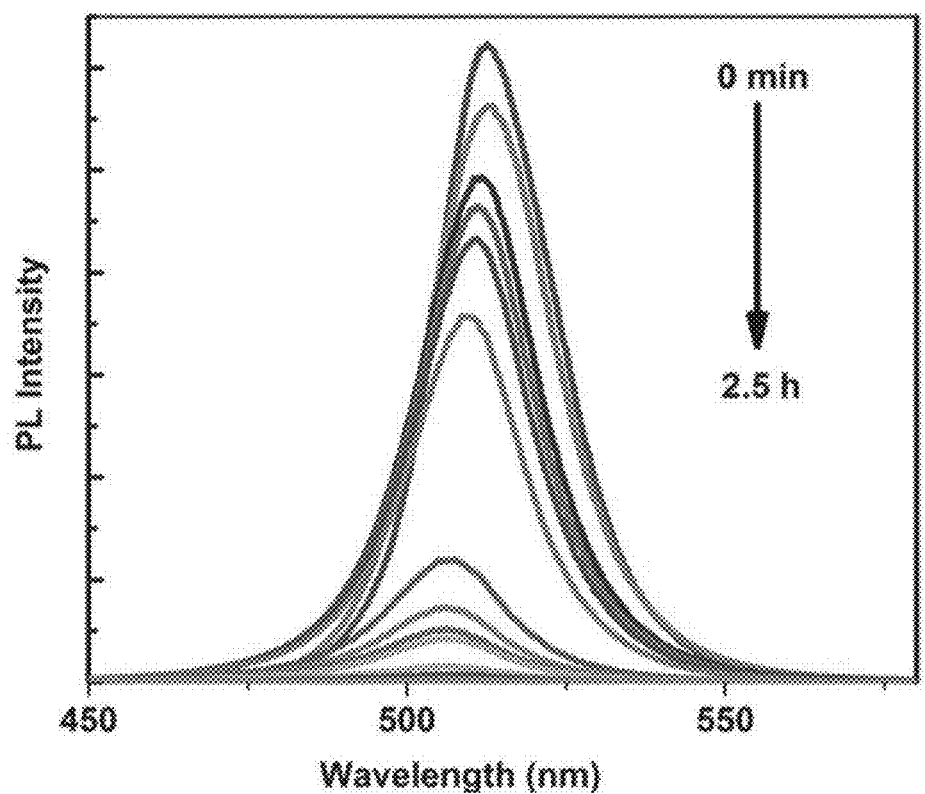
FIG. 48 shows time-dependent PL spectra for only DDAB treated QDs.
Figure 49A:
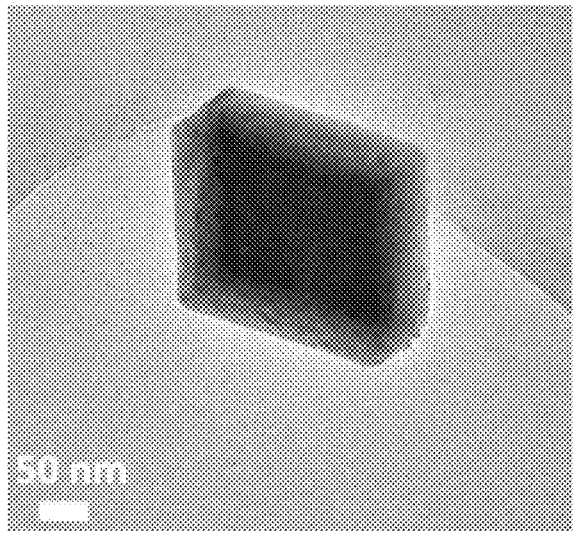
FIGS. 49A-49D are TEM images the QDs with DDAB treatment after (FIG. 49A) 2.5 h and (FIG. 49B) from supernatant.
Figure 49B:
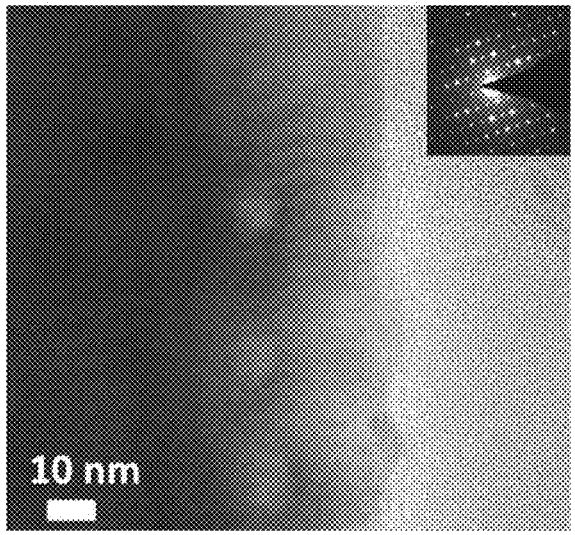
Figure 49C:
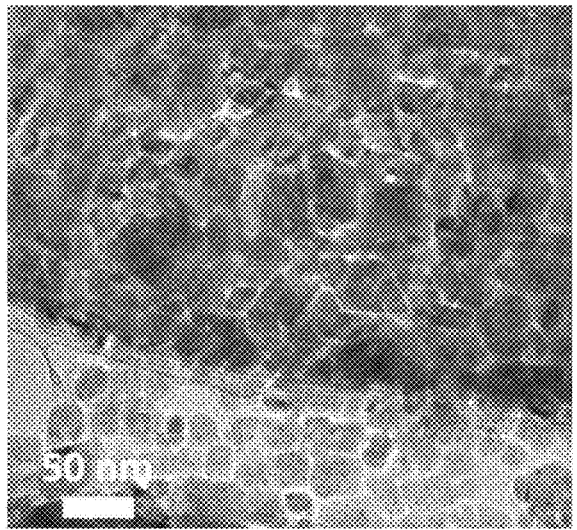
Figure 49D:
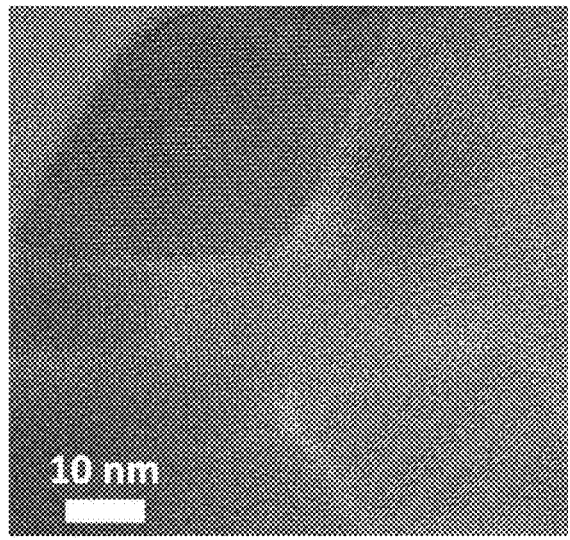

Combining the above analysis, we hypothesize that the acidic protons facilitate the removal of the OAm ligand by protonation. The protonated OAm ligands subsequently form acid-base complex with deprotonated OA groups,[36,37] and promote the coordination of the Br anions with the positively charged surface metal centers ($Cs^+$ or $Pb^{2+}$), as schematically illustrated in FIG. 40, while the existence of $DDA^+$ on the QD surface helps to maintain their solubility in toluene. It is important to note that the intermediate process of adding excess amount of OA ligands in our two-step ligand exchange procedure is vital to avoid the formation of 2D quantum wells of $(OAm)PbBr_4$ (FIG. 47),[44] likely through a protonation salt formation process. This is further confirmed by the time-dependent decrement in PL intensity of the as-synthesized P-QDs (FIG. 48) and clear morphological change from well-defined cubic shapes to larger plate-like structures (FIGS. 49A-49D).

Figure 41A:
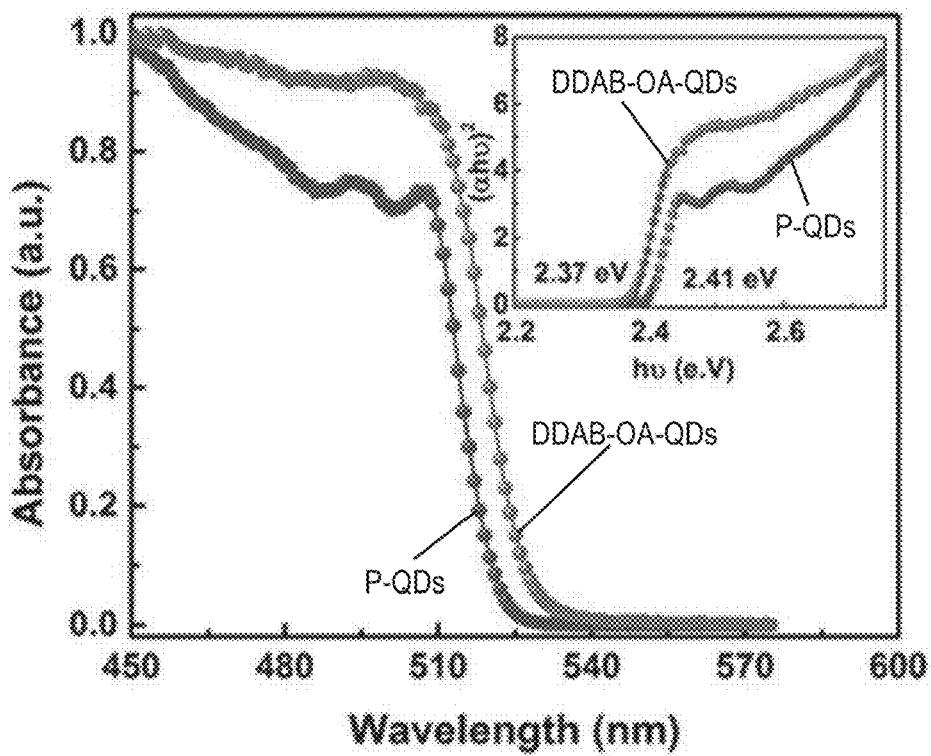
FIG. 41A-41D shows the thin film absorption spectra with inset showing the Tauc plot for band gap estimations of P-QDs and DDAB-OA-QDs.
Figure 41B:
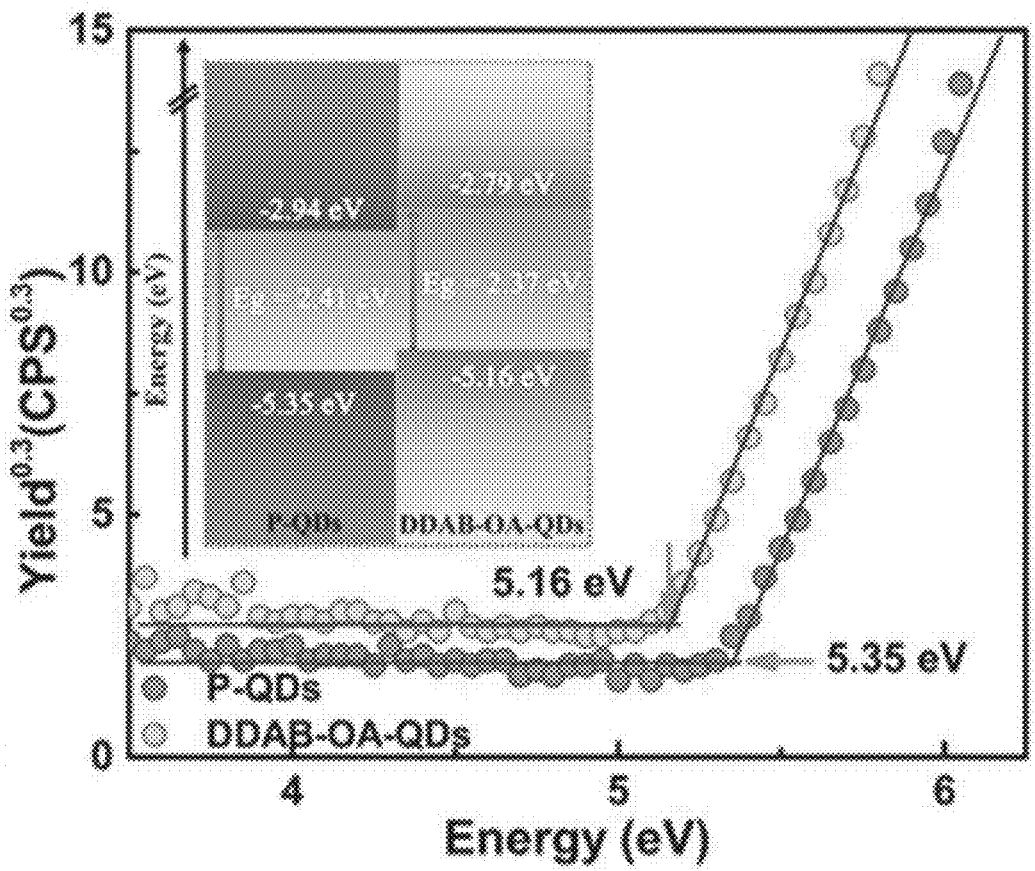
Figure 41C:
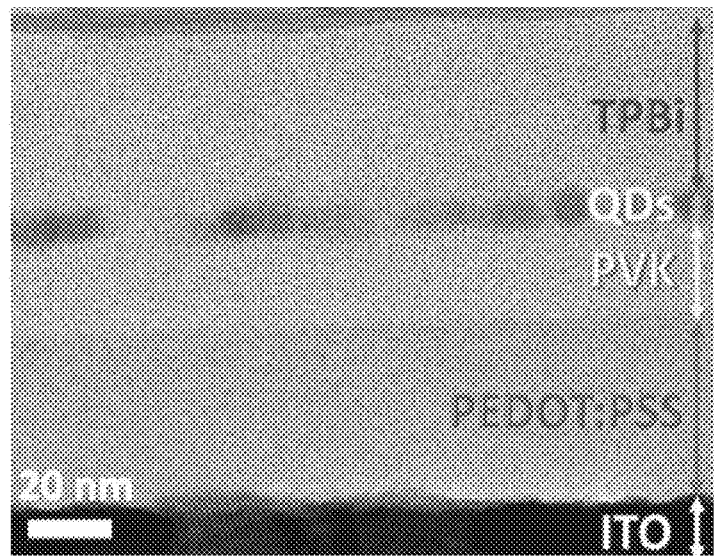
Figure 41D:
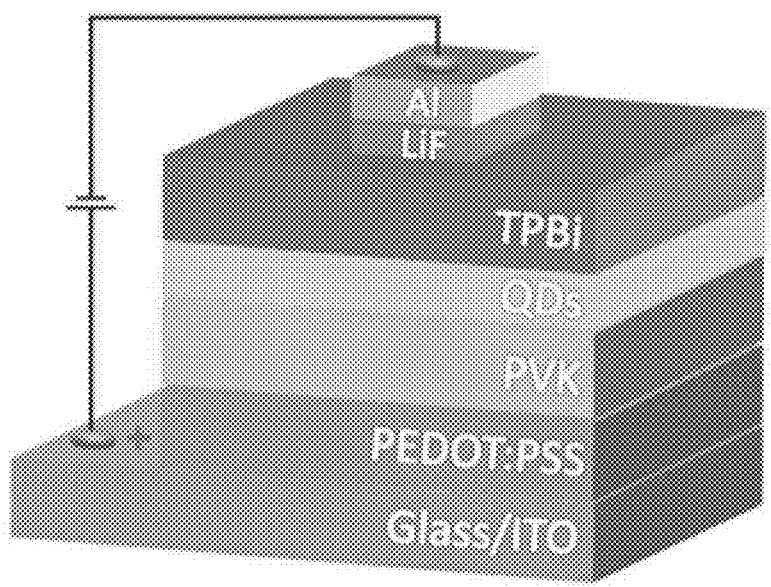
Figure 50A:
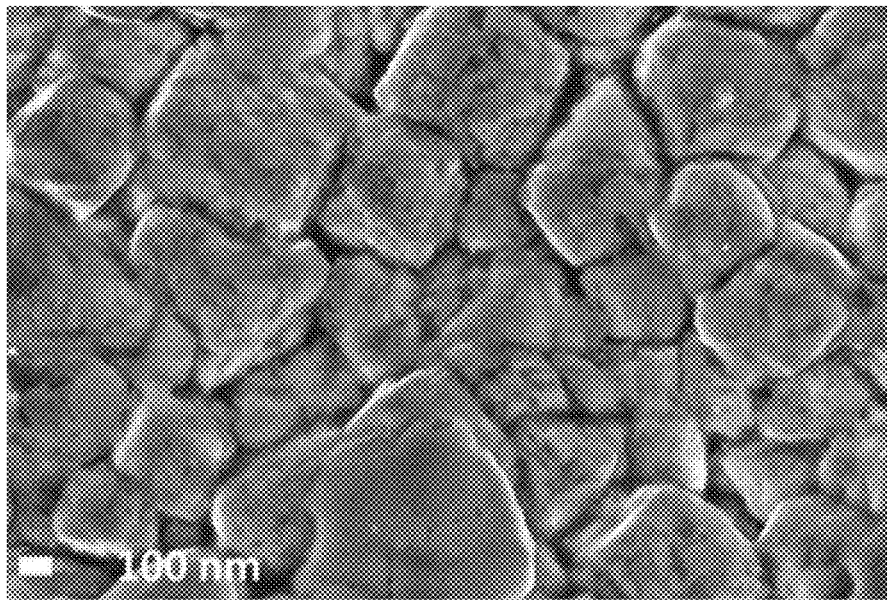
FIGS. 50A-50B are SEM images showing the surface morphology of spin-coated thin films of (FIG. 50A) P-QDs and (FIG. 50B) DDAB-OA-QDs.
Figure 50B:
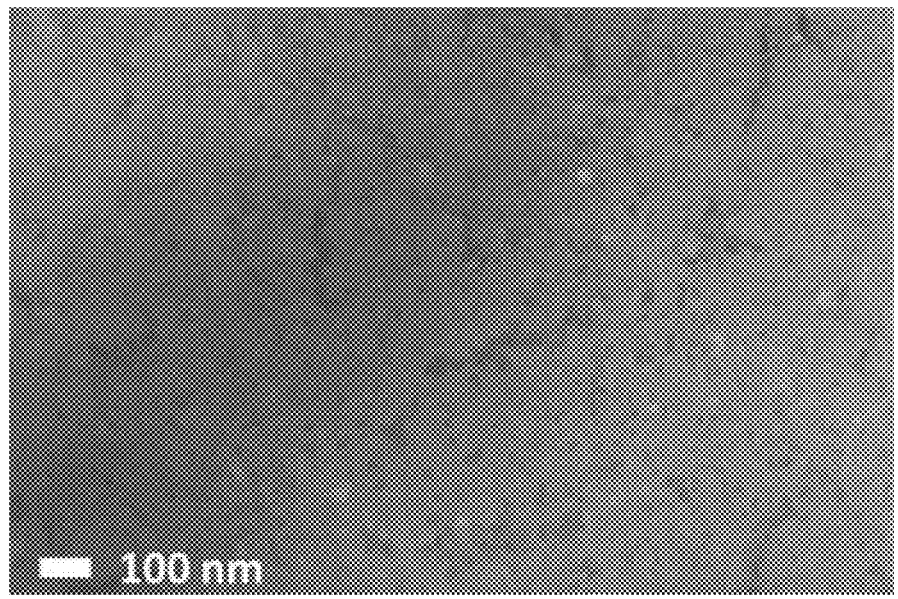

The surface morphology of the spin-coated thin films of P-QDs and DDAB-OA-QDs exhibit the densely packed surfaces over larger areas (FIGS. 50A-50B). The P-QDs film showed larger grains compared to the DDAB-OA-QDs films further confirming the effect of surface-treatment in stabilizing the QDs. More importantly, the smoother films obtained in the case of DDAB-OA-QDs samples can correspond to the passivation of surface trap states as observed from the UV-Vis absorption spectra. The absorbance measurements carried out on QDs used for device fabrication are shown in FIGS. 41A-41D. Band gaps estimated from the Tauc plots (FIG. 41A inset) showed a slight change of 0.04 eV upon treatment with OA and DDAB. The energy levels (conduction/valence band) estimated from the PESA measurement and band gaps respectively shown in FIG. 41B are of interest for optoelectronic engineering of PeLEDS. These all-inorganic PeLED devices were characterized using the cross-section TEM (FIG. 41C) where the multiple layers are arranged in the sequential order: indium tin oxide (ITO), poly(ethylene dioxythiophene):polystyrene sulfonate (PEDOT:PSS, 40 nm), poly(9-vinlycarbazole) (PVK, 20 nm), perovskite QDs (8 nm), 2,2',2"-(1, 3, 5-benzenetriyl) tris-[1-phenyl-1H-benzimidazole] (TPBi, 42 nm), and LiF/Al (10/100 nm). PVK is used as a hole-transporting and electron-blocking layer while TPBi is employed as an electron-transporting layer. The PVK layer reduces the hole-injection barrier, blocks the electrons in the active layer, and hence allow the holes and electrons to recombine effectively in the QD emitting layer.[21] The complete device architecture used for the current study of is shown schematically in FIG. 41D.

Figure 42A:
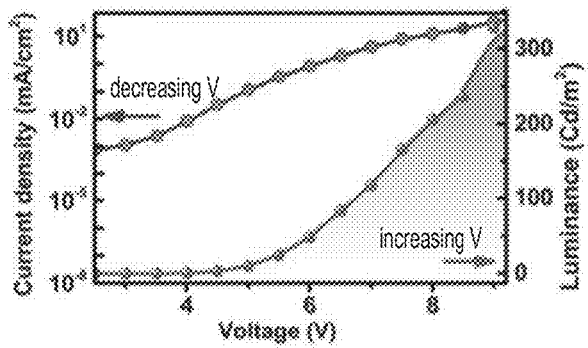
FIGS. 42A-42F illustrate green (CsPbBr$_3$) PeLED device performance.
Figure 42D:
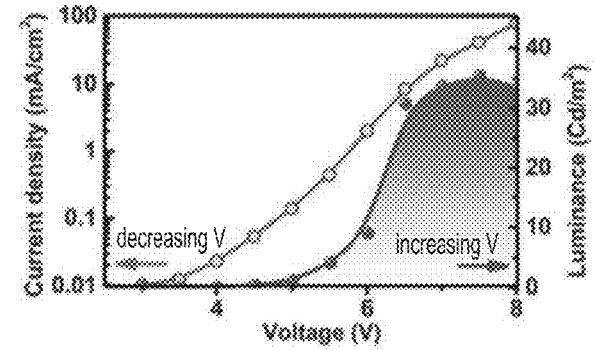
Figure 42B:
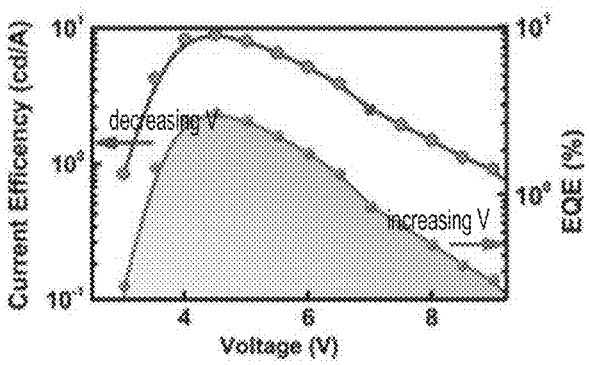
Figure 42E:
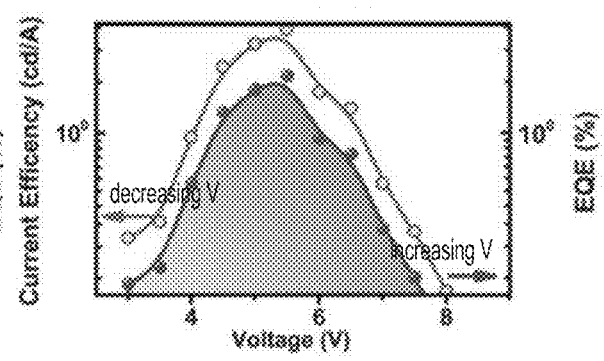
Figure 42C:
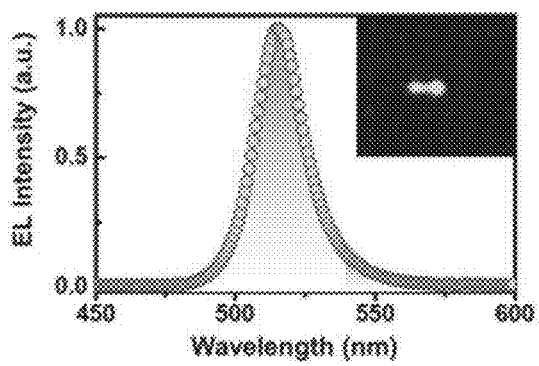
Figure 51A:
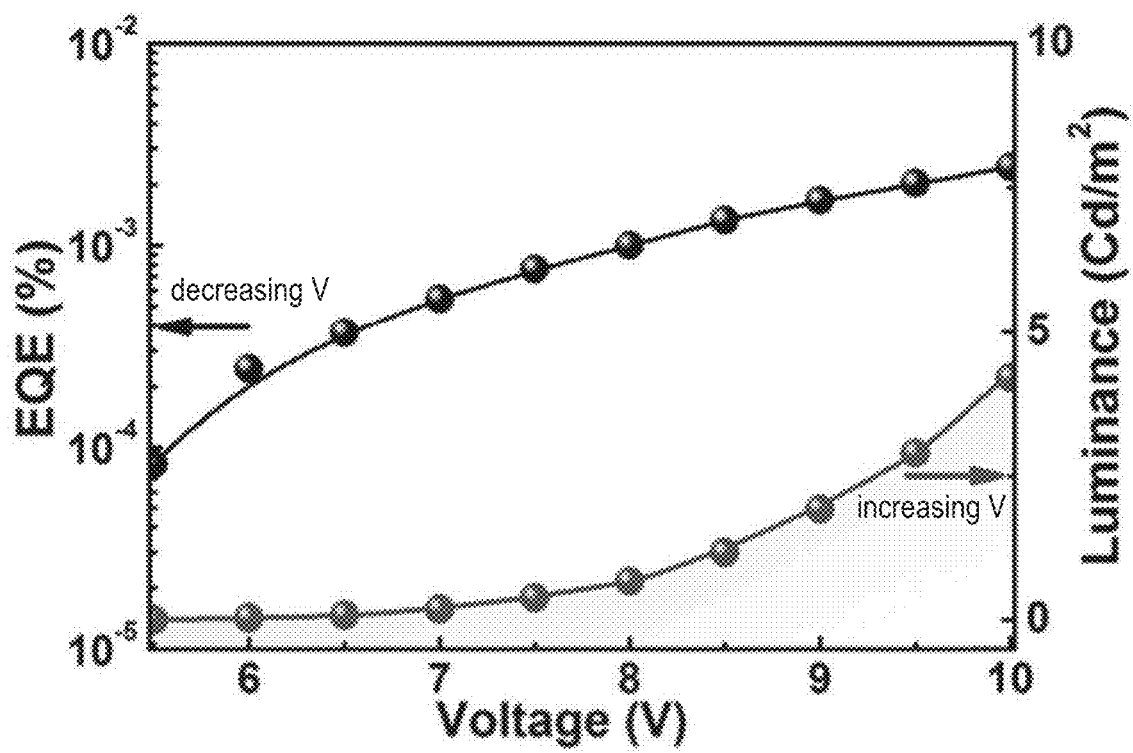
FIGS. 51A-51B illustrate performance of control device using P-QDs as emitting layer.
Figure 51B:
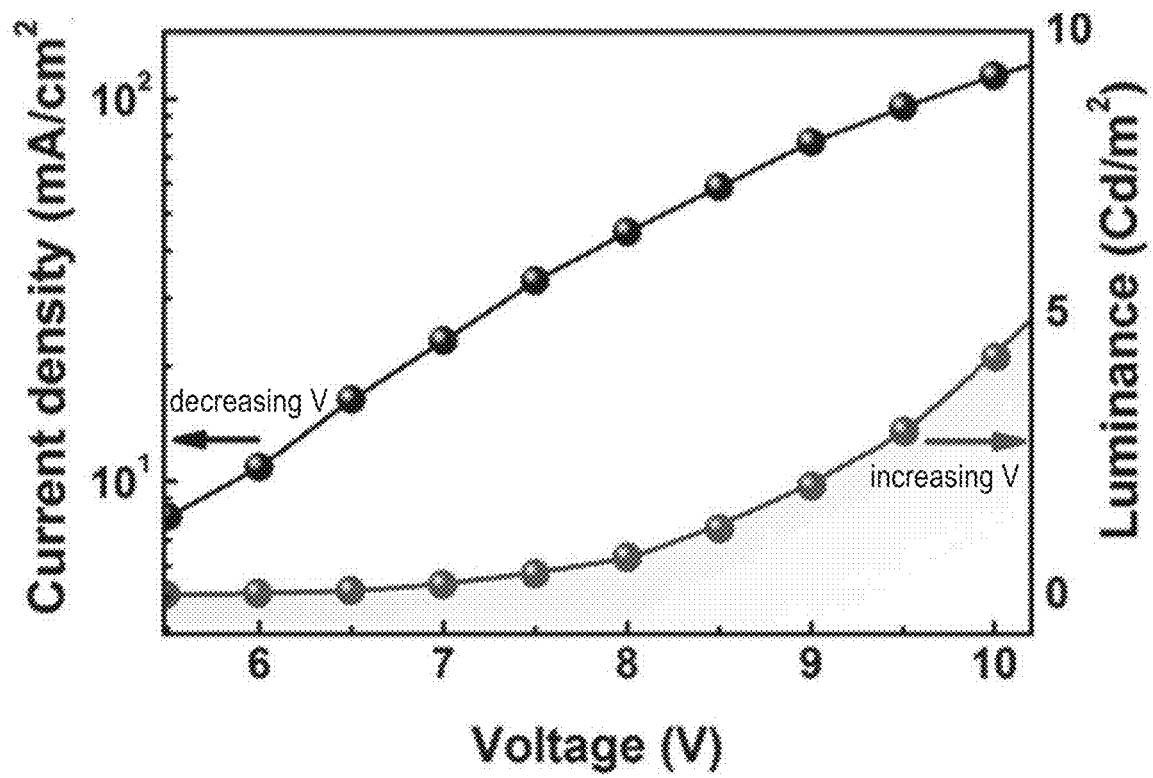

The current density-luminance-voltage (J-L-V) characteristic of the PeLEDs based on the typical green $CsPbBr_3$ QDs (DDAB-OA-QDs) is presented in FIG. 42A. The turn-on voltage for the PeLED device is 3.0 V, significantly lower than that of the PeLED based on untreated QDs (P-QDs) as emitting layer (FIG. 51A-51B), indicating that an efficient, barrier-free charge injection into the QD emitters was achieved.[45,46] The luminance intensifies as the voltage increase, achieving the maximum value of 330 cd $m^{-2}$ under a forward bias of 9 V. The current efficiency (CE) and EQE as a function of voltage for a typical green PeLEDs are shown in FIG. 42B. At the voltage of 7.5 V, a peak EQE value of 0.65% was reached with a luminance of 165 cd $m^{-2}$, while an EQE of 0.001% with a luminance of 0.38 cd $m^{-2}$ was achieved for the control device using P-QDs as emitting layer (FIGS. 51A-51B). The large enhancement in EQE indicates that the charge carrier balance in the QDs layer was significantly improved due to the use of halide ion pair ligands for passivation. The normalized electroluminescence spectrum (EL) of the QLEDs is shown in FIG. 42C. The device gives an emission peak at 515 nm with a very narrow emission peak with full-width wavelength at half maximum (FWHM) of 19 nm, which is attributed to the narrow band-edge emission of QDs with a slightly red-shifted emission compared with the PL spectrum acquired from the QD solution. Strikingly, the parasitic emission originated from the charge transport layers (i.e., TPBi or PVK) was undetectable in the entire EL spectrum under various voltages, indicating good electron and hole blocking functions of both PVK and TPBi layers. The devices emit bright and uniform green light from the whole pixel under a bias of 5 V as shown in the inset in FIG. 42C.

Figure 42F:
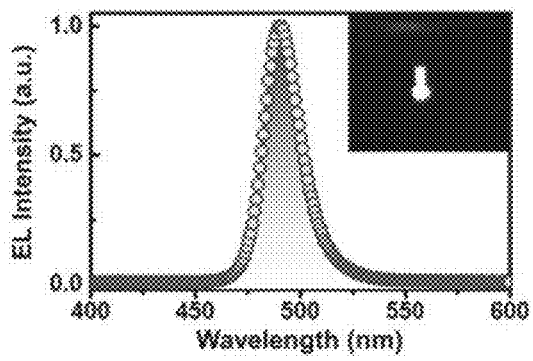

The blue PeLED devices were fabricated by using the same architecture of ITO/PEDOT:PSS/PVK/QDs/TPBi/LiF/Al, wherein the blue QDs were fabricated via an anion exchange strategy[47,48] by treating the P-QDs with a mixed halide ion pair ligand (di-dodecyl dimethyl ammonium bromide chloride, DDABC, see experimental section). The J-L-V characteristic of the blue PeLEDs ($CsPbBr_xCl_{3-x}$) is presented in FIG. 42D. The turn-on voltage (calculated at a luminance of 1 cd $m^{-2}$) required for the blue PeLED device is 3.0 V, lower than the previous reported PeLED value,[21] also employing an efficient and barrier-free charge injection into the QD emitters.[45,46] The electroluminescence intensifies as the voltage is increased, which leads to the maximum value of 35 cd $m^{-2}$ under the applied voltage of 7.5 V (FIG. 42E). The performance of these APQD LEDs can be further optimized in the future by controlling the crystal phase, balancing charge transport, improving PL efficiency, as well as by other short ligand replacement. The normalized EL spectra of blue PeLEDs with emission wavelength peaks at 490 nm (FWHM=19 nm) is shown in FIG. 42F. The devices exhibited a saturated and pure color as shown in the insert image of FIG. 42F.

In summary, we demonstrated a two-step ligand exchange process for passivating $CsPbX_3$ (X=Br, Cl) QDs with halide and mixed halide ion pairs. Blue and green PeLEDs based on the passivated $CsPbX_3$ QDs displayed a sharp EL peak (FWHM=19 nm) with a maximum luminance of 35 cd $m^{-2}$ for the blue and 330 cd $m^{-2}$ for the green. The resultant PeLEDs' performance demonstrates that complete ligand exchange by desorption of protonated OAm and subsequent treatment with a halide ion pair ligand improves charge carrier balance and device EQE. Our findings pave the way for the development of PeLEDs of high EQE and high luminescence based on stable inorganic perovskite QDs.

EXPERIMENTAL

Materials 1-butanol (BuOH, HPLC grade), was purchased from Fisher Scientific. Oleic acid (OA, technical grade 90%), lead bromide ($PbBr_2$, 98%) and octane (98%) were purchased from Alpha Aesar. Cesium carbonate ($Cs_2CO_3$, 99.995%, metal basis), didodecyldimethylammonium chloride (DDAC, 98%), didodecyldimethylammonium bromide (DDAB, 98%), oleylamine (OAm, technical grade 70%), and 1-octadecene (ODE, technical grade 90%) were purchased from Sigma-Aldrich. Toluene (HPLC grade) was purchased from Honeywell Burdick & Jackson. All chemicals were used as procured without further purification.

Preparation of Cesium Oleate Solution $Cs_2CO_3$ (0.814 g) was loaded into 100 mL 2-neck flask along with ODE (30 mL) and oleic acid (2.5 mL), dried for 1 h at 120° C., and then heated under $N_2$ to 160° C. until all $Cs_2CO_3$ reacted with OA. The solution was kept at 160° C. to avoid solidification before injection.

Synthesis and Purification of $CsPbBr_3$ QDs[24]

100 mL of octadecene (ODE), 10 mL of OAm, 10 mL of OA, and $PbBr_2$ (1.38 g) were loaded into a 250 mL flask, degassed at 120° C. for 30 min and heated to 180° C. under nitrogen flow. 8 mL of cesium oleate solution (0.08 M in ODE) was quickly injected. After 5 s, the reaction mixture was cooled using an ice-water bath. The crude solution was directly centrifuged at 8000 rpm for 10 min, the precipitate was collected and dispersed in toluene. One more centrifugation was required for purifying the final QDs.

Treatment of $CsPbBr_3$ QDs 1 mL of the purified $CsPbBr_3$ QDs (15 mg/mL), 50 μL of OA was added under stirring, then added 100 μL DDAB toluene solution (0.05 M). The mixture solution was precipitated with BuOH after centrifugation and redissolved in 2 ml of octane. For the blue QDs ($CsPbBr_xCl_{3-x}$), a similar treatment procedure was applied except a mixed halide ion pair ligand (3 ml 0.005M KBr aqueous solution mixed with 3 ml 0.05 M DDAC toluene solution, top layer solution was collected after centrifugation).

Device Fabrication

PEDOT:PSS solutions (Clevios™ PVP Al4083, filtered through a 0.45 μm filter) were spin-coated onto the ITO-coated glass substrates at 4000 rpm for 60 s and baked at 140° C. for 15 min. The hole transporting and electron blocking layer were prepared by spin-coating PVK chlorobenzene solution (concentration: 6 mg $mL^{-1}$) at 4000 rpm for 60 s. Perovskite QDs were deposited by spin-coating at 2000 rpm for 60 s in air. TPBi (40 nm) and LiF/Al electrodes (1 nm/100 nm) were deposited using a thermal evaporation system through a shadow mask under a high vacuum of $2*10^4$ Pa. The device active area was 6.14 $mm^2$ as defined by the overlapping area of the ITO and Al electrodes. All the device tests were done under ambient condition.

Characterization

UV-Vis absorption spectra were obtained using an absorption spectrophotometer from Ocean Optics. Carbon, hydrogen, oxygen, and sulfur analysis was performed using a Flash 2000 elemental analyzer (Thermo Fischer Scientific). Photoluminescence was tested using an FLS920 dedicated fluorescence spectrometer from Edinburgh Instruments. Quantum yield was measured using an Edinburgh Instruments integrating sphere with an FLS920-s fluorescence spectrometer. FTIR was performed using a Nicolet 6700 FT-IR spectrometer. Powder X-ray diffraction (XRD) patterns were recorded using Siemens diffractometer with Cu Kα radiation (λ=1.54178 Å). TEM analysis was carried out with a Titan™ TEM (FEI Company) operating at a beam energy of 300 keV and equipped with a Tridiem™ post-column energy filter (Gatan, IQD.). The SEM investigations were carried out on the Carl Zeiss, Gemini column FESEM. Photoelectron spectroscopy in air (PESA) measurements were carried out on the thin film samples, using a Riken Photoelectron Spectrometer (Model AC-2). The power number was set at 0.3. XPS studies were carried out in a Kratos Axis Ultra DLD spectrometer equipped with a monochromatic Al Kα X-ray source (hv=1486.6 eV) operating at 150 W, a multi-channel plate and delay line detector under $1.0\times10^{-9}$ Torr vacuum. Measurements were performed in hybrid mode using electrostatic and magnetic lenses, and the take-off angle (angle between the sample surface normal and the electron optical axis of the spectrometer) was 0°. All spectra were recorded using an aperture slot of 300 μm×700 μm. The survey and high-resolution spectra were collected at fixed analyzer pass energies of 160 and 20 eV, respectively. Samples were mounted in floating mode in order to avoid differential charging[49]. Charge neutralization was required for all samples. Binding energies were referenced to the C 1s peak (set at 284.8 eV) of the sp3 hybridized (C—C) carbon from oleyalmine and oleic acid. The data were analyzed with commercially available software, CasaXPS. The individual peaks were fitted by a Gaussian (70%)-Lorentzian (30%) (GL30) function after linear or Shirley-type background subtraction. The EL spectra and luminance (L)—current density (J)—voltages (V) characteristics were collected by using a Keithley 2400 source, a calibrated luminance meter (Konica Minolta LS-110), and a PR-705 SpectraScan spectrophotometer (Photo Research) in the air and at room temperature. Zeta potential measurements were performed using a Zetasizer Nano-ZS (Malvern Instruments). Each sample was measured 5 times and the average data was presented.

REFERENCES FOR EXAMPLE 3

(1) Lee, M. M.; Teuscher, J.; Miyasaka, T.; Murakami, T. N.; Snaith, H. J. *Science* 2012, 338, 643.
(2) Luo, J.; Im, J. H.; Mayer, M. T.; Schreier, M.; Nazeeruddin, M. K.; Park, N. G.; Tilley, S. D.; Fan, H. J.; Gratzel, M. *Science* 2014, 345, 1593.
(3) Jeon, N. J.; Noh, J. H.; Yang, W. S.; Kim, Y. C.; Ryu, S.; Seo, J.; Seok, S. I. *Nature* 2015, 517, 476.

(4) Xing, G.; Mathews, N.; Lim, S. S.; Yantara, N.; Liu, X.; Sabba, D.; Gratzel, M.; Mhaisalkar, S.; Sum, T. C. *Nat. Mater.* 2014, 13, 476.
(5) Sutherland, B. R.; Hoogland, S.; Adachi, M. M.; Wong, C. T. O.; Sargent, E. H. *ACS Nano* 2014, 8, 10947.
(6) Zhu, H.; Fu, Y.; Meng, F.; Wu, X.; Gong, Z.; Ding, Q.; Gustafsson, M. V.; Trinh, M. T.; Jin, S.; Zhu, X. Y. *Nat. Mater.* 2015, 14, 636.
(7) Dou, L.; Yang, Y.; You, J.; Hong, Z.; Chang, W. H.; Li, G.; Yang, Y. *Nat. Commun.* 2014, 5, 5404.
(8) Zhuo, S.; Zhang, J.; Shi, Y.; Huang, Y.; Zhang, B. *Angew. Chem., Int. Ed.* 2015, 54, 5693.
(9) Maculan, G.; Sheikh, A. D.; Abdelhady, A. L.; Saidaminov, M. I.; Hague, M. A.; Murali, B.; Alarousu, E.; Mohammed, O. F.; Wu, T.; Bakr, M. O. *J. Phys. Chem. Lett.* 2015, 6, 3781.
(10) Stranks, S. D.; Snaith, H. J. *Nat. Nanotechnol.* 2015, 10, 391.
(11) Dai, X.; Zhang, Z.; Jin, Y.; Niu, Y.; Cao, H.; Liang, X.; Chen, L.; Wang, J.; Peng, X. *Nature* 2014, 515, 96.
(12) Mashford, B. S.; Stevenson, M.; Popovic, Z.; Hamilton, C.; Zhou, Z.; Breen, C.; Steckel, J.; Bulovic, V.; Bawendi, M.; Coe-Sullivan, S.; Kazlas, P. T. *Nat Photon* 2013, 7, 407.
(13) Yang, Y.; Zheng, Y.; Cao, W.; Titov, A.; Hyvonen, J.; MandersJesse, R.; Xue, J.; Holloway, P. H.; Qian, L. *Nat Photon* 2015, 9, 259.
(14) Tan, Z. K.; Moghaddam, R. S.; Lai, M. L.; Docampo, P.; Higler, R.; Deschler, F.; Price, M.; Sadhanala, A.; Pazos, L. M.; Credgington, D.; Hanusch, F.; Bein, T.; Snaith, H. J.; Friend, R. H. *Nat. Nanotechnol.* 2014, 9, 687.
(15) Li, G.; Tan, Z. K.; Di, D.; Lai, M. L.; Jiang, L.; Lim, J. H. W.; Friend, R. H.; Greenham, N. C. *Nano Lett.* 2015, 15, 2640.
(16) Cho, H.; Jeong, S.-H.; Park, M.-H.; Kim, Y.-H.; Wolf, C.; Lee, C.-L.; Heo, J. H.; Sadhanala, A.; Myoung, N.; Yoo, S.; Im, S. H.; Friend, R. H.; Lee, T.-W. *Science* 2015, 350, 1222.
(17) Kulbak, M.; Cahen, D.; Hodes, G. *J. Phys. Chem. Lett.* 2015, 6, 2452.
(18) Dualeh, A.; Gao, P.; Seok, S. I.; Nazeeruddin, M. K.; Grätzel, M. *Chem. Mater.* 2014, 26, 6160.
(19) Baikie, T.; Fang, Y.; Kadro, J. M.; Schreyer, M.; Wei, F.; Mhaisalkar, S. G.; Graetzel, M.; White, T. J. *J. Mater. Chem. A* 2013, 1, 5628.
(20) Protesescu, L.; Yakunin, S.; Bodnarchuk, M. I.; Krieg, F.; Caputo, R.; Hendon, C. H.; Yang, R. X.; Walsh, A.; Kovalenko, M. V. *Nano Lett.* 2015, 15, 3692.
(21) Song, J.; Li, J.; Li, X.; Xu, L.; Dong, Y.; Zeng, H. *Advanced Materials* 2015, 27, 7162.
(22) Tang, J.; Kemp, K. W.; Hoogland, S.; Jeong, K. S.; Liu, H.; Levina, L.; Furukawa, M.; Wang, X.; Debnath, R.; Cha, D.; Chou, K. W.; Fischer, A.; Amassian, A.; Asbury, J. B.; Sargent, E. H. *Nat Mater* 2011, 10, 765.
(23) Ning, Z.; Voznyy, O.; Pan, J.; Hoogland, S.; Adinolfi, V.; Xu, J.; Li, M.; Kirmani, A. R.; Sun, J.-P.; Minor, J.; Kemp, K. W.; Dong, H.; Rollny, L.; Labelle, A.; Carey, G.; Sutherland, B.; Hill, I.; Amassian, A.; Liu, H.; Tang, J.; Bakr, O. M.; Sargent, E. H. *Nat Mater* 2014, 13, 822.
(24) Pan, J.; Sarmah, S. P.; Murali, B.; Dursun, I.; Peng, W.; Parida, M. R.; Liu, J.; Sinatra, L.; Alyami, N.; Zhao, C.; Alarousu, E.; Ng, T. K.; Ooi, B. S.; Bakr, O. M.; Mohammed, O. F. *The Journal of Physical Chemistry Letters* 2015, 6, 5027.
(25) Stoumpos, C. C.; Malliakas, C. D.; Peters, J. A.; Liu, Z.; Sebastian, M.; Im, J.; Chasapis, T. C.; Wibowo, A. C.; Chung, D. Y.; Freeman, A. J.; Wessels, B. W.; Kanatzidis, M. G. *Cryst. Growth Des.* 2013, 13, 2722.
(26) Bekenstein, Y.; Koscher, B. A.; Eaton, S. W.; Yang, P.; Alivisatos, A. P. *Journal of the American Chemical Society* 2015.
(27) Nag, A.; Kovalenko, M. V.; Lee, J.-S.; Liu, W.; Spokoyny, B.; Talapin, D. V. *Journal of the American Chemical Society* 2011, 133, 10612.
(28) Lu, X.; Tuan, H.-Y.; Chen, J.; Li, Z.-Y.; Korgel, B. A.; Xia, Y. *Journal of the American Chemical Society* 2007, 129, 1733.
(29) Maria Chong, A. S.; Zhao, X. S. *The Journal of Physical Chemistry B* 2003, 107, 12650.
(30) Huang, H. Y.; Yang, R. T.; Chinn, D.; Munson, C. L. *Industrial & Engineering Chemistry Research* 2003, 42, 2427.
(31) Bixner, O.; Lassenberger, A.; Baurecht, D.; Reimhult, E. *Langmuir* 2015, 31, 9198.
(32) Bronstein, L. M.; Huang, X.; Retrum, J.; Schmucker, A.; Pink, M.; Stein, B. D.; Dragnea, B. *Chemistry of Materials* 2007, 19, 3624.
(33) Harris, R. A.; Shumbula, P. M.; van der Walt, H. *Langmuir* 2015, 31, 3934.
(34) De Roo, J.; Ibanez, M.; Geiregat, P.; Nedelcu, G.; Walravens, W.; Maes, J.; Martins, J. C.; Van Driessche, I.; Kovalenko, M. V.; Hens, Z. *ACS Nano* 2016, 10, 2071.
(35) Yang, K.; Peng, H.; Wen, Y.; Li, N. *Applied Surface Science* 2010, 256, 3093.
(36) Kim, S. B.; Cai, C.; Kim, J.; Sun, S.; Sweigart, D. A. *Organometallics* 2009, 28, 5341.
(37) Dong, A.; Ye, X.; Chen, J.; Kang, Y.; Gordon, T.; Kikkawa, J. M.; Murray, C. B. *Journal of the American Chemical Society* 2011, 133, 998.
(38) Owen, J. S.; Park, J.; Trudeau, P.-E.; Alivisatos, A. P. *Journal of the American Chemical Society* 2008, 130, 12279.
(39) Li, X.; Wu, Y.; Zhang, S.; Cai, B.; Gu, Y.; Song, J.; Zeng, H. *Advanced Functional Materials* 2016, 26, 2584.
(40) Liao, B.; Long, P.; He, B.; Yi, S.; Ou, B.; Shen, S.; Chen, J. *Journal of Materials Chemistry C* 2013, 1, 3716.
(41) Yang, D. Q.; Meunier, M.; Sacher, E. *Applied Surface Science* 2005, 252, 1197.
(42) Bakshi, M. S.; Sachar, S.; Kaur, G.; Bhandari, P.; Kaur, G.; Biesinger, M. C.; Possmayer, F.; Petersen, N. O. *Crystal Growth & Design* 2008, 8, 1713.
(43) Leng, Y.; Li, Y.; Gong, A.; Shen, Z.; Chen, L.; Wu, A. *Langmuir* 2013, 29, 7591.
(44) Koutselas, I.; Bampoulis, P.; Maratou, E.; Evagelinou, T.; Pagona, G.; Papavassiliou, G. C. *The Journal of Physical Chemistry C* 2011, 115, 8475.
(45) Bae, W. K.; Park, Y. S.; Lim, J.; Lee, D.; Padilha, L. A.; McDaniel, H.; Robel, I.; Lee, C.; Pietryga, J. M.; Klimov, V. I. *Nat Commun* 2013, 4, 2661.
(46) Zhang, X.; Lin, H.; Huang, H.; Reckmeier, C.; Zhang, Y.; Choy, W. C. H.; Rogach, A. L. *Nano Letters* 2016, 16, 1415.
(47) Akkerman, Q. A.; D'Innocenzo, V.; Accornero, S.; Scarpellini, A.; Petrozza, A.; Prato, M.; Manna, L. *Journal of the American Chemical Society* 2015, 137, 10276.
(48) Nedelcu, G.; Protesescu, L.; Yakunin, S.; Bodnarchuk, M. I.; Grotevent, M. J.; Kovalenko, M. V. *Nano Letters* 2015, 15, 5635.
(49) Mori, Y.; Tanemura, M.; Tanemura, S. *Applied Surface Science* 2004, 228, 292.

Supplemental Information:
When the P-QDs were mixed with DDAB directly, XRD spectrum reveals the definite formation of a single lamellar compound (shown in FIG. 47), which is consistent with the previous report. The QDs PL intensity decreased continuously together with a blueshift of PL peak position with time until it reached 506 nm, and the emission color disappeared after 2.5 h. (FIG. 48) Possibly due to the free oleyamine (OAm) existed inside the solution after DDAB treatment, $(OAm)_2PbBr_4$ could be formed gradually causing the original $CsPbBr_3$ emission decreased timely, which was supported by the TEM images (no original cubic shape was reserved) (FIGS. 49A-49D).

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, "about 0" can refer to 0, 0.001, 0.01, or 0.1. In an embodiment, the term "about" can include traditional rounding according to significant figures of the numerical value. In addition, the phrase "about 'x' to 'y'" includes "about 'x' to about 'y'".

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

What is claimed:

1. A film comprising:
a passivated perovskite quantum dot including:
a core of the form $APbX_3$, where A is $Cs^+$, $Rb^+$, $CH^3NH_3^+$, or $HC(NH_2)_2^+$, and X is a halogen; and
a capping ligand including an inorganic-organic hybrid ion pair including di-dodecyl dimethylammonium and at least one anion selected from the group of $Cl^-$, $Br^-$, $I^-$, $SH^-$, sulfide ($S^{2-}$), $Se^{2-}$, $HSe^-$, $Te^{2-}$, $HTe^-$, $TeS_3^{2-}$ or $AsS_3^{2-}$.

2. The film of claim 1, wherein the inorganic-organic hybrid ion pair includes di-dodecyl dimethylammonium sulfide ($S^{2-}$-$DDA^+$).
3. The film of claim 1, wherein the core of the passivated perovskite quantum dot is $CsPbCl_{3-x}Br_x$, where x is 0 to 3.
4. The film of claim 1, wherein the core of the passivated perovskite quantum dot is $CsPbCl_3$.
5. The film of claim 1, wherein the core of the passivated perovskite quantum dot is $CsPbBr_3$.
6. The film of claim 1, wherein the at least one anion is $Cl^-$, $Br^-$, or $I^-$.
7. The film of claim 1, wherein the inorganic-organic hybrid ion pair includes di-dodecyl dimethyl ammonium bromide ($Br^-$-$DDA^+$).
8. The film of claim 1, wherein the inorganic-organic hybrid ion pair includes di-dodecyl dimethyl ammonium chloride ($Cl^-$-$DDA^+$).
9. The film of claim 1, wherein the inorganic-organic hybrid ion pair includes di-dodecyl dimethyl ammonium iodide ($I^-$-$DDA^+$).
10. The film of claim 1, wherein a diameter of the passivated perovskite quantum dot ranges from about 75 nanometer (nm) to 160 nm.
11. The film of claim 1, wherein a diameter of the core of the passivated perovskite quantum dot ranges from about 5 nm to 20 nm.
12. The film of claim 1, wherein a diameter of the core of the passivated perovskite quantum dot ranges from about 6 nm to 16 nm.
13. The film of claim 1, wherein a thickness of the capping ligand ranges from about 70 nm to 140 nm.
14. The film of claim 1, wherein a thickness of the capping ligand ranges from about 90 nm to 120 nm.
15. The film of claim 1, wherein the passivated perovskite quantum dot has a photoluminescence quantum yield (PLQY) of about 70% or more.
16. An optoelectronic device comprising the film according to claim 1.
17. The optoelectronic device of claim 16, wherein the optoelectronic device is a lasing device.
18. The optoelectronic device of claim 16, wherein the optoelectronic device is a quantum dots light emitting device (QLED).
19. The optoelectronic device of claim 18, further comprising an electron transport layer and a hole transport layer.
20. The optoelectronic device of claim 16, wherein the optoelectronic device is a photovoltaic device.

* * * * *